(12) United States Patent
Oh et al.

(10) Patent No.: US 12,740,207 B2
(45) Date of Patent: Sep. 15, 2026

(54) DISPLAY DEVICE WITH AN IMPROVED ALIGNMENT DEGREE OF LIGHT EMITTING ELEMENTS AND METHOD FOR MANUFACTURING THE SAME

(71) Applicant: SAMSUNG DISPLAY CO., LTD., Yongin-si (KR)

(72) Inventors: Won Sik Oh, Yongin-si (KR); Su Mi Moon, Yongin-si (KR); Sin Chul Kang, Yongin-si (KR); Hyun Min Cho, Yongin-si (KR); Xinxing Li, Yongin-si (KR); Chul Jong Yoo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 990 days.

(21) Appl. No.: 17/784,462

(22) PCT Filed: Nov. 13, 2020

(86) PCT No.: PCT/KR2020/016015
§ 371 (c)(1),
(2) Date: Jun. 10, 2022

(87) PCT Pub. No.: WO2021/118081
PCT Pub. Date: Jun. 17, 2021

(65) Prior Publication Data

US 2023/0006119 A1 Jan. 5, 2023

(30) Foreign Application Priority Data

Dec. 12, 2019 (KR) ........................ 10-2019-0166097
Dec. 12, 2019 (KR) ........................ 10-2019-0166104

(51) Int. Cl.
*H10H 20/857* (2025.01)
*H10H 20/01* (2025.01)
(Continued)

(52) U.S. Cl.
CPC .......... *H10H 20/857* (2025.01); *H10H 20/01* (2025.01); *H10H 20/8312* (2025.01);
(Continued)

(58) Field of Classification Search
CPC .. H10H 20/857; H10H 20/01; H10H 20/8312; H10H 20/032; H10H 20/0364; H10H 29/142
See application file for complete search history.

(56) References Cited

U.S. PATENT DOCUMENTS 8,872,214 B2 10/2014 Negishi et al.
9,111,464 B2 8/2015 Bibl et al.
(Continued)

FOREIGN PATENT DOCUMENTS

EP 3 557 620 10/2019
JP 4814394 11/2011
(Continued)

OTHER PUBLICATIONS

International Search Report, with English translation, corresponding to International Application No. PCT/KR2020/016015 dated Feb. 19, 2021.
(Continued)

*Primary Examiner* — William B Partridge
*Assistant Examiner* — Chevy J Boegel
(74) *Attorney, Agent, or Firm* — Womble Bond Dickinson (US) LLP

(57) ABSTRACT

A display device may include a substrate including pixel areas, and a pixel disposed in each of the pixel area. The pixel may include a transistor and a driving voltage line disposed in the substrate, first and second electrodes spaced apart from each other, a bank pattern disposed on the first and second electrodes, respectively, intermediate layers disposed on the bank pattern, light emitting elements disposed
(Continued)

between two adjacent intermediate layers of the intermediate layers, a first contact electrode disposed on one of the two adjacent intermediate layers and electrically connected to an end of each of the light emitting elements, and a second contact electrode disposed on another one of the two adjacent intermediate layers and electrically connected to another end of each of the light emitting elements.

20 Claims, 49 Drawing Sheets

(51) Int. Cl.
*H10H 20/831* (2025.01)
*H10H 29/14* (2025.01)

(52) U.S. Cl.
CPC ......... *H10H 29/142* (2025.01); *H10H 20/032* (2025.01); *H10H 20/0364* (2025.01)

(56) References Cited

U.S. PATENT DOCUMENTS

| | | | | |
|---|---|---|---|---|
| 9,112,112 | B2 | 8/2015 | Do et al. | |
| 9,287,242 | B2 | 3/2016 | Shibata et al. | |
| 9,570,425 | B2 | 2/2017 | Do | |
| 9,773,761 | B2 | 9/2017 | Do | |
| 10,198,128 | B2 | 2/2019 | Lim et al. | |
| 10,490,537 | B2 | 11/2019 | Bae et al. | |
| 10,607,515 | B2 | 3/2020 | Park et al. | |
| 10,672,946 | B2 | 6/2020 | Cho et al. | |
| 10,943,947 | B2 | 3/2021 | Im et al. | |
| 2011/0089850 | A1 | 4/2011 | Shibata et al. | |
| 2019/0115513 | A1 | 4/2019 | Im et al. | |
| 2019/0326348 | A1* | 10/2019 | Im | G09G 3/32 |
| 2019/0355785 | A1* | 11/2019 | Wu | H10H 20/857 |
| 2021/0242380 | A1 | 8/2021 | Kim et al. | |
| 2021/0288220 | A1 | 9/2021 | Oh et al. | |

FOREIGN PATENT DOCUMENTS

| | | | |
|---|---|---|---|
| JP | 4914929 | 4/2012 | |
| JP | 2015-126048 | 7/2015 | |
| KR | 10-1244926 | 3/2013 | |
| KR | 10-1436123 | 11/2014 | |
| KR | 10-1490758 | 2/2015 | |
| KR | 10-1704334 | 2/2017 | |
| KR | 10-2017-0099452 | 9/2017 | |
| KR | 10-2017-0141305 | 12/2017 | |
| KR | 10-2018-0007376 | 1/2018 | |
| KR | 10-2018-0072909 | 7/2018 | |
| KR | 10-2019-0067296 | 6/2019 | |
| KR | 10-2019-0092330 | 8/2019 | |
| KR | 10-2019-0104277 | 9/2019 | |
| KR | 10-2019-0118992 | 10/2019 | |
| KR | 10-2019-0121894 | 10/2019 | |
| KR | 10-2019-0122118 | 10/2019 | |
| KR | 10-2019-0124359 | 11/2019 | |
| KR | 10-2020-0010701 | 1/2020 | |
| KR | 10-2493479 | 2/2023 | |
| KR | 10-2661474 | 4/2024 | |
| WO | WO-2019208880 A1 * | 10/2019 | H01L 25/0753 |

OTHER PUBLICATIONS

Written Opinion, with English translation, corresponding to International Application No. PCT/KR2020/016015, dated Feb. 19, 2021.

Korean Notice of Allowance for Korean Patent Application or Patent No. 10-2019-0166104, dated Aug. 27, 2024.

Korean Notice of Allowance for Korean Patent Application No. 10-2019-0166097, dated Jul. 9, 2024.

* cited by examiner

FIG. 10

DPL
PCL
CNE1 CTL EP1 LD1 INS EP2 CTL CNE2
d2 d1
ENC PSV ILD2 ILD1 GI BFL SUB
II II'
EL1 DE GE SCL SE BNK1 EL2
$T_{SW}(T)$

FIG. 11

DPL
PCL
CNE1 CTL EP1 LD1 INS EP2 CTL CNE2
ENC
PSV
ILD2
ILD1
GI
BFL
SUB
II
II'
EL1
DE
GE
SCL
SE
$T_{SW}(T)$
BNK1
EL2

DPL
PCL
II'
II
CNE2
CTL
EP2
INS
LD1
EP1
CTL
CNE1
EL2
BNK1
SE
SCL
GE
DE
Tsw(T)
EL1
ENC
AUINS
PSV
ILD2
ILD1
GI
BFL
SUB

FIG. 13F

ENC
BNK2
PSV
ILD2
ILD1
GI
BFL
SUB
I'
DVL
CH2
EL4
CTL
CNE4
LD3
EL3
CTL
CNE3
LD2
EL2
CTL
CNE2
INS
EP2
LD1
EP1
EL1
CTL
BNK1
CNE1
SE
SCL
GE
DE
Tdr(T)
CH1
BNK2
I
DPL
PCL

FIG. 14

DPL
PCL
CNE2
CTL
EP2
INS
LD1
EP1
CTL
CNE1
d1
d2
EL2
BNK1
SE
SCL
GE
DE
$T_{SW}(T)$
EL1
II'
II
ENC
PSV
ILD2
ILD1
GI
BFL
SUB

FIG. 15

DPL
PCL
CNE2
CTL
EP2
INS
LD1
EP1
CTL
CNE1
d2
d1
II'
EL2
BNK1
SE
SCL
GE
DE
$T_{SW}(T)$
EL1
II
ENC
PSV
ILD2
ILD1
GI
BFL
SUB

ENC
BNK2
INS1
PSV
ILD2
ILD1
GI
BFL
SUB
III'
PRT2
DVL
CH2
EL4
CTL
CNE4
LD3
EL3
CTL
CNE3
LD2
EL2
CTL
CNE2
INS2
LD1
INS1
EL1
BNK1
CTL
CNE1
SE
SCL
GE
DE
Tdr(T)
PRT1
CH1
BNK2
III
DPL
PCL

ENC
BNK2
INS1
PSV
ILD2
ILD1
GI
BFL
SUB
III'
CH2
PRT2
DVL
EL4
CTL
CNE4
LD3
EL3
CTL
CNE3
LD2
EL2
CTL
CNE2
INS2
LD1
INS1
EL1
BNK1
CTL
CNE1
SE
SCL
GE
DE
Tdr(T)
PRT1
CH1
BNK2
III
DPL
PCL

DPL
PCL
CTL
CNE2
INS1
INS2
LD1
CTL
CNE1
d2
d1
EL2
BNK1
SE
SCL
GE
DE
Tsw(T)
EL1
IV'
IV
ENC
INS1
PSV
ILD2
ILD1
GI
BFL
SUB

FIG. 20

DPL
PCL
CTL
CNE2
INS2
LD1
CTL
CNE1
EL2
BNK1
INS1
SE
SCL
GE
DE
Tsw(T)
EL1
IV'
IV
ENC
AUINS
INS1
PSV
ILD2
ILD1
GI
BFL
SUB

PSV
ILD2
ILD1
GI
BFL
SUB
III'
DVL
CH2
EL4
EL3
EL2
EL1
SE
SCL
GE
DE
Tdr(T)
CH1
III
PCL

PSV
ILD2
ILD1
GI
BFL
SUB
III'
III
DVL
CH2
PRT2
EL4
EL3
EL2
EL1
BNK1
CTL
CTL
CTL
CTL
DE GE SCL SE
Tdr(T)
PRT1
CH1
PCL

FIG. 22D

BNK2
PSV
ILD2
ILD1
GI
BFL
SUB
III'
CTL
LD3
LD2
LD1
INSM
DVL
CH2
PRT2
EL4
EL3
EL2
EL1
BNK1
SE
SCL
GE
DE
Tdr(T)
PRT1
CH1
III
PCL

ENC
BNK2
INS1
PSV
ILD2
ILD1
GI
BFL
SUB
V'
PRT2
DVL
CH2
EL4
SEL4
CTL
CNE4
LD3
EL3
SEL3
CTL
CNE3
LD2
EL2
SEL2
CTL
CNE2
INS2
LD1
INS1
EL1
SEL1
BNK1
CTL
CNE1
SE
SCL
GE
DE
Tdr(T)
PRT1
CH1
BNK2
V
DPL
PCL

CNE1
CTL
LD1
INS2
CNE2
CTL
DPL
PCL
VI'
EL2
BNK1
SEL2
INS1
SE
SCL
GE
DE
TSW(T)
SEL1
EL1
VI
C
C
ENC
INS1
PSV
ILD2
ILD1
GI
BFL
SUB

DISPLAY DEVICE WITH AN IMPROVED ALIGNMENT DEGREE OF LIGHT EMITTING ELEMENTS AND METHOD FOR MANUFACTURING THE SAME

CROSS-REFERENCE TO RELATED APPLICATION(S)

This application is a national entry of International Application No. PCT/KR2020/016015, filed on Nov. 13, 2020, which claims under 35 U.S.C. §§ 119(a) and 365(b) priority to and benefits of Korean Patent Application Nos. 10-2019-0166097 and 10-2019-0166104, each filed on Dec. 12, 2019, in the Korean Intellectual Property Office (KIPO), the entire contents of which are incorporated herein by reference.

BACKGROUND

1. Technical Field

The disclosure relates to a display device and a method of manufacturing the same.

2. Description of the Related Art

As interest in information display increases and the demand to use portable information media increases, the demand and commercialization for display devices are focused.

SUMMARY

An object of the disclosure is to provide a display device in which a manufacturing process may be improved (e.g., streamlined or simplified) while improving an alignment degree of light emitting elements.

In addition, an object of the disclosure is to provide a display device capable of improving an alignment degree of light emitting elements by minimizing (or reducing) a defect that may occur during alignment of the light emitting elements.

In addition, an object of the disclosure is to provide a method of manufacturing the above-described display device.

According to an embodiment of the disclosure, a display device may include a display area including pixel areas and a non-display area surrounding the display area, and a pixel disposed in each of the pixel areas.

In an embodiment of the disclosure, the pixel may include at least one transistor and a driving voltage line disposed on a substrate; first and second electrodes extending in a direction on the transistor and the driving voltage line and spaced apart from each other; a bank pattern disposed on the first and second electrodes, respectively; intermediate layers disposed on the bank pattern; light emitting elements disposed between two adjacent intermediate layers of the intermediate layers adjacent in another direction intersecting the direction; a first contact electrode disposed on one of the two adjacent intermediate layers and electrically connected to an end of each of the light emitting elements; and a second contact electrode disposed on another one of the two adjacent intermediate layers and electrically connected to another end of each of the light emitting elements.

In an embodiment of the disclosure, each of the intermediate layers may include an insulating material.

In an embodiment of the disclosure, each of the intermediate layers may be a multi-layer including at least three or more double layers formed by stacking a first inorganic insulating layer and a second inorganic insulating layer, and the at least three or more double layers may be sequentially stacked.

In an embodiment of the disclosure, a refractive index of the first inorganic insulating layer and a refractive index of the second inorganic insulating layer may be different from each other.

In an embodiment of the disclosure, one of the first and second contact electrodes may be electrically connected to the transistor, and another one of the first and second contact electrodes may be electrically connected to the driving voltage line.

In an embodiment of the disclosure, the first electrode and the second electrode may be disposed on the same layer or may be disposed on different layers.

In an embodiment of the disclosure, each of the first and second electrodes may extend in the direction and may be commonly provided to adjacent pixels positioned in the same pixel column as the pixel.

In an embodiment of the disclosure, each of the intermediate layers may include a conductive material.

In an embodiment of the disclosure, the one of the intermediate layers may be disposed in the pixel, and the another one of the intermediate layers may be commonly provided to the pixel and the adjacent pixels.

In an embodiment of the disclosure, the pixel may further include an insulating layer disposed between the first and second electrodes and the bank pattern.

In an embodiment of the disclosure, the one of the intermediate layers and one of the first and second electrodes may form a capacitor with the insulating layer and a bank pattern corresponding to the one of the first and second electrodes disposed between the one of the intermediate layers and the one of the first and second electrodes. In addition, the another one of the intermediate layers and another one of the first and second electrodes may form a capacitor with the insulating layer and a bank pattern corresponding to the remaining electrode disposed between the another one of the intermediate layers and the another one of the first and second electrodes.

In an embodiment of the disclosure, the pixel may further include a first sub-electrode and a second sub-electrode disposed on the insulating layer, extending in the direction, and spaced apart from each other. Here, the first sub-electrode may overlap the first electrode in a plan view, and the second sub-electrode may overlap the second electrode in a plan view.

In an embodiment of the disclosure, the first electrode and the first sub-electrode may form a capacitor with the insulating layer disposed between the first electrode and the first sub-electrode. The second electrode and the second sub-electrode may form a capacitor with the insulating layer disposed between the second electrode and the second sub-electrode.

In an embodiment of the disclosure, the one of the intermediate layers may cover the first sub-electrode and may be electrically connected to the first sub-electrode. The another one of the intermediate layers may cover the second sub-electrode and may be electrically connected to the second sub-electrode.

In an embodiment of the disclosure, the intermediate layer may overlap the first and second electrodes in a plan view.

The display device according to the embodiment described above may be manufactured by including providing a pixel provided in each pixel area.

In an embodiment of the disclosure, the providing of the pixel may include forming at least one transistor and a driving voltage line on a substrate; forming an interlayer insulating layer on the at least one transistor and the driving voltage line; forming first and second electrodes extending in a direction and spaced apart from each other on the interlayer insulating layer; forming a bank pattern on the first and second electrodes; forming intermediate layers on the bank pattern; inputting light emitting elements, and aligning the light emitting elements between two adjacent intermediate layers of the intermediate layers adjacent in another direction intersecting the direction, by applying an alignment signal corresponding to each of the first electrode and the second electrode; forming an insulating layer on an upper surface of each of the light emitting elements; and forming a first contact electrode and a second contact electrode on the insulating layer.

In an embodiment of the disclosure, each of the intermediate layers may include a conductive material.

In an embodiment of the disclosure, each of the intermediate layers may include an insulating material.

Each of the intermediate layers may include a multi-layer including at least three or more double layers formed by stacking a first inorganic insulating layer and a second inorganic insulating layer, the at least three or more double layers may be sequentially stacked, and a refractive index of the first inorganic insulating layer and a refractive index of the second inorganic insulating layer may be different from each other.

According to an embodiment of the disclosure, an alignment degree of light emitting elements may be improved by separating a configuration for aligning the light emitting elements and a configuration for driving the light emitting elements to accurately aligning the light emitting elements in a desired area.

In addition, according to an embodiment of the disclosure, a display device with a simplified manufacturing process may be provided by aligning the light emitting elements in each pixel using a conductive line provided in a pixel circuit part to omit a separation process of a line for alignment of the light emitting elements.

In addition, according to an embodiment of the disclosure, a method of manufacturing the above-described display device may be provided.

An effect according to embodiments of the disclosure is not limited by the contents exemplified above, and more various effects are included in the specification.

BRIEF DESCRIPTION OF DRAWINGS

The above and other aspects, features, and advantages of certain embodiments of the disclosure will be more apparent from the following description taken in conjunction with the accompanying drawings, in which:

FIG. 10 is a schematic cross-sectional view taken along line II-II' of FIG. 7.

FIG. 11 is a schematic cross-sectional view corresponding to the line II-II' of FIG. 7 as an implementation of a first bank pattern shown in FIG. 10 according to another embodiment.

Figure 13F:
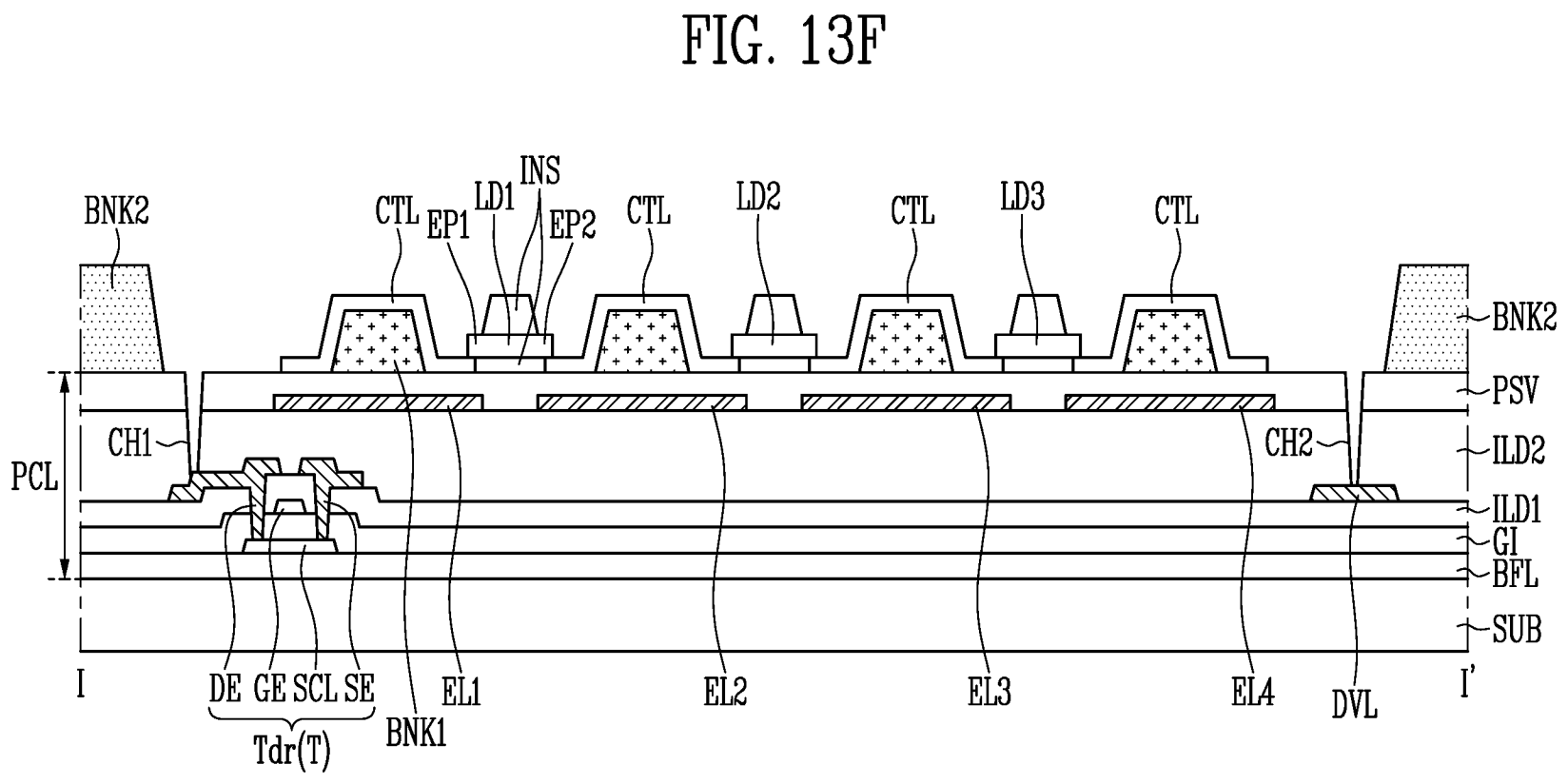

FIGS. 13A to 13H are cross-sectional views sequentially illustrating a method of manufacturing a pixel shown in FIG. 8.

FIGS. 14 and 15 schematically illustrate a display device according to an embodiment of the disclosure, and are cross-sectional views corresponding to the line II-II' of FIG. 7.

FIG. 20 is a schematic cross-sectional view corresponding to the line IV-IV' of FIG. 17 as an implementation of a first bank pattern shown in FIG. 19 according to another embodiment.

Figure 22D:
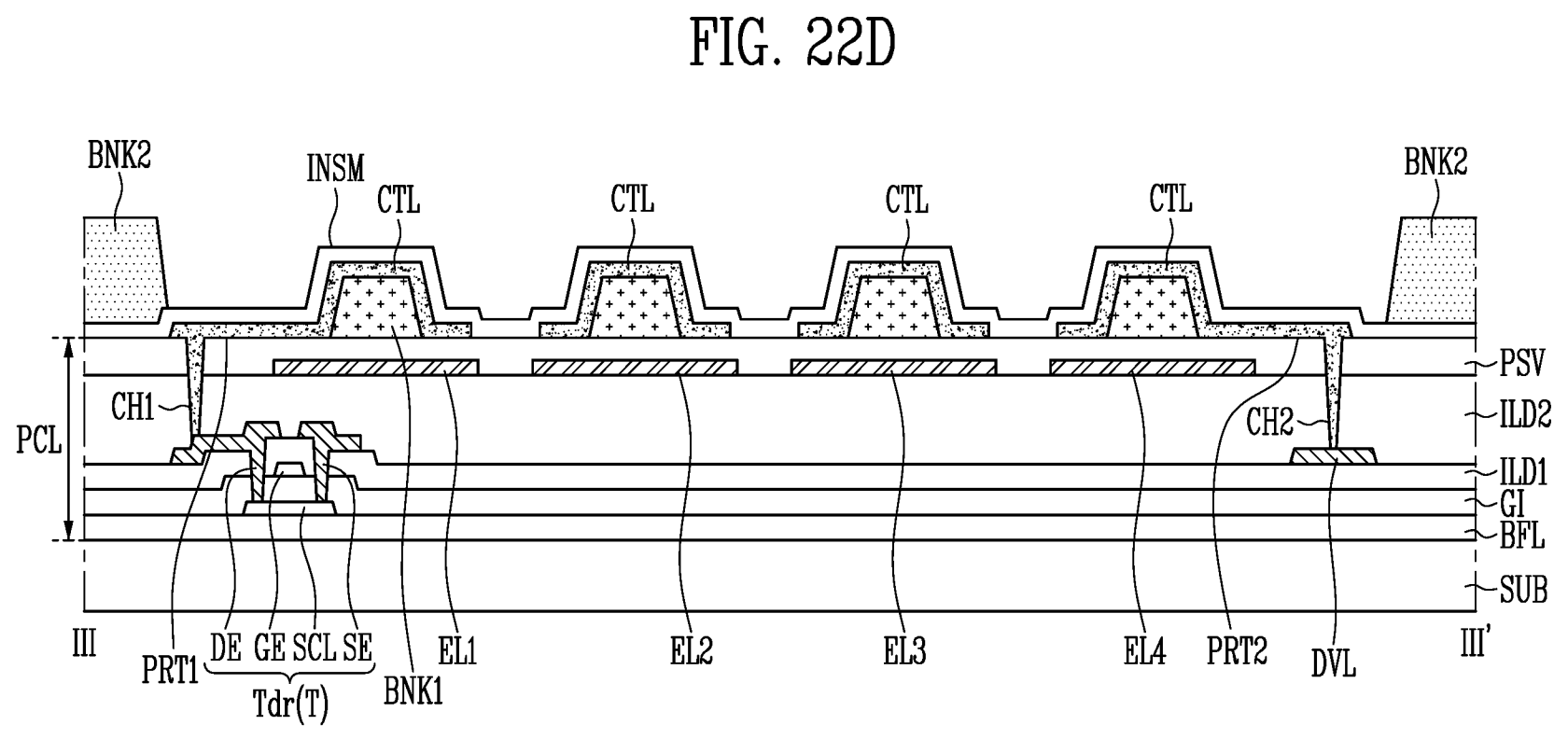

FIGS. 22A to 22H are schematic cross-sectional views sequentially illustrating a method of manufacturing a pixel shown in FIG. 18A.

DETAILED DESCRIPTION OF THE EMBODIMENTS

Figure 1A:
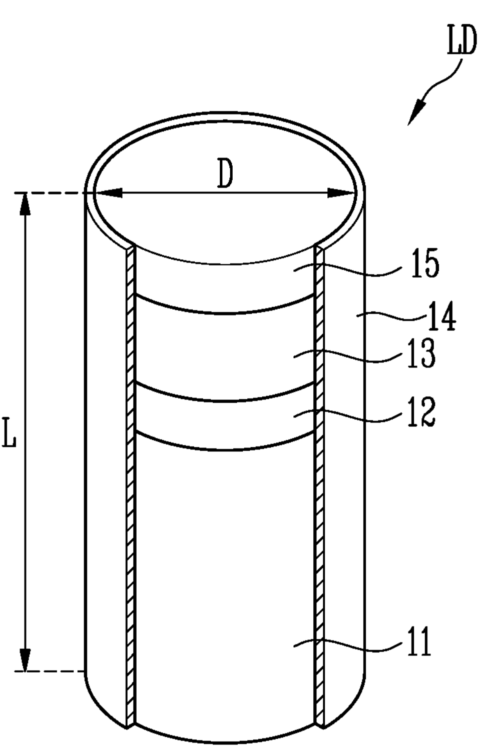
FIG. 1A is a perspective view schematically illustrating a light emitting element according to an embodiment of the disclosure.

Since the disclosure may be modified in various manners and have various forms, specific embodiments will be illustrated in the drawings and will be described in detail in the specification. However, it should be understood that the disclosure is not intended to be limited to the disclosed specific forms, and the disclosure includes all modifications, equivalents, and substitutions within the technical scope of the disclosure.

Similar reference numerals are used for similar components in describing each drawing. In the accompanying drawings, the dimensions of the structures are shown enlarged from the actual dimensions for the sake of clarity of the disclosure. Terms of "first", "second", and the like may be used to describe various components, but the components should not be limited by the terms. The terms are used only for the purpose of distinguishing one component from another component. For example, without departing from the scope of the disclosure, a first component may be referred to as a second component, and similarly, a second component may also be referred to as a first component. The singular expressions include plural expressions unless the context clearly indicates otherwise.

It should be understood that in the application, a term of "include", "have", or the like is used to specify that there is a feature, a number, a step, an operation, a component, a part, or a combination thereof described in the specification, but does not exclude a possibility of the presence or addition of one or more other features, numbers, steps, operations, components, parts, or combinations thereof in advance. In addition, a case where a portion of a layer, a film, an area, a plate, or the like is referred to as being "on" another portion, it includes not only a case where the portion is "directly on" another portion, but also a case where there is further another portion between the portion and another portion. In addition, in the specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion.

Hereinafter embodiments of the disclosure and other matters necessary for those skilled in the art to readily understand the contents of the disclosure will be described in detail with reference to the accompanying drawings. In the description below, the singular expressions include plural expressions (or meanings) unless the context clearly indicates otherwise.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Figure 1B:
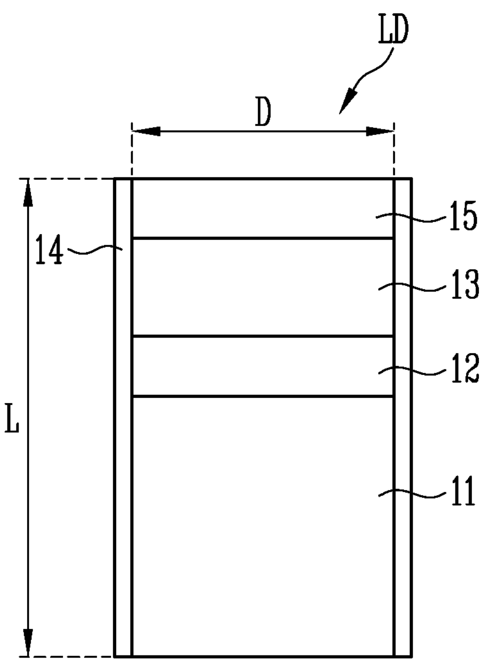
FIG. 1B is a schematic cross-sectional view of the light emitting element of FIG. 1A.
Figure 2A:
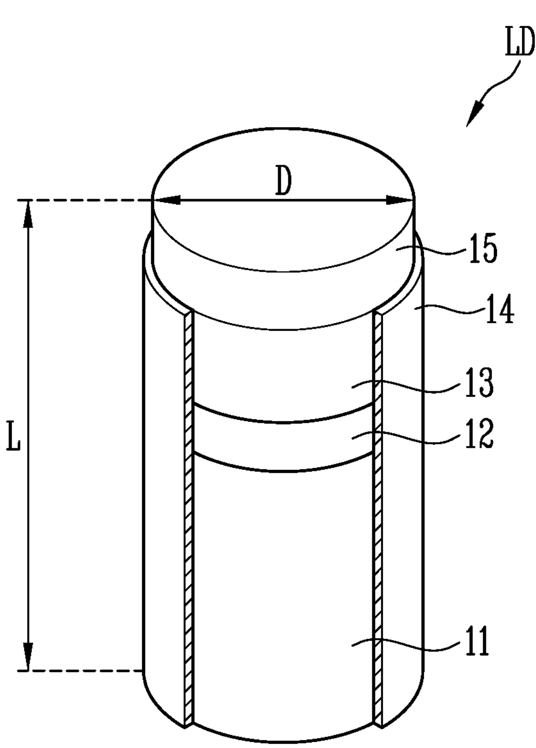
FIG. 2A is a perspective view schematically illustrating a light emitting element according to another embodiment of the disclosure.
Figure 2B:
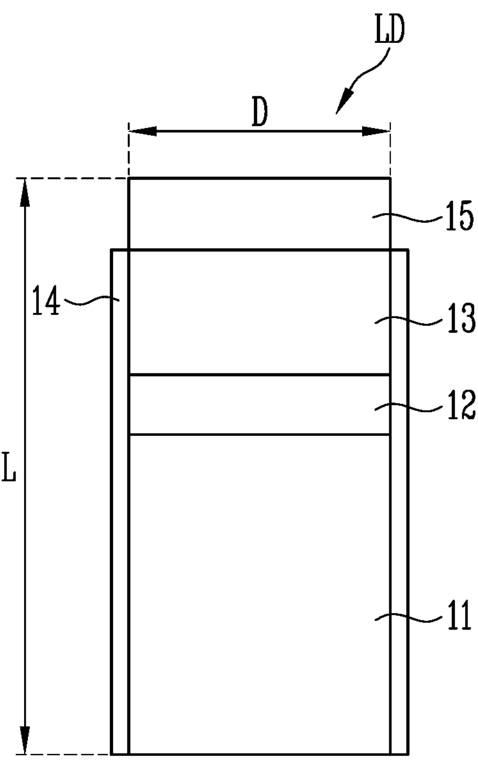
FIG. 2B is a schematic cross-sectional view of the light emitting element of FIG. 2A.
Figure 3A:
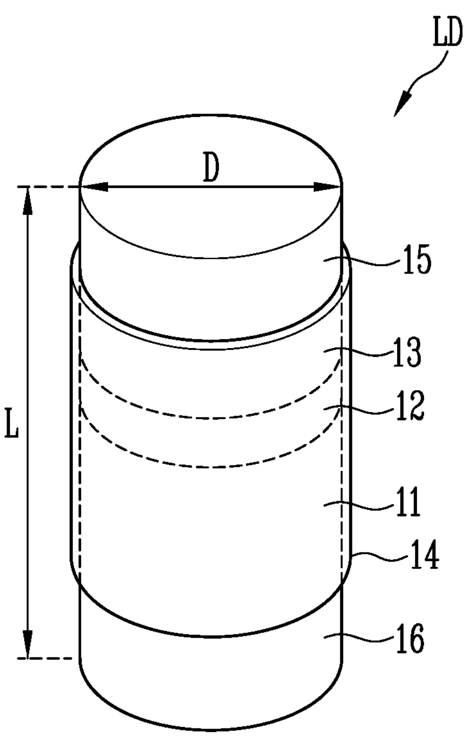
FIG. 3A is a perspective view schematically illustrating a light emitting element according to another embodiment of the disclosure.
Figure 3B:
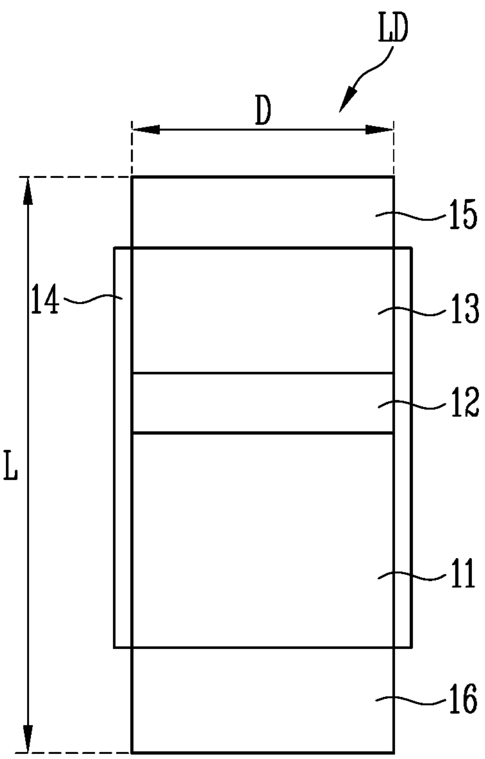
FIG. 3B is a schematic cross-sectional view of the light emitting element of FIG. 3A.
Figure 4A:
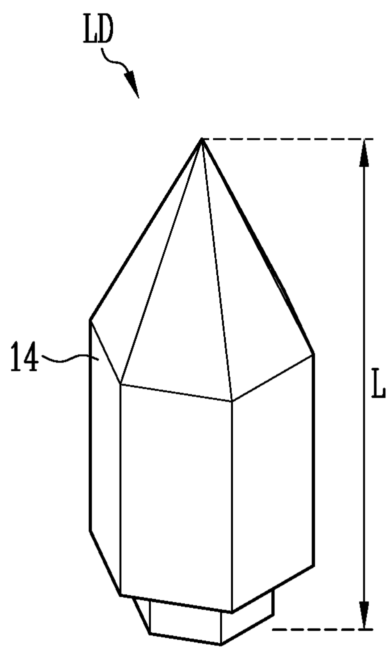
FIG. 4A is a perspective view schematically illustrating a light emitting element according to still another embodiment of the disclosure.
Figure 4B:
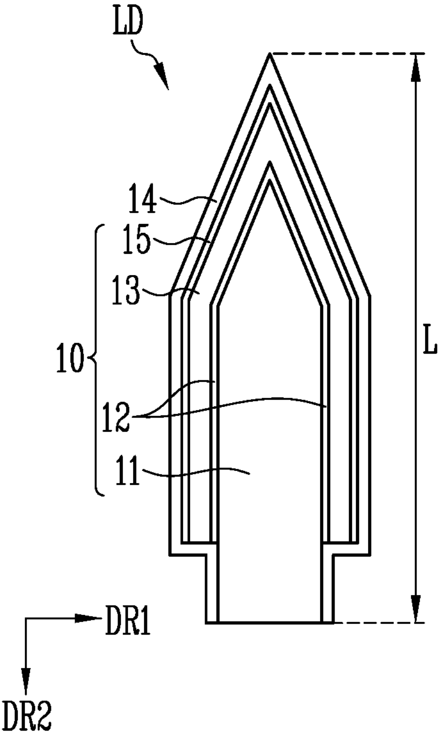
FIG. 4B is a schematic cross-sectional view of the light emitting element of FIG. 4A.

FIG. 1A is a perspective view schematically illustrating a light emitting element according to an embodiment, FIG. 1B is a schematic cross-sectional view of the light emitting element of FIG. 1A, FIG. 2A is a perspective view schematically illustrating a light emitting element according to another embodiment, FIG. 2B is a schematic cross-sectional view of the light emitting element of FIG. 2A, FIG. 3A is a perspective view schematically illustrating a light emitting element according to another embodiment, FIG. 3B is a schematic cross-sectional view of the light emitting element of FIG. 3A, FIG. 4A is a perspective view schematically illustrating a light emitting element according to still another embodiment, and FIG. 4B is a schematic cross-sectional view of the light emitting element of FIG. 4A.

For convenience, after describing FIGS. 1A, 1B, 2A, 2B, 3A, and 3B illustrating the light emitting element manufactured by an etching method, FIGS. 4A and 4B illustrating the light emitting element manufactured by a growth method are described. In an embodiment, a type and/or a shape of the light emitting element are/is not limited to the embodiments shown in FIGS. 1A, 1B, 2A, 2B, 3A, 3B, 4A, and 4B.

First, referring to FIGS. 1A, 1B, 2A, 2B, 3A, and 3B, a light emitting element LD may include a first semiconductor layer 11, a second semiconductor layer 13, and an active layer 12 interposed between the first semiconductor layer 11 and the second semiconductor layer 13. For example, the light emitting element LD may be implemented as a light emitting stack in which the first semiconductor layer 11, the active layer 12, and the second semiconductor layer 13 are sequentially stacked each other.

According to an embodiment, the light emitting element LD extend in a direction. In case that an extension direction of the light emitting element LD is referred to as a longitudinal direction, the light emitting element LD may have a first end (or one side end) and a second end (or another side end) in the extension direction. One of the first and second semiconductor layers 11 and 13 may be disposed at the first end of the light emitting element LD, and the other of the first and second semiconductor layers 11 and 13 may be disposed at the second end of the light emitting element LD.

The light emitting element LD may be provided in various shapes. For example, the light emitting element LD may have a rod-like shape, a bar-like shape, a column shape, or the like that is elongated in the longitudinal direction (for example, having an aspect ratio greater than 1). In an embodiment, the length L of the light emitting element LD in the longitudinal direction may be greater than the diameter D (or a width of a cross section) of the light emitting element LD. The light emitting element LD may include, for example, a light emitting diode manufactured to be extremely small to have the diameter D and/or the length L to a degree of the nanoscale to the microscale. In an embodiment, a size of the light emitting element LD may be changed to meet a requirement (or a design condition) of a lighting device or a self-luminous display device.

The first semiconductor layer 11 may include, for example, at least one n-type semiconductor layer. For example, the first semiconductor layer 11 may include at least one semiconductor material among InAlGaN, GaN, AlGaN, InGaN, AlN, and InN, and may include an n-type semiconductor layer doped with a first conductive dopant such as Si, Ge, or Sn. However, the material forming (or configuring) the first semiconductor layer 11 is not limited thereto, and various other materials may form the first semiconductor layer 11.

The active layer 12 may be disposed on the first semiconductor layer 11 and may be formed in a single or multiple quantum well structure. A position of the active layer 12 may be variously changed according to the type of the light emitting element LD. The active layer 12 may emit light of a wavelength of about 400 nm to about 900 nm, and may have a double heterostructure. In an embodiment, a clad layer (not shown) doped with a conductive dopant may be formed on and/or under the active layer 12. For example, the clad layer may be formed as (or formed of) an AlGaN layer or an InAlGaN layer. According to an embodiment, a material such as AlGaN or AlInGaN may be used to form the active layer 12, and various other materials may form the active layer 12.

In case that an electric field of a voltage or more is applied to ends of the light emitting element LD, the light emitting element LD emits light while an electron-hole pair is combined in the active layer 12. By controlling light emission of the light emitting element LD by using such a principle, the light emitting element LD may be used as a light source for various light emitting devices including a pixel of the display device.

The second semiconductor layer 13 may be disposed on the active layer 12 and may include a semiconductor layer of a type different from that of the first semiconductor layer 11. For example, the second semiconductor layer 13 may include at least one p-type semiconductor layer. For example, the second semiconductor layer 13 may include at least one semiconductor material among InAlGaN, GaN, AlGaN, InGaN, AlN, and InN, and may include a p-type semiconductor layer doped with a second conductive dopant such as Mg. However, the material forming the second semiconductor layer 13 is not limited thereto, and various other materials may form the second semiconductor layer 13.

In an embodiment, the first semiconductor layer 11 and the second semiconductor layer 13 may have widths (or thicknesses) different from each other in a length L direction of the light emitting element LD. For example, the first semiconductor layer 11 may have a width relatively wider (or greater) than that of the second semiconductor layer 13 in the length L direction of the light emitting element LD. Therefore, the active layer 12 of the light emitting element LD may be positioned to be closer to an upper surface of the second semiconductor layer 13 than to a lower surface of the first semiconductor layer 11 as shown in FIGS. 1A to 3B.

According to an embodiment, the light emitting element LD may further include an additional electrode 15 disposed on the second semiconductor layer 13 in addition to the above-described first semiconductor layer 11, active layer 12, and second semiconductor layer 13. In addition, according to an embodiment, as shown in FIGS. 3A and 3B, the light emitting element LD may further include another additional electrode 16 disposed at one end of the first semiconductor layer 11.

The additional electrodes 15 and 16 may be ohmic contact electrodes, but are not limited thereto, and may be Schottky contact electrodes according to an embodiment. The additional electrodes 15 and 16 may include a metal or metal oxide, and for example, chromium (Cr), titanium (Ti), aluminum (Al), gold (Au), nickel (Ni), ITO, an oxide or an alloy thereof, and the like may be used alone or in combination, but the disclosure is not limited thereto.

The materials included in each of the additional electrodes 15 and 16 may be the same as or different from each other. The additional electrodes 15 and 16 may be substantially transparent or translucent. Therefore, light generated by the light emitting element LD may pass through the additional electrodes 15 and 16 and may be emitted to the outside of the light emitting element LD. According to an embodiment, in case that the light generated by the light emitting element LD does not pass through the additional electrodes 15 and 16 and is emitted to the outside of the light emitting element LD through a region except for the ends of the light emitting element LD, the additional electrodes 15 and 16 may include an opaque metal.

In an embodiment, the light emitting element LD may further include an insulating layer 14. However, according to an embodiment, the insulating layer 14 may be omitted and may be provided so as to cover (or overlap) only portions of the first semiconductor layer 11, the active layer 12, and the second semiconductor layer 13.

The insulating layer 14 may prevent an electrical short that may occur in case that the active layer 12 contacts (or is in contact with) a conductive material other than the first semiconductor layer 11 and the second semiconductor layer 13. In addition, by forming the insulating layer 14, lifespan and efficiency of the light emitting element LD may be improved by minimizing a surface defect of the light emitting element LD. In addition, in case that light emitting elements LD are closely disposed, the insulating layer 14 may prevent an unwanted short that may occur between the light emitting elements LD. In case that the active layer 12 may prevent an occurrence of a short with an external conductive material, presence or absence of the insulating layer 14 is not limited.

As shown in FIGS. 1A and 1B, the insulating layer 14 may be provided in a form entirely surrounding an outer circumferential surface of the light emitting stack including the first semiconductor layer 11, the active layer 12, the second semiconductor layer 13, and the additional electrode 15. For convenience of description, a portion of the insulating layer 14 is removed from FIG. 1A, and the first semiconductor layer 11, the active layer 12, the second semiconductor layer 13, and the additional electrode 15 included in the actual light emitting element LD may be surrounded by the insulating layer 14.

In the above-described embodiment, the insulating layer 14 entirely surrounds the outer circumferential surface of each of the first semiconductor layer 11, the active layer 12, the second semiconductor layer 13, and the additional electrode 15, but the disclosure is not limited thereto.

According to an embodiment, as shown in FIGS. 2A and 2B, the insulating layer 14 may surround the outer circumferential surface of each of the first semiconductor layer 11, the active layer 12, and the second semiconductor layer 13 and may not entirely surround the outer circumferential surface of the additional electrode 15 disposed on the second semiconductor layer 13, or may surround only a portion of the outer circumferential surface of the additional electrode 15 and may not surround the remaining of the outer circumferential surface of the additional electrode 15. However, the insulating layer 14 may expose at least ends of the light emitting element LD, and for example, the insulating layer 14 may expose a first end (or one end) of the first semiconductor layer 11 together with the additional electrode 15 disposed at a first end (or one end) of the second semiconductor layer 13. In addition, according to an embodiment, as shown in FIGS. 3A and 3B, in case that the additional electrodes 15 and 16 are disposed at the ends of the light emitting element LD, the insulating layer 14 may expose at least one region of each of the additional electrodes 15 and 16. As another example, the insulating layer 14 may not be provided.

According to an embodiment, the insulating layer 14 may include a transparent insulating material. For example, the insulating layer 14 may include one or more insulating materials selected from a group consisting of (or including) $SiO_2$, $Si_3N_4$, $Al_2O_3$, and $TiO_2$, but is not limited thereto, and various materials having insulating properties may be used. The insulating layer 14 may be provided in a form of a single layer or may be provided in a form of a multi-layer including at least a double layer.

In case that the insulating layer 14 is provided in the light emitting element LD, a short between the active layer 12 and a first electrode and/or a second electrode (not shown) may be prevented. In addition, by forming the insulating layer 14, the lifespan and efficiency of the light emitting element LD may be improved by minimizing the surface defect of the light emitting element LD. In addition, in case that the light emitting elements LD are closely disposed, the insulating layer 14 may prevent an unwanted short that may occur between the light emitting elements LD.

The above-described light emitting element LD may be used as a light emitting source for various display devices. The light emitting element LD may be manufactured by a surface treatment process. For example, in case that the light emitting elements LD are mixed in a fluid solution (or a solvent) and supplied to each emission area (for example, an emission area of each pixel or an emission area of each sub-pixel), the surface treatment may be performed on each of the light emitting elements LD so that the light emitting elements LD may be uniformly sprayed without being uniformly aggregated in the solution.

The light emitting device including the light emitting element LD described above may be used in various types of devices that require a light source, including a display device. For example, in case that the light emitting elements LD are disposed in an emission area of each pixel of a display panel, the light emitting elements LD may be used as a light source of each of the pixels. However, an application field of the light emitting element LD is not limited to the above-described example. For example, the light emitting element LD may be used in other types of devices that require a light source, such as a lighting device.

The light emitting element LD manufactured by the growth method is described with reference to FIGS. 4A and 4B.

In describing the light emitting element LD manufactured by the growth method, the disclosure is described based on differences from the above-described embodiment, and parts that are not specially described in the light emitting element LD manufactured by the growth method follow the above-described embodiment, and the same reference numerals are given to substantially identical or similar components to those of the above-described embodiment.

Referring to FIGS. 4A and 4B, the light emitting element LD according to an embodiment may include the first semiconductor layer 11, the second semiconductor layer 13, and the active layer 12 interposed between the first and second semiconductor layers 11 and 13. According to an embodiment, the light emitting element LD may include a light emission pattern 10 having a core-shell structure including the first semiconductor layer 11 positioned at a center thereof, the active layer 12 surrounding at least one side of the first semiconductor layer 11, the second semiconductor layer 13 surrounding at least one side of the active layer 12, and the additional electrode 15 surrounding at least one side of the second semiconductor layer 13.

The light emitting element LD may be provided in a polypyramidal shape (or polygonal horn shape) extending in a direction. For example, the light emitting element LD may be provided in a hexagonally pyramidal shape (or hexagonal horn shape). In case that the extension direction of the light emitting element LD is referred to as the length L direction, the light emitting element LD may have a first end (one end, or a lower end) and second end (another end, or an upper end) in the length (L) direction. A portion of one of the first and second semiconductor layers 11 and 13 may be exposed at the first end (or the lower end) of the light emitting element LD, and a portion of the other of the first and second semiconductor layers 11 and 13 may be exposed at the second end (the upper end) of the light emitting element LD. For example, a portion of the first semiconductor layer 11 may be exposed at the first end (or the lower end) of the light emitting element LD, and a portion of the second semiconductor layer 13 may be exposed at the second end (or the upper end) of the light emitting element LD. In this case, in case that the light emitting element LD is applied as the light source for the display device, the exposed portion of the first semiconductor layer 11 may contact one of driving electrodes driving the light emitting element LD and the exposed portion of the second semiconductor layer 13 may contact another driving electrode.

According to an embodiment, in case that the light emitting element LD includes the additional electrode 15, a portion of the additional electrode 15 surrounding at least one side of the second semiconductor layer 13 may be exposed at the second end (or the upper end) of the light emitting element LD. In this case, in case that the light emitting element LD is applied as the light source for the display device, the exposed portion of the additional electrode 15 may contact the other driving electrode to thus be electrically connected to an electrode.

In an embodiment, the first semiconductor layer 11 may be positioned at a core, for example, a center of the light emitting element LD. The light emitting element LD may be provided in a shape corresponding to a shape of the first semiconductor layer 11. For example, in case that the first semiconductor layer 11 has a hexagonally pyramidal shape, the light emitting element LD and the light emission pattern 10 may also have a hexagonally pyramidal shape.

The active layer 12 may be provided and/or formed in a shape surrounding the outer circumferential surface of the first semiconductor layer 11 in the length (L) direction of the light emitting element LD. Specifically, the active layer 12 may be provided and/or formed to surround the remaining region except for a second end, disposed at a lower side, of the ends of the first semiconductor layer 11 in the length L direction of the light emitting element LD.

The second semiconductor layer 13 may be provided and/or formed to surround the active layer 12 in the length (L) direction of the light emitting element LD, and may include a semiconductor layer of a type different from that of the first semiconductor layer 11. For example, the second semiconductor layer 13 may include at least one p-type semiconductor layer.

In an embodiment, the light emitting element LD may include the additional electrode 15 surrounding at least one side of the second semiconductor layer 13. The additional electrode 15 may be an ohmic contact electrode or a Schottky contact electrode electrically connected to the second semiconductor layer 13, but is not limited thereto.

As described above, the light emitting element LD may be configured in the hexagonally pyramidal shape in which both ends thereof are protruded, and may be implemented as the light emission pattern 10 having a core-shell structure including the first semiconductor layer 11 provided at the center thereof, the active layer 12 surrounding the first semiconductor layer 11, the second semiconductor layer 13 surrounding the active layer 12, and the additional electrode 15 surrounding the second semiconductor layer 13. The first semiconductor layer 11 may be disposed at the first end (or the lower end) of the light emitting element LD having the hexagonally pyramidal shape, and the additional electrode 15 may be disposed at the second end (or the upper end) of the light emitting element LD.

In addition, according to an embodiment, the light emitting element LD may further include the insulating layer 14 disposed in an outer circumferential surface of the light emission pattern 10 having the core-shell structure. The insulating layer 14 may include a transparent insulating material.

Figure 5:
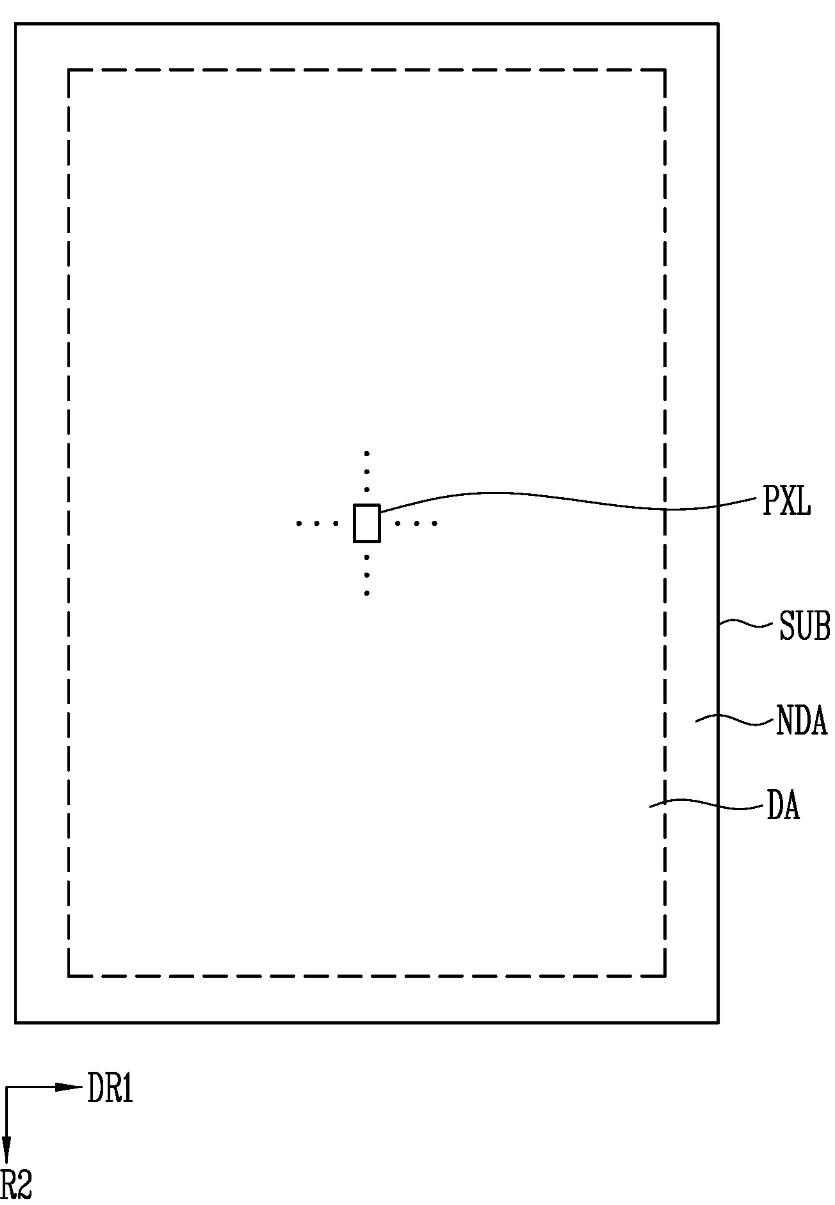
FIG. 5 is a diagram illustrating a display device according to an embodiment of the disclosure, and is a schematic plan view of a display device, in particular, using any one light emitting element as a light emitting source among the light emitting elements shown in FIGS. 1A, 1B, 2A, 2B, 3A, 3B, 4A, and 4B.

FIG. 5 is a schematic diagram illustrating a display device according to an embodiment, and is a schematic plan view of a display device, in particular, using, as a light emitting source, one among the light emitting elements shown in FIGS. 1A, 1B, 2A, 2B, 3A, 3B, 4A, and 4B.

For convenience, FIG. 5 illustrates a structure of the display device, focusing on a display area where an image is displayed. However, according to an embodiment, at least one driving circuit part (for example, a scan driver, a data driver, and the like) and/or signal lines, which are not shown, may be further disposed in the display device.

Referring to FIGS. 1A, 1B, 2A, 2B, 3A, 3B, 4A, 4B, and 5, the display device according to an embodiment may include a substrate SUB, pixels PXL disposed in the substrate SUB and including at least one light emitting element LD, a driver (not shown) disposed in the substrate SUB and driving the pixels PXL, a line part (not shown) electrically connecting the pixels PXL and the driver to each other.

The display device may be classified into a passive matrix type display device and an active matrix type display device according to a method of driving the light emitting element LD. For example, in case that the display device is implemented as an active matrix type, each of the pixels PXL may include a driving transistor that controls an amount of a current supplied to the light emitting element LD, a switching transistor that transmits a data signal to the driving transistor, and the like.

Recently, the active matrix type display device that selects and lights (or turns on) each pixel PXL in terms of resolution, contrast, and operation speed has become mainstream, but the disclosure is not limited thereto, and the passive matrix type display device in which lighting is performed for each pixel (PXL) group may also use components (for example, the first and second electrodes, and the like) for driving the light emitting element LD.

The substrate SUB may include a display area DA and a non-display area NDA.

According to an embodiment, the display area DA may be disposed in a center area of the display device, and the non-display area NDA may be disposed in an edge area of the display device to surround the display area DA. However, positions of the display area DA and the non-display area NDA are not limited thereto, and the positions of the display area DA and the non-display area NDA may be changed.

The display area DA may be an area where the pixels PXL that displays an image are provided. The non-display area NDA may be an area where the driver for driving the pixels PXL and a portion of the line part electrically connecting the pixels PXL and the driver to each other are provided.

The display area DA may have various shapes. For example, the display area DA may be provided as a polygon having a closed shape including a side formed as a straight line. In addition, the display area DA may be provided in a circular shape and/or an elliptical shape including a side formed as a curve. In addition, the display area DA may be provided in various shapes such as a semicircle, a semi-ellipse, and the like including a side formed as a straight line and a curve.

The non-display area NDA may be disposed at least one side of the display area DA. In an embodiment, the non-display area NDA may surround a periphery (or an edge) of the display area DA.

The substrate SUB may include a transparent insulating material and may transmit light. The substrate SUB may be a rigid substrate or a flexible substrate.

An area of the substrate SUB may be provided as the display area DA to dispose the pixels PXL, and the remaining area of the substrate SUB may be provided as the non-display area NDA. For example, the substrate SUB may include the display area DA including pixel areas in which each pixel PXL is disposed, and the non-display area NDA disposed around the display area DA.

Each of the pixels PXL may be provided in the display area DA on the substrate SUB. In an embodiment, the pixels PXL may be arranged in the display area DA in a stripe or PenTile® array structure, but the disclosure is not limited thereto.

Each of the pixels PXL may include at least one light emitting element LD driven by corresponding scan signal and data signal. The light emitting element LD may have a size as small as the nanoscale to the microscale and may be electrically connected in parallel with adjacent light emitting elements, but the disclosure is not limited thereto. The light emitting element LD may configure a light source of each pixel PXL.

Each of the pixels PXL may include at least one light source driven by a signal (for example, a scan signal and a data signal) and/or power (for example, first driving power and second driving power). For example, each pixel PXL may include at least one ultra-small light emitting element LD having a size as small as the nanoscale to the microscale shown in each of the embodiments of FIGS. 1A to 4B. However, a type of the light emitting element LD that may be used as the light source of each pixel PXL is not limited thereto.

In an embodiment, the color, type, number, and/or the like of the pixels PXL are/is not particularly limited, and for example, the color of light emitted from each pixel PXL may be variously changed.

The driver may provide a signal and power to each pixel PXL through the line part, thereby controlling driving of the pixel PXL. The line part is omitted from FIG. 5 for convenience of description.

The driver may include a scan driver that provides a scan signal to the pixels PXL through a scan line, an emission driver that provides an emission control signal to the pixels PXL through an emission control line, a data driver that provides a data signal to the pixels PXL through a data line, and a timing controller. The timing controller may control the scan driver, the emission driver, and the data driver.

FIGS. 6A to 6E are schematic diagrams of equivalent circuits illustrating an electrical connection relationship between components included in a pixel shown in FIG. 5 according to various embodiments.

For example, FIGS. 6A to 6E illustrate the electrical connection relationship between the components included in the pixel PXL that may be applied to an active matrix type display device, according to embodiments. However, types of the components included in the pixel PXL to which an embodiment may be applied are not limited thereto.

As illustrated in FIGS. 6A to 6E, not only the components included in each of the pixels shown in FIG. 5 but also an area where the components are provided are referred to as the pixel PXL. According to an embodiment, each pixel PXL shown in FIGS. 6A to 6E may be any of the pixels PXL included in the display device of FIG. 5, and the pixels PXL may have substantially the same or similar structure.

Referring to FIGS. 1A to 4B, 5, and 6A to 6E, a pixel PXL (hereinafter referred to as a "pixel") may include an emission unit EMU that generates light of a luminance corresponding to the data signal. In addition, the pixel PXL may selectively further include a pixel circuit 144 for driving the emission unit EMU.

According to an embodiment, the emission unit EMU may include the light emitting elements LD electrically connected to each other in parallel between a first power line PL1 to which first driving power VDD is applied and a second power line PL2 to which second driving power VSS is applied. For example, the emission unit EMU may include a first electrode EL1 (or a "first alignment electrode") electrically connected to the first driving power VDD via the pixel circuit 144 and the first power line PL1, a second electrode EL2 (or a "second alignment electrode") electrically connected to the second driving power VSS via the second power line PL2, and the light emitting elements LD electrically connected to each other in parallel in a same direction. In an embodiment, the first electrode EL1 may be an anode electrode, and the second electrode EL2 may be a cathode electrode.

In an embodiment, each of the light emitting elements LD included in the emission unit EMU may include a first end electrically connected to the first driving power VDD through the first electrode EL1 and a second end electrically connected to the second driving power VSS through the second electrode EL2. The first driving power VDD and the second driving power VSS may have different potentials. For example, the first driving power VDD may be set as a high-potential power, and the second driving power VSS may be set as a low-potential power. In this case, a potential difference between the first driving power VDD and the second driving power VSS may be set as a threshold voltage or more of the light emitting elements LD during a light emission period of the pixel PXL.

As described above, the respective light emitting elements LD electrically connected to each other in parallel in the same direction (for example, a forward direction) between the first electrode EL1 and the second electrode EL2 to which voltages having different potentials are supplied may form respective effective light sources. Such effective light sources may collectively form the emission unit EMU of the pixel PXL.

The light emitting elements LD of the emission unit EMU may emit light with a luminance corresponding to a driving current supplied thereto through the corresponding pixel circuit 144. For example, the pixel circuit 144 may supply a driving current, corresponding to a grayscale value of corresponding frame data, to the emission unit EMU during each frame period. The driving current supplied to the emission unit EMU may be divided and flow to the light emitting elements LD electrically connected in the same direction. Therefore, each of the light emitting elements LD may emit light with a luminance corresponding to the current flowing through the light emitting element LD, and thus the emission part EMU may emit light of the luminance corresponding to the driving current.

Figure 6A:
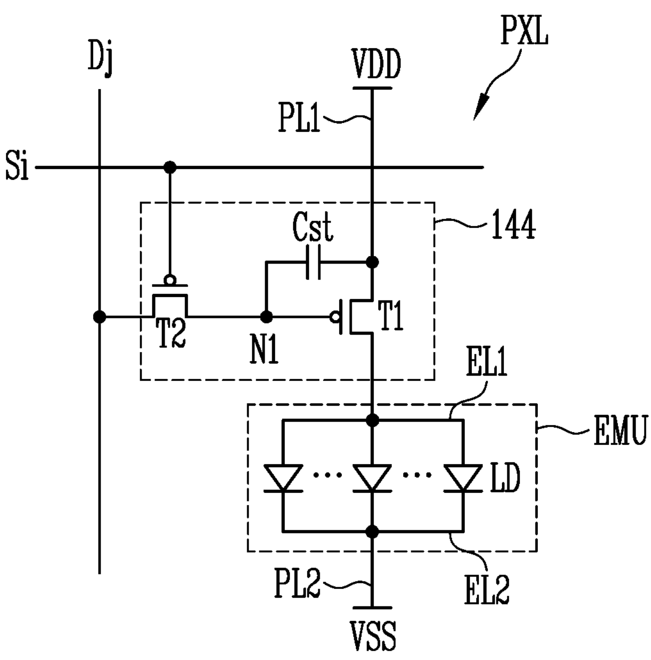
FIGS. 6A to 6E are schematic diagrams of equivalent circuits illustrating an electrical connection relationship between components included in a pixel shown in FIG. 5 according to various embodiments.
Figure 6B:
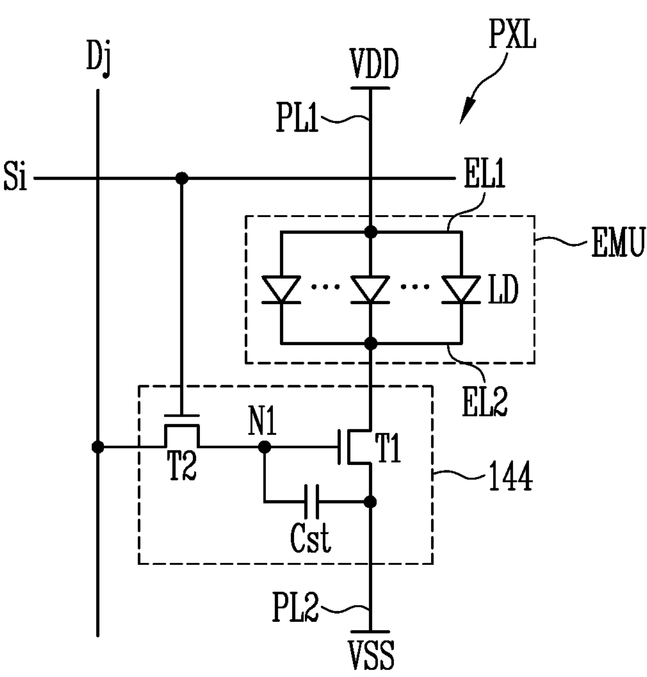
Figure 6C:
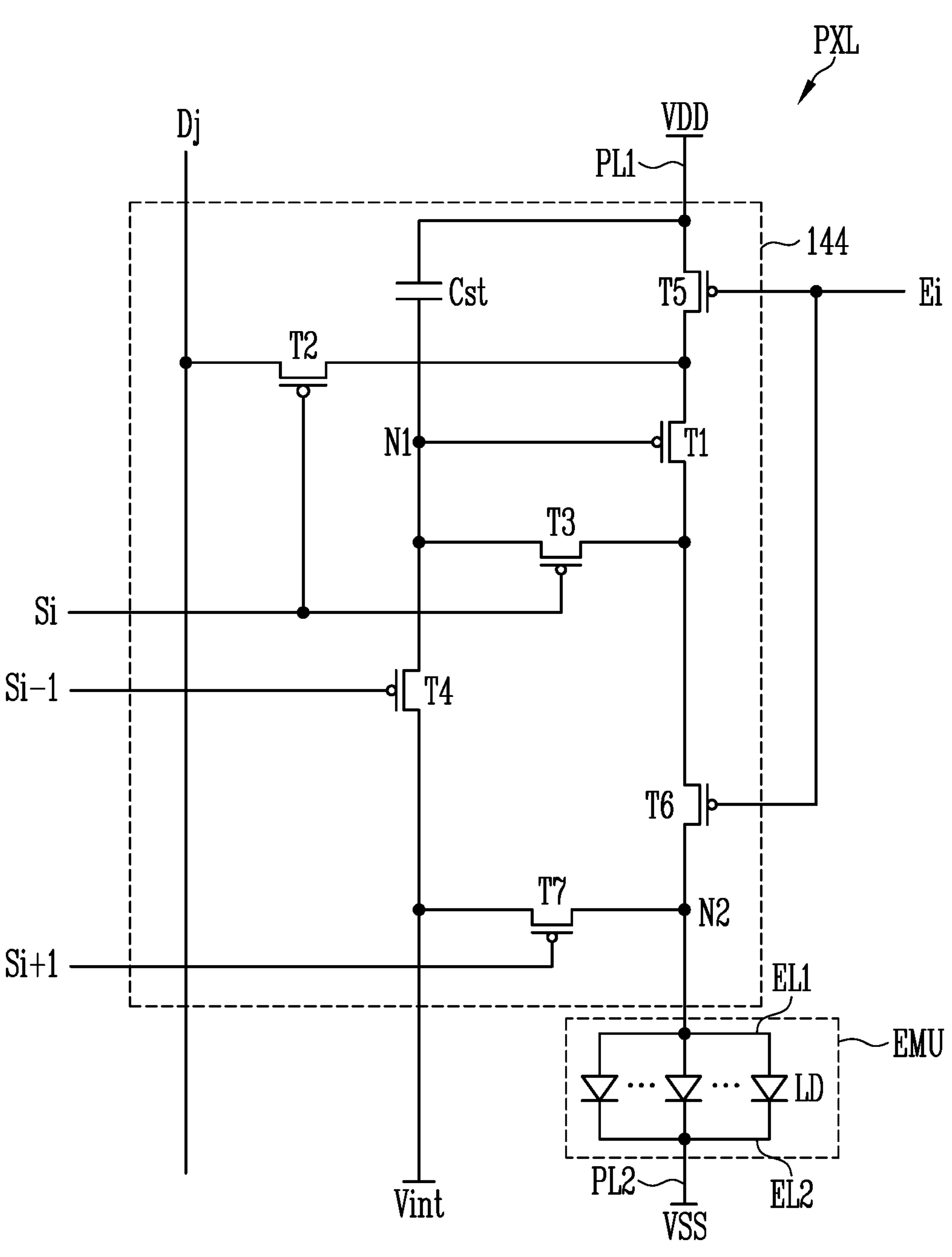
Figure 6D:
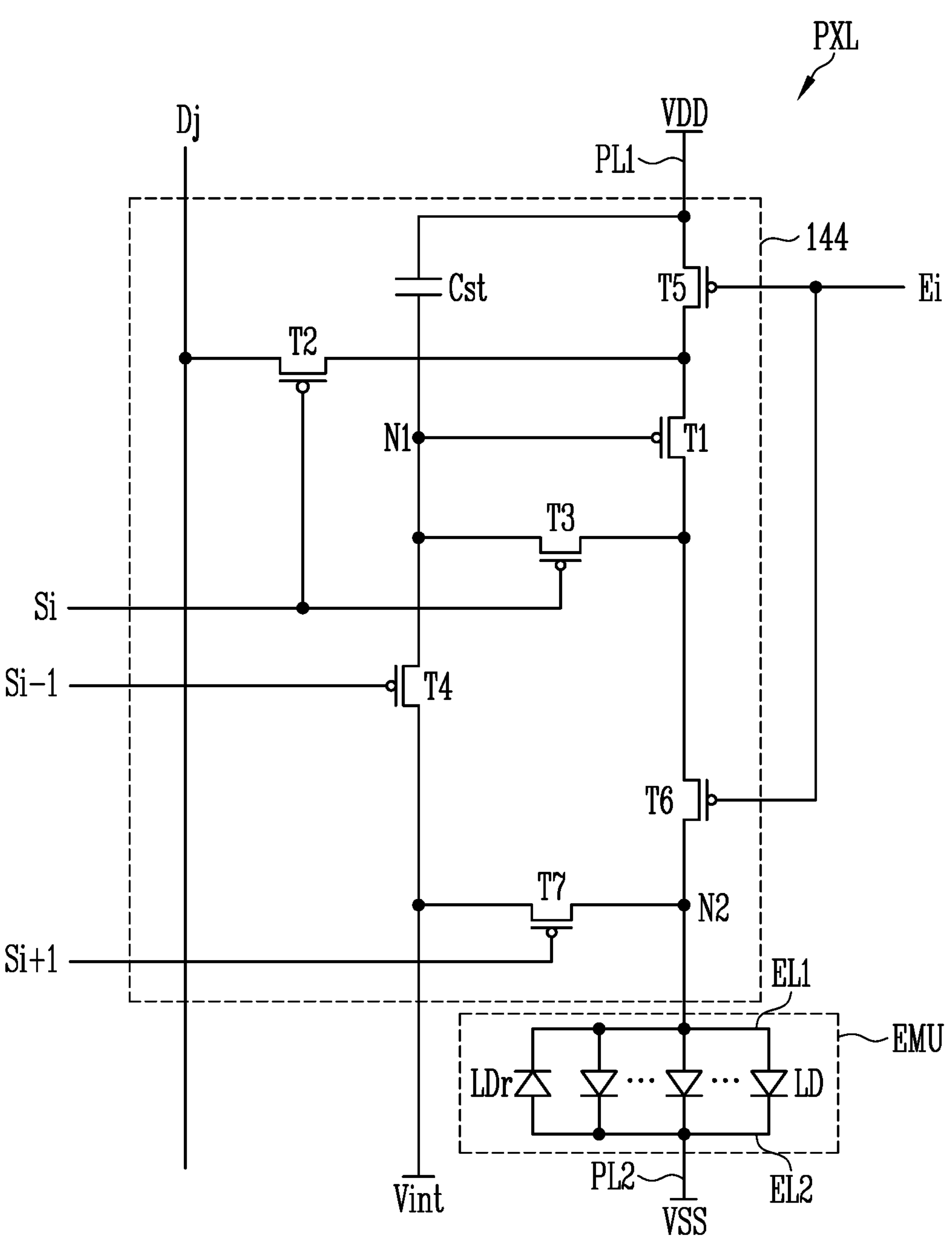
Figure 6E:
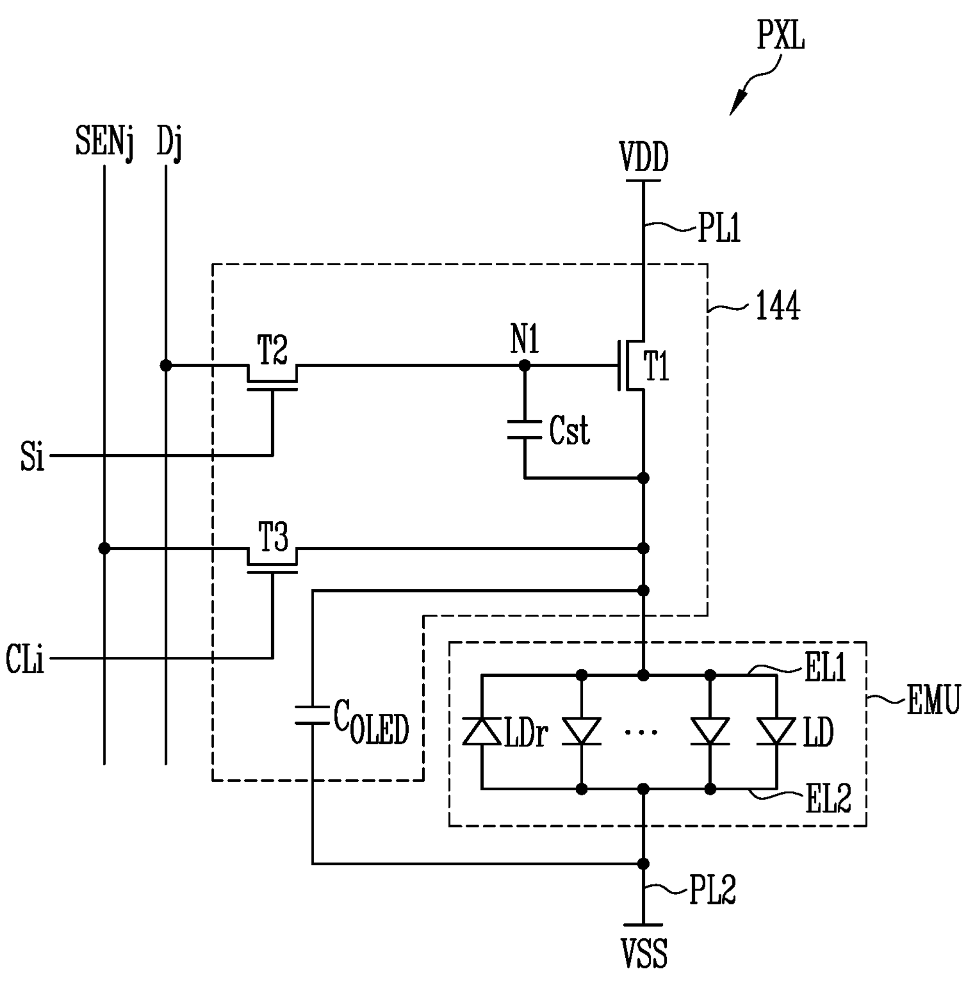

FIGS. 6A to 6E illustrate an embodiment in which the light emitting elements LD are electrically connected in the same direction between the first driving power VDD and the second driving power VSS, but the disclosure is not limited thereto. According to an embodiment, the emission unit EMU may further include at least one ineffective light source in addition to the light emitting elements LD forming each effective light source. For example, at least a reverse light emitting element LDr may be further electrically connected between the first and second electrodes EL1 and EL2 of the emission unit EMU, as shown in FIGS. 6D and 6E. The reverse light emitting element LDr may be electrically connected in parallel between the first and second electrodes EL1 and EL2 together with the light emitting elements LD configuring the effective light sources, and may be electrically connected between the first and second electrodes EL1 and EL2 in a direction opposite to that of the light emitting elements LD. The reverse light emitting element LDr maintains an inactive state even though a driving voltage (for example, a driving voltage of a forward direction) is applied between the first and second electrodes EL1 and EL2, and thus a current substantially does not flow through the reverse light emitting element LDr.

The pixel circuit 144 may be electrically connected to a scan line Si and a data line Dj of a corresponding pixel PXL. For example, in case that the pixel PXL is disposed in an i-th row (where i is a natural number) and a j-th column (where j is a natural number) of the display area DA, the pixel circuit 144 of the pixel PXL may be electrically connected to an i-th scan line Si and a j-th data line Dj of the display area DA. According to an embodiment, the pixel circuit 144 may include first and second transistors T1 and T2 and a storage capacitor Cst as shown in FIGS. 6A and 6B. However, a structure of the pixel circuit 144 is not limited to the embodiment shown in FIGS. 6A and 6B.

First, referring to FIG. 6A, the pixel circuit 144 may include the first and second transistors T1 and T2 and the storage capacitor Cst.

A first terminal of the second transistor T2 (switching transistor) may be electrically connected to the data line Dj, and a second terminal thereof may be electrically connected to a first node N1. Here, the first terminal and the second terminal of the second transistor T2 may be different terminals, and for example, in case that the first terminal is a source electrode, the second terminal may be a drain electrode. In addition, a gate electrode of the second transistor T2 may be electrically connected to the scan line Si.

The second transistor T2 may be turned on in case that a scan signal having a voltage (for example, a low voltage) at which the second transistor T2 may be turned on is supplied thereto from the scan line Si, to electrically connect the data line Dj and the first node N1 to each other. In this case, a data signal of a corresponding frame is supplied to the data line Dj, and thus the data signal is transmitted to the first node N1. The storage capacitor Cst may be charged with the data signal transmitted to the first node N1.

A first terminal of the first transistor T1 (driving transistor) may be electrically connected to the first driving power VDD, and a second terminal thereof may be electrically connected to the first electrode EL1 of each of the light emitting elements LD. A gate electrode of the first transistor T1 may be electrically connected to the first node N1. The first transistor T1 controls an amount of the driving current supplied to the light emitting elements LD in response to a voltage of the first node N1.

A first electrode of the storage capacitor Cst may be electrically connected to the first driving power VDD, and a second electrode may be electrically connected to the first node N1. The storage capacitor Cst is charged with a voltage corresponding to the data signal supplied to the first node N1 and maintains the charged voltage until the data signal of a next frame is supplied thereto.

Each of FIGS. 6A and 6B illustrates the pixel circuit 144 including the second transistor T2 for transmitting the data signal to the pixel PXL, the storage capacitor Cst for storing the data signal, and the first transistor T1 for supplying the driving current, corresponding to the data signal, to the light emitting elements LD.

However, the disclosure is not limited thereto, and the structure of the pixel circuit 144 may be variously modified and implemented. For example, the pixel circuit 144 may further include other circuit elements such as at least one transistor element including a transistor element for compensating for a threshold voltage of the first transistor T1, a transistor element for initializing the first node N1, and/or a transistor element for controlling a light emission time of the light emitting element LD, or such as a boosting capacitor for boosting the voltage of the first node N1.

In addition, FIG. 6A illustrates that the transistors included in the pixel circuit 144, for example, the first and second transistors T1 and T2, are P-type transistors, but the disclosure is not limited thereto. For example, at least one of the first and second transistors T1 and T2 included in the pixel circuit 144 may be changed to an N-type transistor.

Referring to FIGS. 1A to 4B, 5, and 6B, according to an embodiment, the first and second transistors T1 and T2 may be implemented as N-type transistors. A configuration or an operation of the pixel circuit 144 shown in FIG. 6B is different from that of the pixel circuit 144 of FIG. 6A at least in a change in a connection position of some components due to change of a transistor type. Therefore, description thereof will be briefly provided.

In an embodiment, the pixel circuit 144 shown in FIG. 6B may include the first and second transistors T1 and T2 formed as the N-type transistors, and the storage capacitor Cst. In case that the first and second transistors T1 and T2 are formed as the N-type transistors, the emission unit EMU may be electrically connected between the first driving power VDD and the pixel circuit 144 for stabilization of the storage capacitor Cst that is charged with the voltage corresponding to the data signal supplied to the first node N1. However, the disclosure is not limited thereto, and according to an embodiment, the emission unit EMU shown in FIG. 6B may be electrically connected between the pixel circuit 144 and the second driving power VSS. In an embodiment, the configuration of the pixel circuit 144 is not limited to the embodiment shown in FIGS. 6A and 6B. For example, the pixel circuit 144 may be configured as in an embodiment shown in FIGS. 6C and 6D.

As shown in FIGS. 6C and 6D, the pixel circuit 144 may be electrically connected to the scan line Si and the data line Dj of the pixel PXL. For example, in case that the pixel PXL is disposed in the i-th row and the j-th column of the display area DA, the pixel circuit 144 of the corresponding pixel PXL may be electrically connected to the i-th scan line Si and the j-th data line Dj of the display area DA.

In addition, according to an embodiment, the pixel circuit 144 may be further electrically connected to at least another scan line. For example, the pixel PXL disposed in the i-th row of the display area DA may be further electrically connected to an (i−1)-th scan line Si−1 and/or an (i+1)-th scan line Si+1. In addition, according to an embodiment, the pixel circuit 144 may be further electrically connected to third power in addition to the first driving power VDD and the second driving power VSS. For example, the pixel circuit 144 may also be electrically connected to an initialization power line to which initialization power Vint is applied.

The pixel circuit 144 may include first to seventh transistors T1 to T7 and a storage capacitor Cst.

An electrode, for example, a source electrode of the first transistor T1 (driving transistor) may be electrically connected to the first driving power VDD via the fifth transistor T5, and another electrode, for example, a drain electrode may be electrically connected to a first end of the light emitting elements LD via the sixth transistor T6. In addition, a gate electrode of the first transistor T1 may be electrically connected to a first node N1. The first transistor T1 controls the driving current flowing between the first driving power VDD and the second driving power VSS via the light emitting elements LD in response to a voltage of the first node N1.

The second transistor T2 (switching transistor) may be electrically connected between the j-th data line Dj electrically connected to the pixel PXL and the source electrode of the first transistor T1. In addition, a gate electrode of the second transistor T2 may be electrically connected to the i-th scan line Si electrically connected to the pixel PXL. The second transistor T2 may be turned on in case that a scan signal having a gate-on voltage (for example, a low voltage) is supplied thereto from the i-th scan line Si, to electrically connect the j-th data line Dj to the source electrode of the first transistor T1. Therefore, in case that the second transistor T2 is turned on, the data signal supplied from the j-th data line Dj is transmitted to the first transistor T1.

The third transistor T3 may be electrically connected between the drain electrode of the first transistor T1 and the first node N1. In addition, a gate electrode of the third transistor T3 may be electrically connected to the i-th scan line Si. The third transistor T3 may be turned on in case that the scan signal having the gate-on voltage is supplied thereto from the i-th scan line Si, to electrically connect the drain electrode of the first transistor T1 and the first node N1 to each other.

The fourth transistor T4 may be electrically connected between the first node N1 and the initialization power line to which the initialization power Vint is applied. In addition, a gate electrode of the fourth transistor T4 may be electrically connected to a previous scan line, for example, the (i−1)-th scan line Si−1. The fourth transistor T4 may be turned on in case that the scan signal having the gate-on voltage is supplied to the (i−1)-th scan line Si−1, to transmit a voltage of the initialization power Vint to the first node N1. Here, the initialization power Vint may have a voltage equal to or less than the lowest voltage of the data signal.

The fifth transistor T5 may be electrically connected between the first driving power VDD and the first transistor T1. In addition, a gate electrode of the fifth transistor T5 may be electrically connected to a corresponding emission control line, for example, an i-th emission control line Ei. The fifth transistor T5 may be turned off in case that an emission control signal having a gate-off voltage is supplied to the i-th emission control line Ei, and may be turned on in other cases.

The sixth transistor T6 may be electrically connected between the first transistor T1 and a second node N2, which is electrically connected to the first end of the light emitting elements LD. In addition, a gate electrode of the sixth transistor T6 may be electrically connected to the i-th emission control line Ei. The sixth transistor T6 may be turned off in case that the emission control signal having the gate-off voltage is supplied to the i-th emission control line Ei, and may be turned on in other cases.

The seventh transistor T7 may be electrically connected between the first end of the light emitting elements LD and the initialization power line to which the initialization power Vint is applied. In addition, a gate electrode of the seventh transistor T7 may be electrically connected to any of next scan lines, for example, the (i+1)-th scan line Si+1. The seventh transistor T7 may be turned on in case that the scan signal of the gate-on voltage is supplied to the (i+1)-th scan line Si+1, to supply the voltage of the initialization power Vint to the first end of the light emitting elements LD.

The storage capacitor Cst may be electrically connected between the first driving power VDD and the first node N1. The storage capacitor Cst may store a data signal supplied to the first node N1 and a voltage corresponding to the threshold voltage of the first transistor T1 during each frame period.

FIGS. 6C and 6D illustrate that the transistors included in the pixel circuit 144, for example, the first to seventh transistors T1 to T7 are P-type transistors, but the disclosure is not limited thereto. For example, at least one of the first to seventh transistors T1 to T7 may be changed to an N-type transistor.

In an embodiment, the configuration of the pixel circuit 144 is not limited to the embodiment shown in FIGS. 6A to 6D. For example, the pixel circuit 144 may be configured as in an embodiment shown in FIG. 6E.

The pixel circuit 144 may be further electrically connected to a control line CLi and a sensing line SENj as shown in FIG. 6E. For example, the pixel circuit 144 of the pixel PXL disposed in the i-th row and the j-th column of the display area DA may be electrically connected to an i-th control line CLi and a j-th sensing line SENj of the display area DA. The above-described pixel circuit 144 may further include a third transistor T3 in addition to the first and second transistors T1 and T2 shown in FIGS. 6A and 6B.

The third transistor T3 is electrically connected between the first transistor T1 and the sensing line SENj. For example, an electrode of the third transistor T3 may be electrically connected to the first terminal (for example, the source electrode) of the first transistor T1 electrically connected to the first electrode EL1, and another electrode of the third transistor T3 may be electrically connected to the sensing line SENj. In case that the sensing line SENj is omitted, a gate electrode of the third transistor T3 may be electrically connected to the data line Dj.

According to an embodiment, a gate electrode of the third transistor T3 is electrically connected to the control line CLi. In case that the control line CLi is omitted, the gate electrode of the third transistor T3 may be electrically connected to the scan line Si. The third transistor T3 may be turned on by a control signal of a gate-on voltage (for example, a high-level voltage) supplied to the control line CLi during a sensing period, to electrically connect the sensing line SENj and the first transistor T1 to each other.

According to an embodiment, a sensing period may be a period for extracting characteristic information (for example, the threshold voltage of the first transistor T1) of each of the pixels PXL disposed in the display area DA. During the above-described sensing period, the first transistor T1 may be turned on by supplying a reference voltage, at which the first transistor T1 may be turned on, to the first node N1 through the data line Dj and the second transistor T2, or by electrically connecting each pixel PXL to a current source or the like. In addition, the first transistor T1 may be electrically connected to the sensing line SENj by supplying the control signal of the gate-on voltage to the third transistor T3 to turn on the third transistor T3. Therefore, the characteristic information of each pixel PXL including the threshold voltage or the like of the first transistor T1 may be extracted through the sensing line SENj. The extracted characteristic information may be used to convert image data so that a characteristic deviation between the pixels PXL is compensated for.

FIG. 6E illustrates an embodiment in which all of the first to third transistors T1 to T3 are N-type transistors, but the disclosure is not limited thereto. For example, at least one of the above-described first to third transistors T1 to T3 may be changed to a P-type transistor. In addition, FIG. 6E illustrates an embodiment in which the emission unit EMU is electrically connected between the pixel circuit 144 and the second driving power VSS, but the emission unit EMU may also be electrically connected between the first driving power VDD and the pixel circuit 144.

In addition, FIGS. 6A to 6E illustrate an embodiment in which all of the light emitting elements LD forming each emission unit EMU are electrically connected in parallel, but the disclosure is not limited thereto. According to an embodiment, the emission unit EMU may include at least one series stage including the light emitting elements LD electrically connected in parallel with each other. For example, the emission unit EMU may be configured in a serial-parallel mixed structure. A capacitor $C_{OLED}$ may be formed between the first and second electrodes EL1 and EL2.

The structure of the pixel PXL that may be applied to the disclosure is not limited to the embodiments shown in FIGS. 6A to 6E, and the corresponding pixel may have various structures. In addition, in another embodiment, each pixel PXL may be configured inside a passive type light emitting display device or the like. In this case, the pixel circuit 144 may be omitted, and each of the ends of the light emitting elements LD included in the emission unit EMU may be directly electrically connected to each of the scan lines Si−1, Si, and Si+1, the data line Dj, the first power line PL1 to which the first driving power VDD is applied, the second power line PL2 to which the second driving power VSS is applied, a control line, and/or the like.

Figure 7:
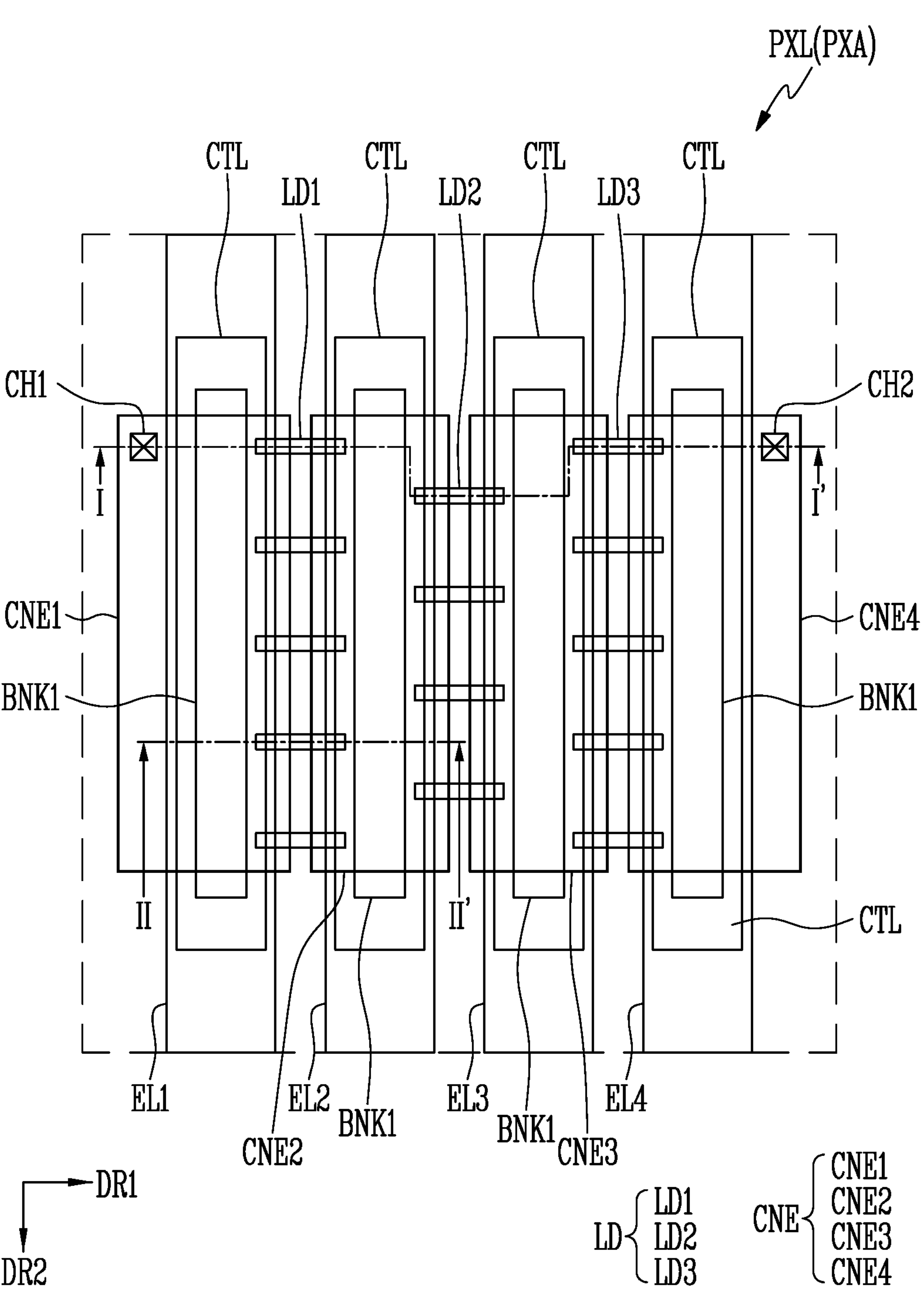
FIG. 7 is a plan view schematically illustrating a pixel among pixels shown in FIG. 5.
Figure 8:
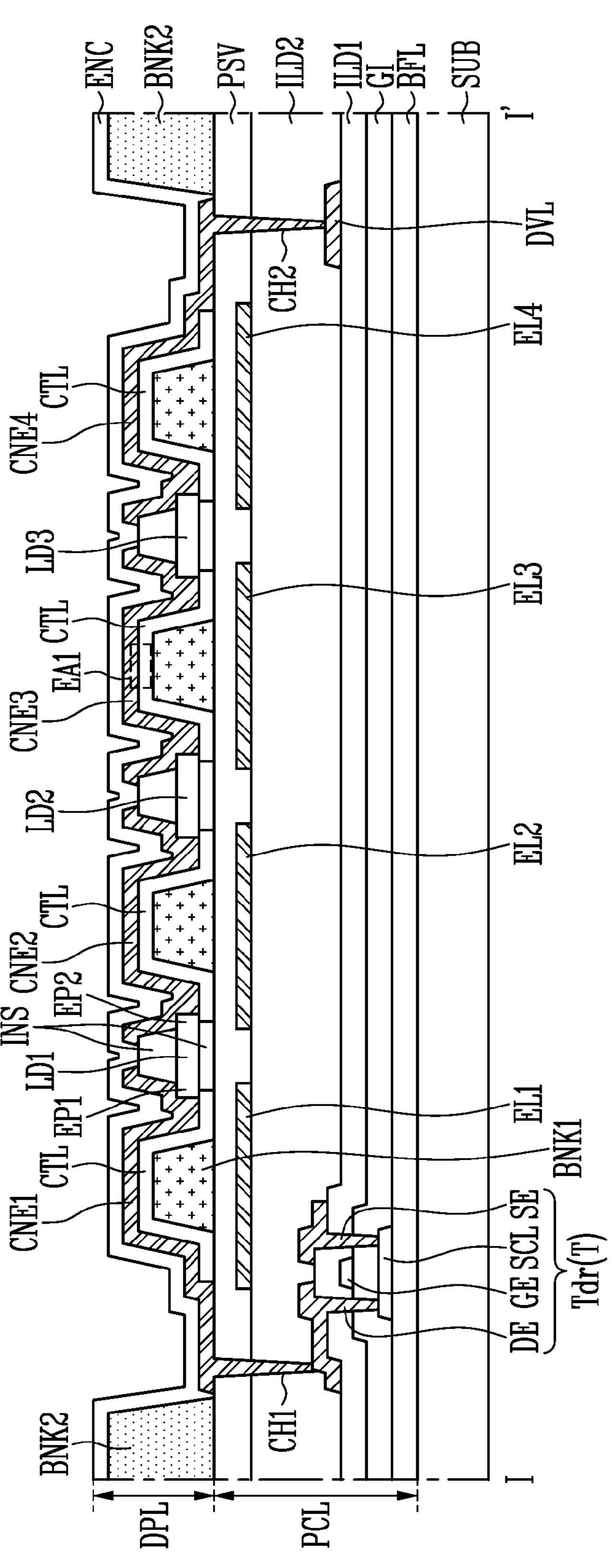
FIG. 8 is a schematic cross-sectional view taken along line I-I' of FIG. 7.
Figure 9:
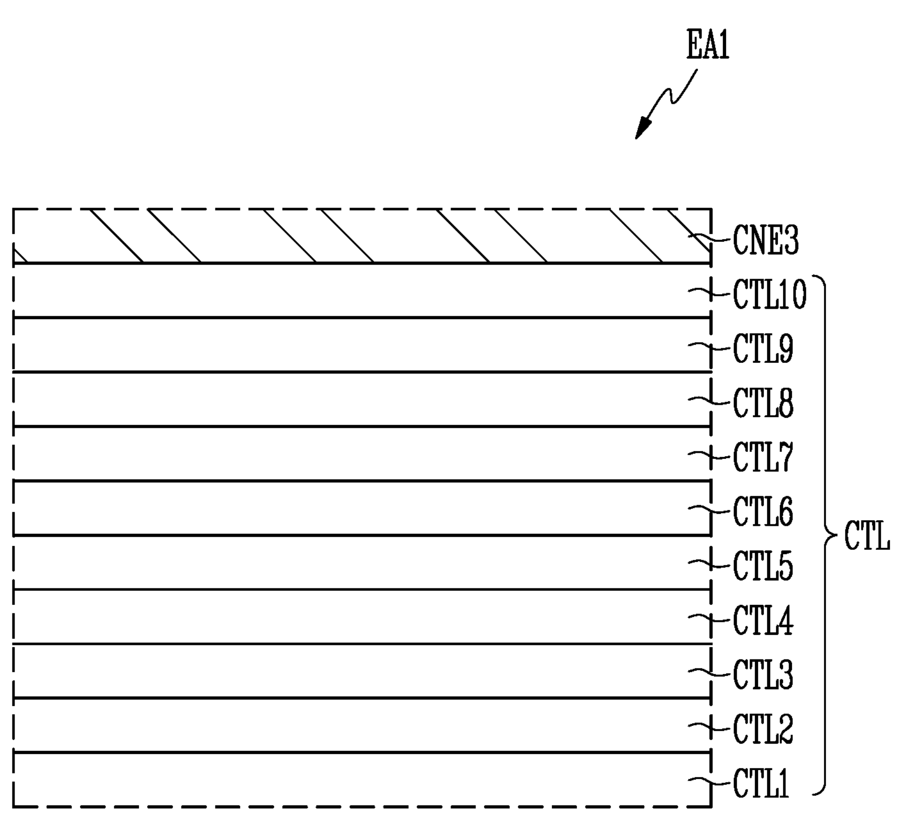
FIG. 9 is a schematic enlarged cross-sectional view of a portion EA1 of FIG. 8.
Figure 10:
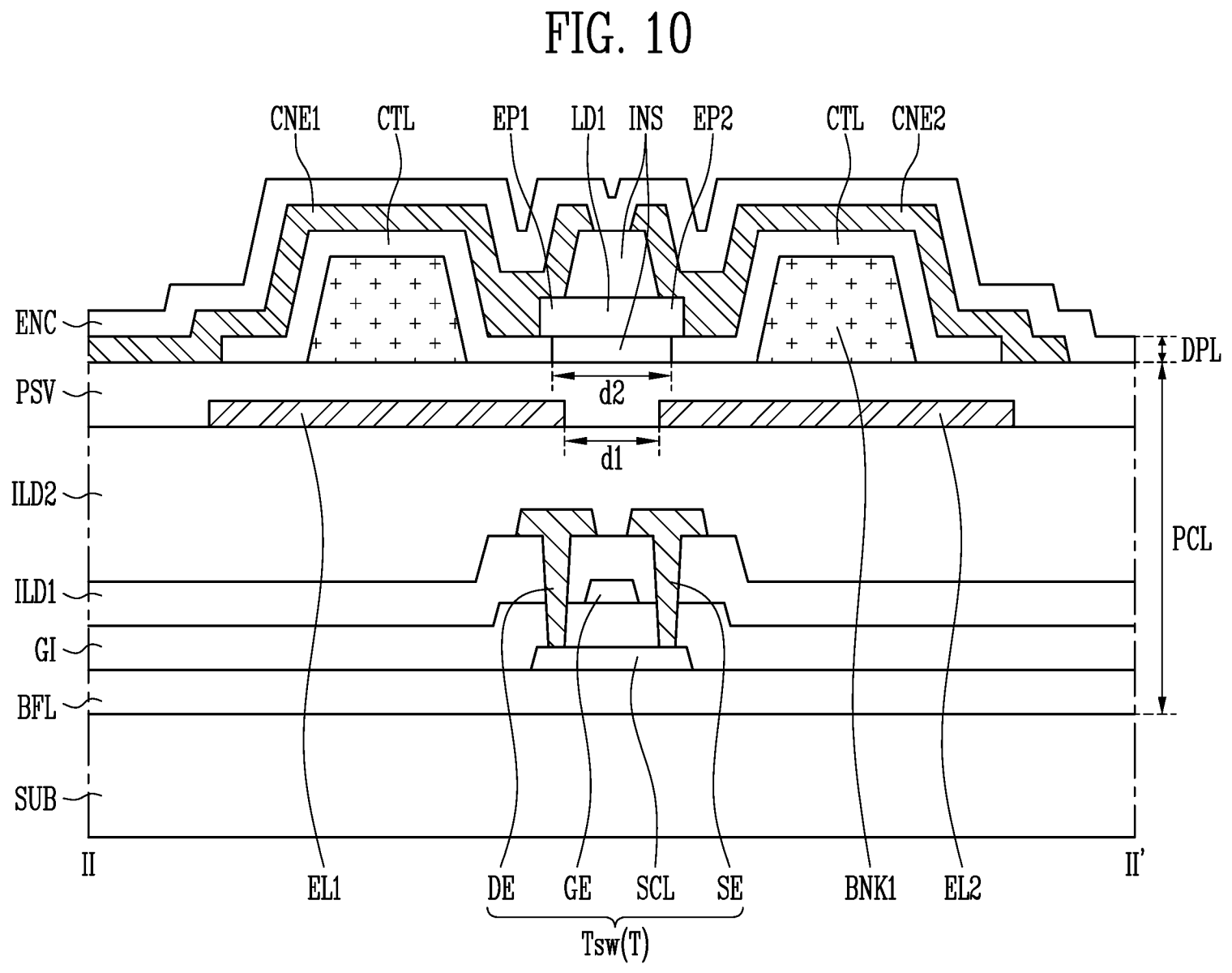
Figure 11:
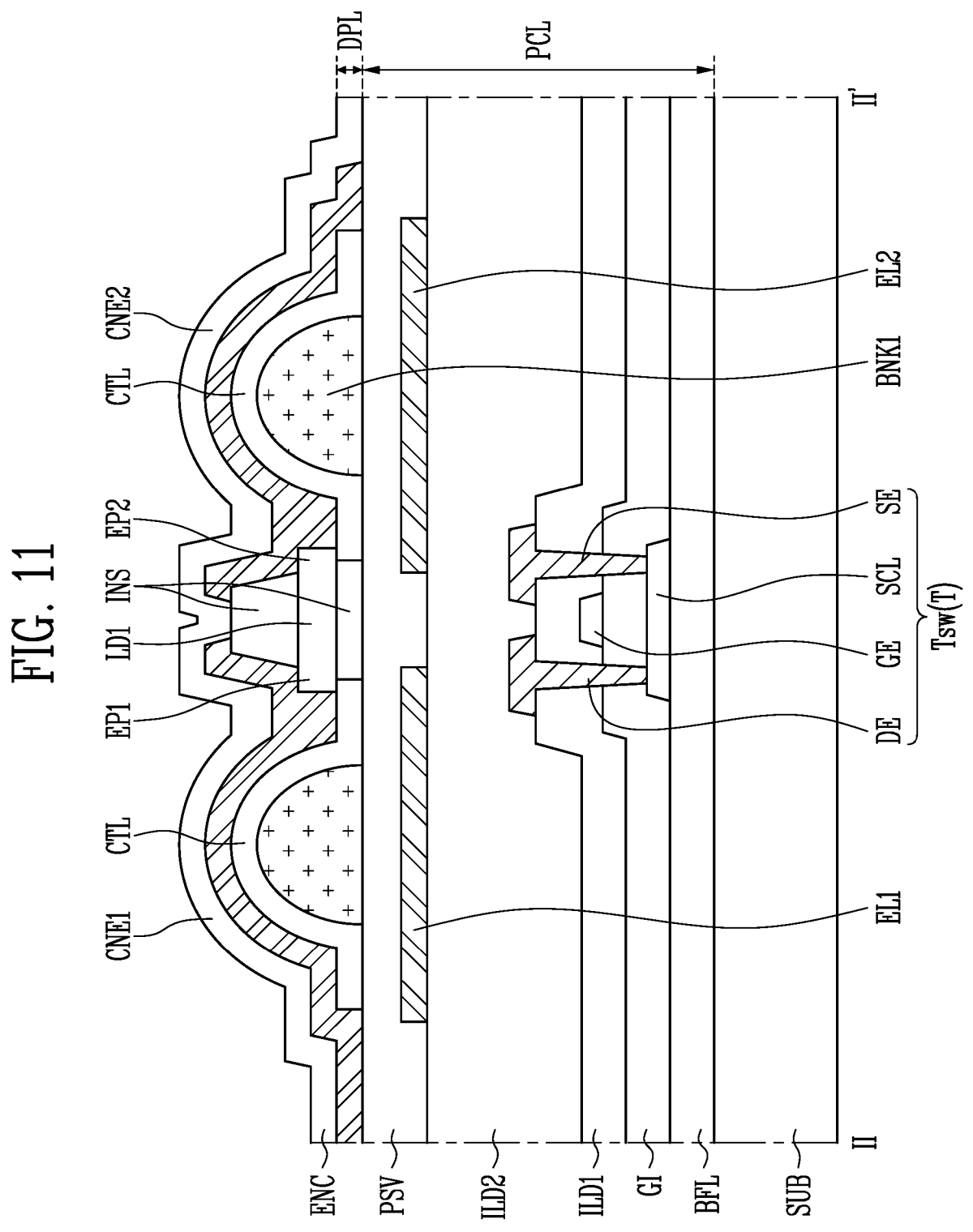
Figure 12:
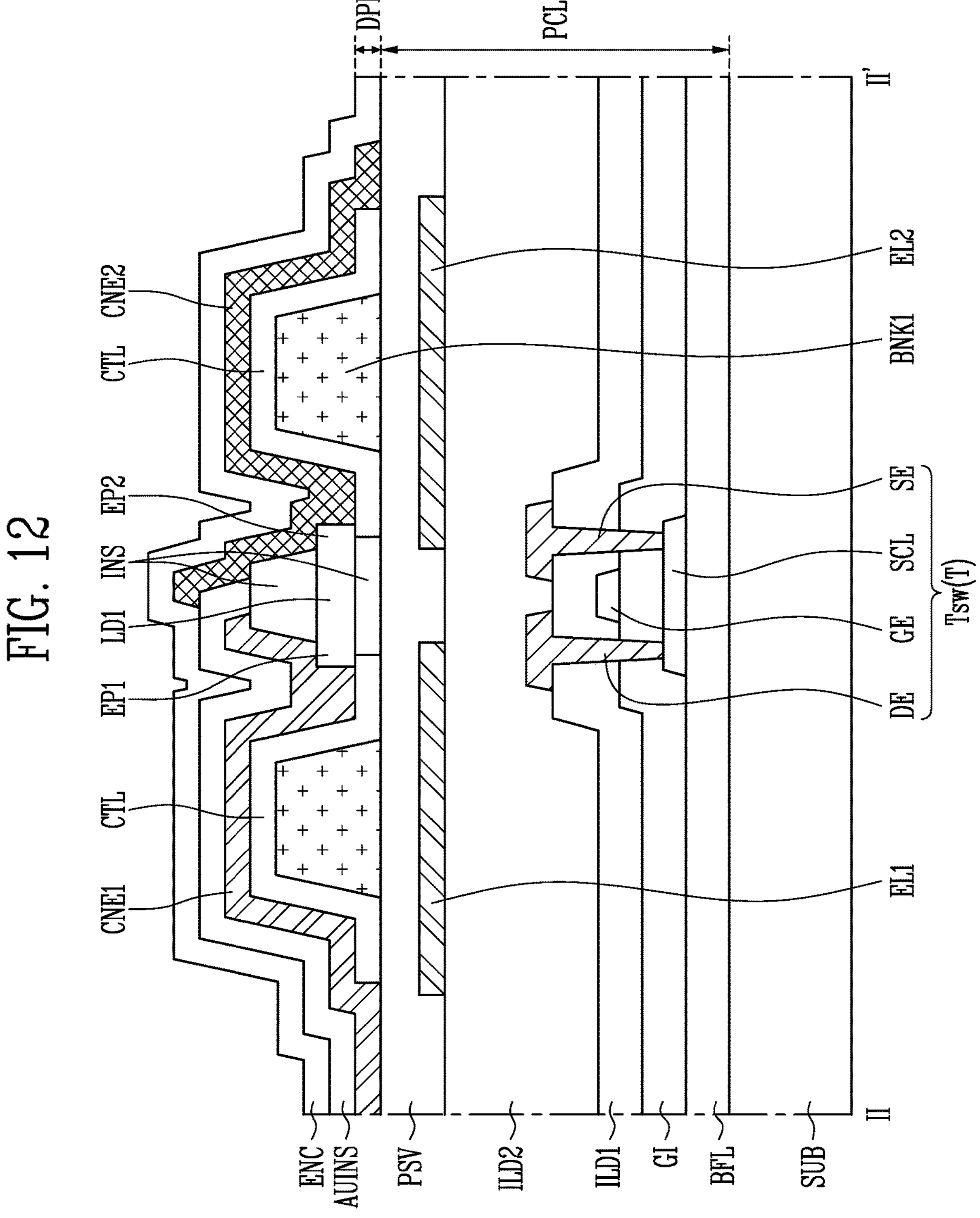
FIG. 12 is a schematic cross-sectional view corresponding to the line II-II' of FIG. 7 as an implementation of a display element part shown in FIG. 11 according to another embodiment.
Figure 13A:
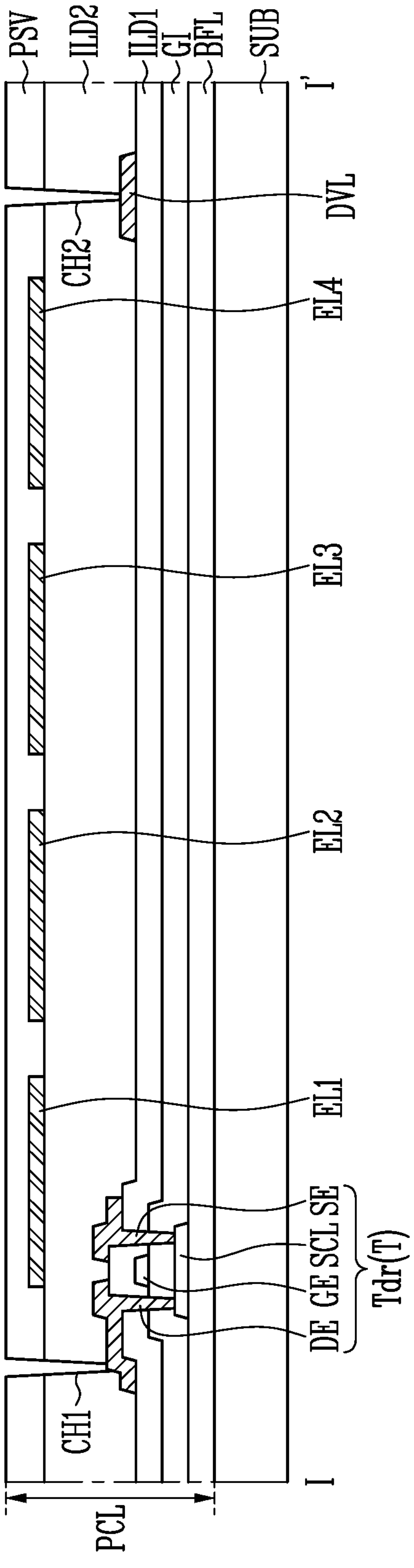
Figure 13B:
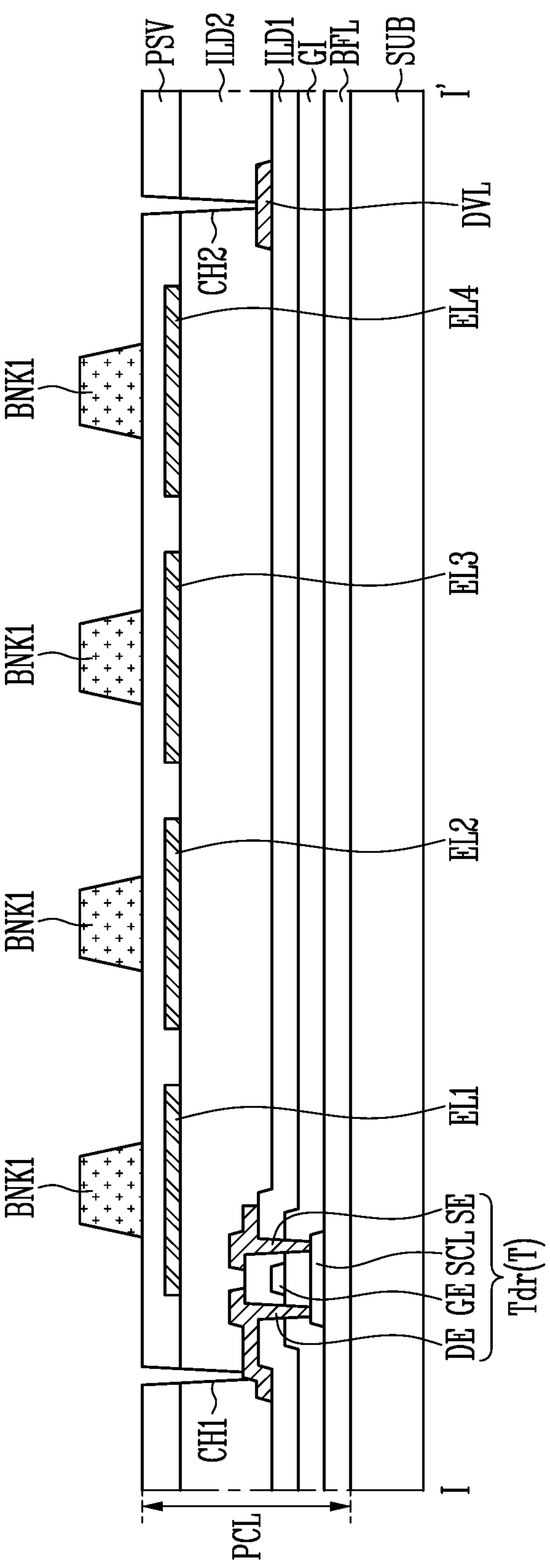
Figure 13C:
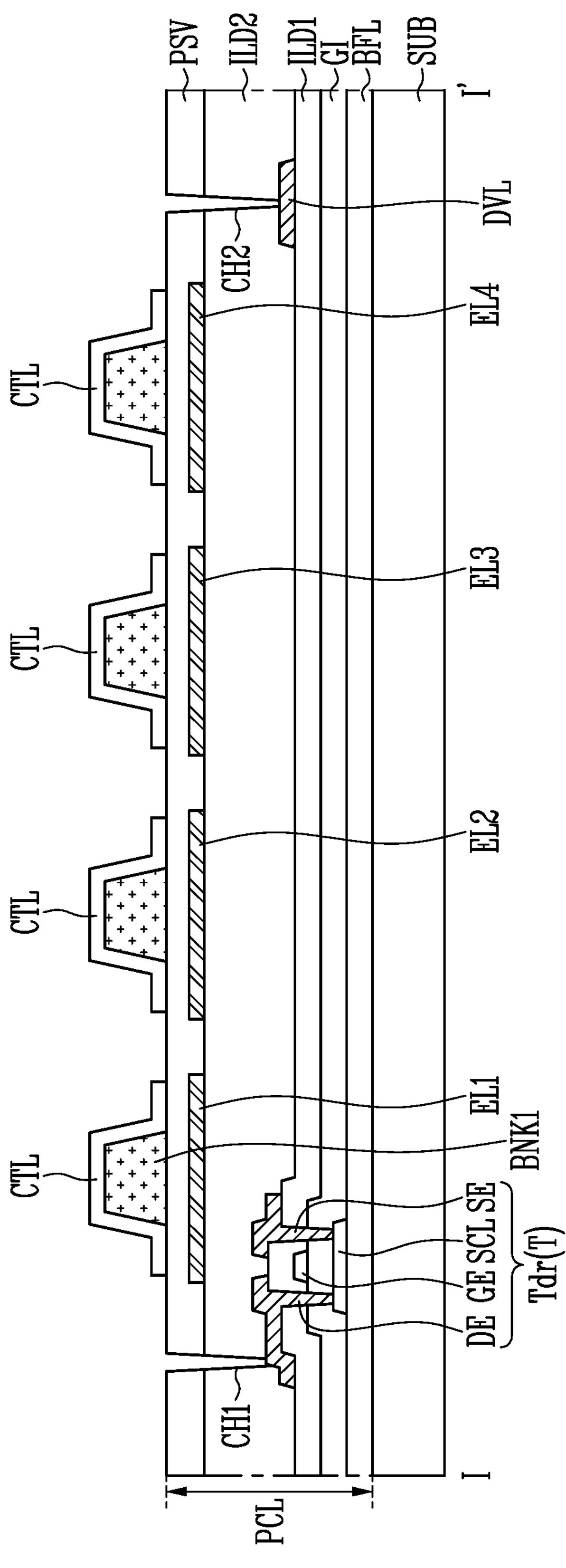
Figure 13D:
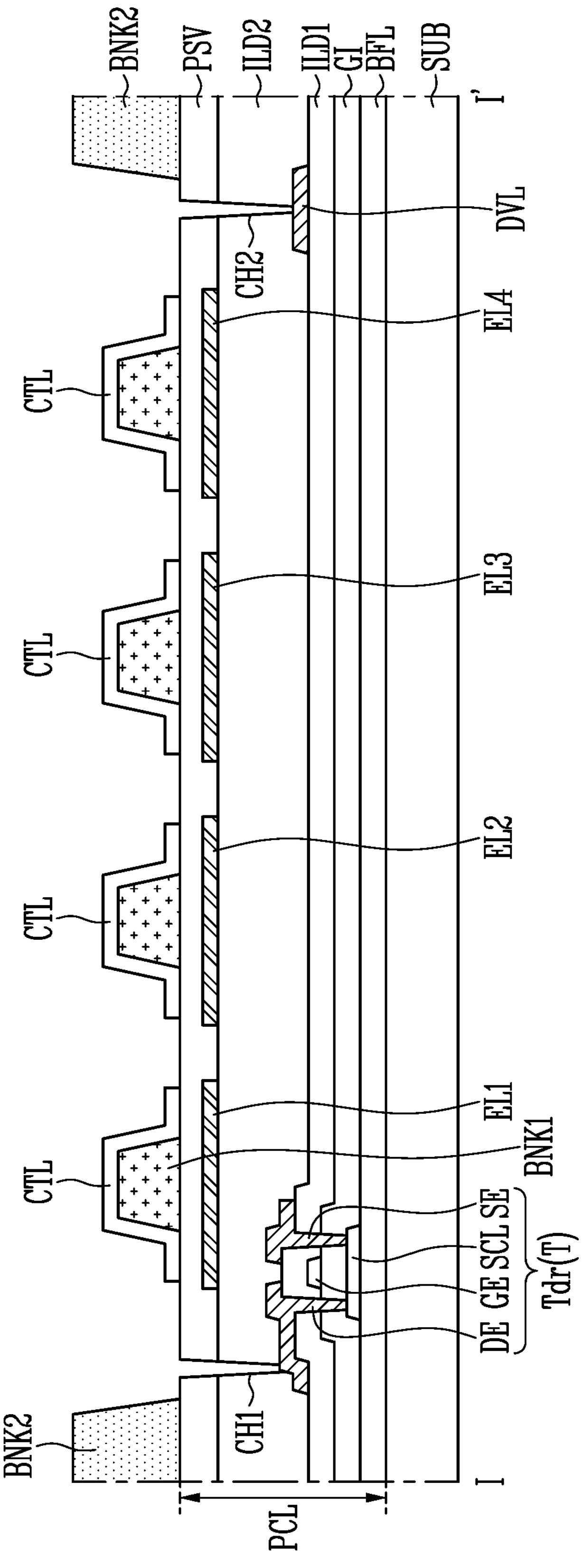
Figure 13E:
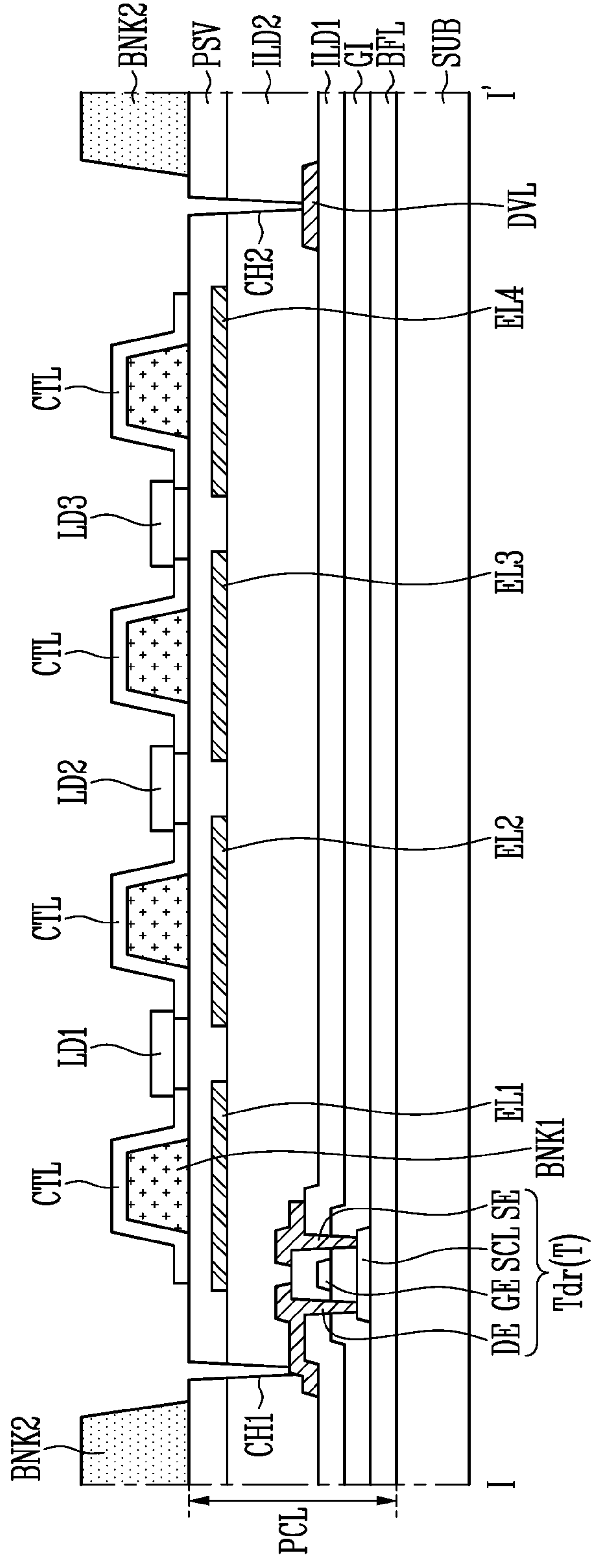
Figure 13G:
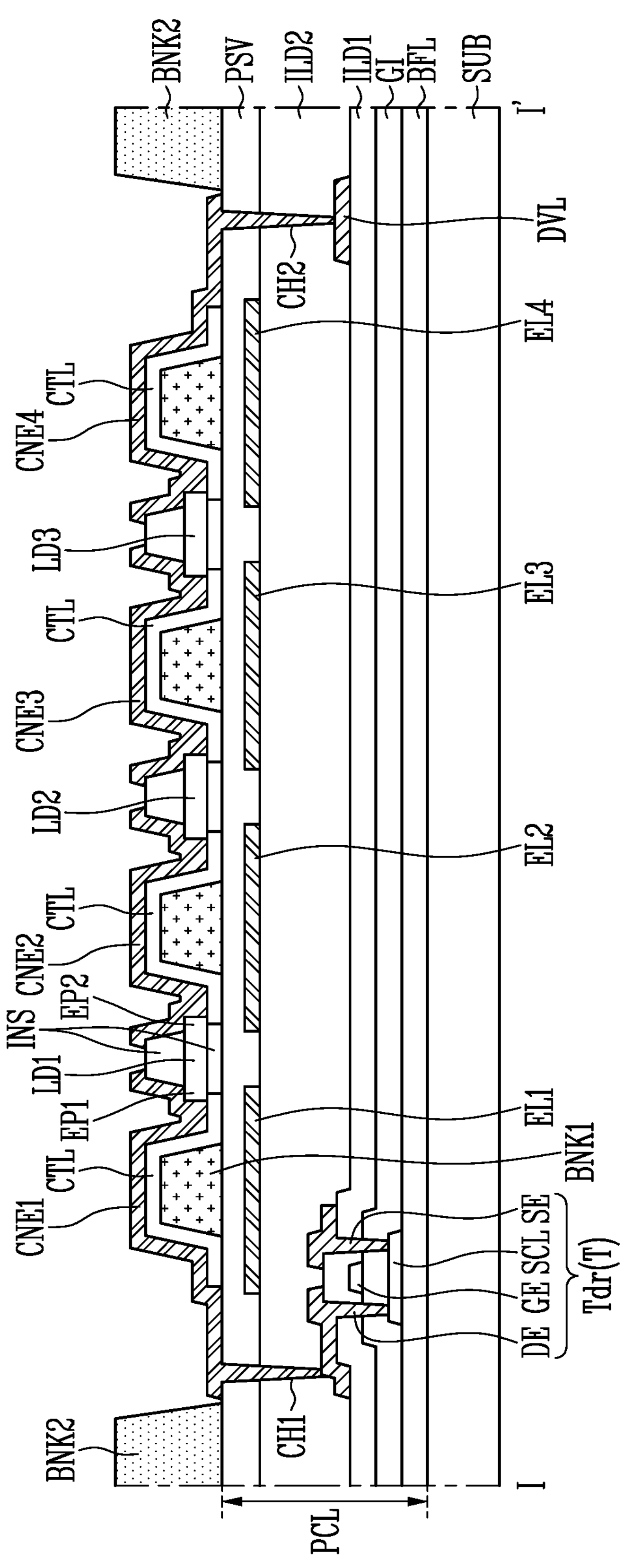
Figure 13H:
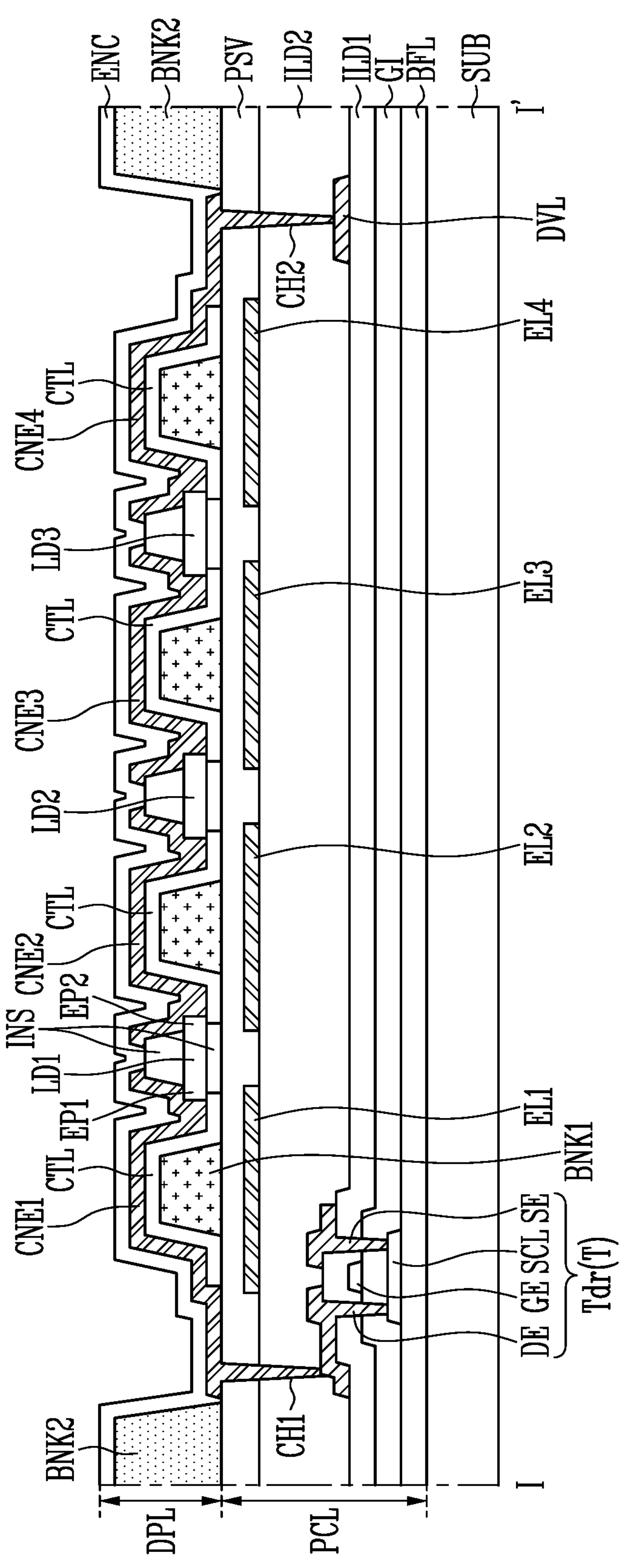

FIG. 7 is a plan view schematically illustrating a pixel among the pixels shown in FIG. 5, FIG. 8 is a schematic cross-sectional view taken along line I-I' of FIG. 7, FIG. 9 is a schematic enlarged cross-sectional view of portion EA1 of FIG. 8, FIG. 10 is a schematic cross-sectional view taken along line II-II' of FIG. 7, FIG. 11 is a schematic cross-sectional view corresponding to line II-II' of FIG. 7 as a first bank pattern shown in FIG. 10 according to another embodiment, and FIG. 12 is a schematic cross-sectional view corresponding to line II-II' of FIG. 7 as an implementation of a display element part shown in FIG. 11 according to another embodiment.

The pixel shown in FIG. 7 may be any of the pixels shown in each of FIGS. 6A to 6E.

For convenience, the transistor electrically connected to the light emitting elements and the signal lines electrically connected to the transistor are omitted from FIG. 7.

FIGS. 7 to 12 briefly illustrate a structure of the pixel PXL, illustrating each electrode as a single electrode layer and each insulating layer as a single insulating layer, but the disclosure is limited thereto.

Additionally, in an embodiment, "formed and/or provided on a same layer" may refer to being formed in a same process, and "formed and/or provided on different layers" may refer to being formed in different processes.

In addition, in an embodiment, "connection" between two components may mean that both an electrical connection and a physical connection are used inclusively.

Referring to FIGS. 1A to 5 and 7 to 12, the display device according to an embodiment may include the substrate SUB, the line part, and the pixels PXL.

The substrate SUB may include a transparent insulating material and may transmit light. The substrate SUB may be a rigid substrate or a flexible substrate.

For example, the rigid substrate may be one of a glass substrate, a quartz substrate, a glass ceramic substrate, and a crystalline glass substrate. The flexible substrate may be one of a film substrate and a plastic substrate including a polymer organic material. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

A material applied to the substrate SUB may have resistance (or heat resistance) to a high process temperature during a manufacturing process of the display device.

The substrate SUB may include the display area DA including at least one pixel area PXA on which the pixel PXL is disposed, and the non-display area NDA disposed around the display area DA.

The pixel area PXA in which each pixel PXL is disposed (or provided) may include an emission area from which light is emitted and a peripheral area surrounding a periphery of the emission area. In an embodiment, the peripheral area may include a non-emission area from which light is not emitted.

The line part may include signal lines that transmit a signal (or a voltage) to each pixel PXL. The signal lines may include, for example, a scan line Si (see FIG. 6A) that transmits a scan signal to each pixel PXL, a data line Dj (see FIG. 6A) that transmits a data signal to each pixel PXL, and an emission control line Ei (see FIG. 6C) that transmits an emission control signal to each pixel PXL, and the like. However, the disclosure is not limited thereto, and according to an embodiment, the line part may further include signal lines for transmitting other signals in addition to the above-described signal lines.

Each pixel PXL may be disposed in the substrate SUB and may include a pixel circuit part PCL including the pixel circuit 144 (see FIGS. 6A to 6E) and a display element part DPL including the light emitting elements LD. The light emitting elements LD may be positioned in the emission area provided in the pixel area PXA of each pixel PXL.

For convenience, the pixel circuit part PCL is described first, and the display element part DPL is described.

The pixel circuit part PCL may include a buffer layer BFL, the pixel circuit 144, and a protective layer PSV.

The buffer layer BFL may prevent an impurity from diffusing into a transistor T included in the pixel circuit. The buffer layer BFL may include an inorganic insulating layer including an inorganic material. For example, the buffer layer BFL may include at least one of metal oxide such as silicon nitride ($SiN_x$), silicon oxide ($SiO_x$), silicon oxynitride (SiON), and a metal oxide such as aluminum oxide ($AlO_x$). The buffer layer BFL may be provided as a single layer, or may be provided as a multi-layer of at least two or more layers. The buffer layer BFL is provided as the multi-layer, each layer may be formed of a same material or may be formed of different materials. The buffer layer BFL may be omitted according to a material, a process condition, and the like of the substrate SUB.

The pixel circuit 144 may include at least one transistor T and a storage capacitor Cst. Here, the transistor T may include a driving transistor Tdr that controls a driving current of the light emitting elements LD and a switching transistor Tsw electrically connected to the driving transistor Tdr. However, the disclosure is not limited thereto, and the pixel circuit 144 may include circuit elements performing another function in addition to the driving transistor Tdr and the switching transistor Tsw. In the following embodiment, in case that one of the driving transistor Tdr and the switching transistor Tsw is arbitrarily referred to or in case that the driving transistor Tdr and the switching transistor Tsw are collectively referred to, one of the driving transistor Tdr and the switching transistor Tsw or the driving transistor Tdr and the switching transistor Tsw may be referred to as a transistor T or transistors T.

Each of the driving transistor Tdr and the switching transistor Tsw may include a transistor semiconductor pattern SCL, a gate electrode GE, a first terminal SE, and a second terminal DE. The first terminal SE may be any one of a source electrode and a drain electrode, and the second terminal DE may be the other electrode. For example, in case that the first terminal SE is a source electrode, the second terminal DE may be a drain electrode.

The transistor semiconductor pattern SCL may be provided and/or formed on the buffer layer BFL. The transistor semiconductor pattern SCL may include a first contact region contacting the first terminal SE and a second contact region contacting the second terminal DE. A region between the first contact region and the second contact region may be a channel region. The transistor semiconductor pattern SCL may be a semiconductor pattern formed of polysilicon, amorphous silicon, oxide semiconductor, or the like. The channel region may be a semiconductor pattern that is not doped with an impurity, and may be an intrinsic semiconductor. The first contact region and the second contact region may be semiconductor patterns doped with an impurity.

The gate electrode GE may be provided and/or formed on the transistor semiconductor pattern SCL with a gate insulating layer GI interposed therebetween.

The gate insulating layer GI may be an inorganic insulating layer including an inorganic material. For example, the gate insulating layer GI may include at least one of silicon nitride ($SiN_x$), silicon oxide ($SiO_x$), silicon oxynitride (SiON), and a metal oxide such as aluminum oxide ($AlO_x$). However, the material of the gate insulating layer GI is not limited to the above-described embodiments. According to an embodiment, the gate insulating layer GI may be formed as an organic insulating layer including an organic material. The gate insulating layer GI may be provided as a single layer, but may also be provided as a multi-layer of at least two or more layers.

Each of the first terminal SE and the second terminal DE may contact the first contact region and the second contact region of the transistor semiconductor pattern SCL through a contact hole passing through a first interlayer insulating layer ILD1 and the gate insulating layer GI.

In the above-described embodiment, the first and second terminals SE and DE of each of the driving transistor Tdr and the switching transistor Tsw are described as separate electrodes electrically connected to the transistor semiconductor pattern SCL, but the disclosure is not limited thereto. According to an embodiment, the first terminal SE of each of the driving transistor Tdr and the switching transistor Tsw may be one of the first and second contact regions adjacent to the channel region of the corresponding transistor semiconductor pattern SCL, and the second terminal DE of each of the driving transistor Tdr and the switching transistor Tsw may be a remaining region of the first and second contact regions adjacent to the channel region of the corresponding transistor semiconductor pattern SCL. In this case, the second terminal DE of each of the driving transistor Tdr and the switching transistor Tsw may be electrically connected to the light emitting elements LD of the corresponding pixel PXL through a bridge electrode, a contact electrode, or the like.

In an embodiment, the transistors T included in the pixel circuit 144 may be configured as low-temperature polycrystalline silicon (LTPS) thin-film transistors, but the disclosure is not limited thereto, and may be configured as an oxide semiconductor thin-film transistor according to an embodiment. In addition, in case that the transistors T are thin-film transistors having a top gate structure is described as an example, but is not limited thereto. According to an embodiment, the transistors T may be thin-film transistors having a bottom gate structure.

A driving voltage line DVL may be provided and/or formed on the first interlayer insulating layer ILD1, but the disclosure is not limited thereto, and according to an embodiment, the driving voltage line DVL may be disposed on any among insulating layers included in the pixel circuit part PCL. A second driving power VSS (see FIGS. 6A to 6E) may be applied to the driving voltage line DVL. In an embodiment, the driving voltage line DVL may be the second power line PL2 to which the second driving power VSS is applied as illustrated in each of FIGS. 6A to 6E.

A second interlayer insulating layer ILD2 may be provided and/or formed on the transistors T and the driving voltage line DVL.

The second interlayer insulating layer ILD2 may cover the transistors T and the driving voltage line DVL. The second interlayer insulating layer ILD2 may be an inorganic insulating layer including an inorganic material or an organic insulating layer including an organic material. According to an embodiment, the second interlayer insulating layer ILD2 may include the same material as the first interlayer insulating layer ILD1, but the disclosure is not limited thereto. The second interlayer insulating layer ILD2 may be provided as a single layer, or may be provided as a multi-layer of at least two or more layers. The second interlayer insulating layer ILD2 may include a first contact hole CH1 exposing a portion of the driving transistor Tdr and a second contact hole CH2 exposing a portion of the driving voltage line DVL.

First to fourth electrodes EL1 to EL4 may be provided and/or formed on the second interlayer insulating layer ILD2. The first to fourth electrodes EL1 to EL4 may be spaced apart from each other on the second interlayer insulating layer ILD2.

Each of the first to fourth electrodes EL1 to EL4 may extend in a second direction DR2, and may be commonly provided in each pixel PXL and adjacent pixels PXL positioned in the same pixel column as that of each pixel PXL.

The first electrode EL1 and the second electrode EL2 may be spaced apart from each other with a distance therebetween, the second electrode EL2 and the third electrode EL3 may be spaced apart from each other with a distance therebetween, and the third electrode EL3 and the fourth electrode EL4 may be spaced apart from each other with a distance therebetween. In the pixel area PXA of each pixel PXL, the distance between the first electrode EL1 and the second electrode EL2, the distance between the second electrode EL2 and the third electrode EL3, and the distance between the third electrode EL3 and the fourth electrode EL4 may be the same. However, the disclosure is not limited thereto, and according to an embodiment, the distance between the first electrode EL1 and the second electrode EL2, the distance between the second electrode EL2 and the third electrode EL3, and the distance between the third electrode EL3 and the fourth electrode EL4 may be different from each other. In an embodiment, a distance d1 between two adjacent electrodes among the first to fourth electrodes EL1 to EL4 may be less than the length L of each of the light emitting elements LD. For example, the distance d1 between the adjacent first and second electrodes EL1 and EL2 among the first to fourth electrodes EL1 to EL4 may be about 3.5 μm or less, but the disclosure is not limited thereto.

In an embodiment, each of the first to fourth electrodes EL1 to EL4 may function as an alignment electrode (or an alignment line) for aligning the light emitting elements LD in the emission area of each of the pixels PXL. According to an embodiment, the first to fourth electrodes EL1 to EL4 may be disposed on the second interlayer insulating layer ILD2 and may block an electric field induced from the transistors T included in the pixel circuit part PCL and signal lines electrically connected to the transistors T to prevent the electric field from affecting the alignment and/or driving of the light emitting elements LD included in the display element part DPL. For example, the first to fourth electrodes EL1 to EL4 may function as electric field shielding lines. In addition, according to an embodiment, each of the first to fourth electrodes EL1 to EL4 may be electrically connected to some components to which a signal (or voltage) is applied among components included in the display element part DPL, to align the light emitting elements LD in a desired area.

The above-described first to fourth electrodes EL1 to EL4 may be disposed on the second interlayer insulating layer ILD2 and may include a same material. For example, the first to fourth electrodes EL1 to EL4 may be formed as a single layer including at least one selected from the group consisting of molybdenum (Mo), tungsten (W), aluminum neodymium (AlNd), titanium (Ti), aluminum (Al), silver (Ag), and an alloy thereof, or a mixture thereof, or may be formed as a double layer or a multi-layer formed of molybdenum (Mo), aluminum (Al), or silver (Ag), which is a low-resistance material, to reduce line resistance.

In the above-described embodiment, the first to fourth electrodes EL1 to EL4 are disposed on a same layer, but the disclosure is not limited thereto. According to an embodiment, some electrodes among the first to fourth electrodes EL1 to EL4 and the remaining electrodes may be disposed on different layers.

The protective layer PSV may be provided and/or formed on the first to fourth electrodes EL1 to EL4.

The protective layer PSV may be provided in a form including an organic insulating layer, an inorganic insulating layer, or an organic insulating layer disposed on the inorganic insulating layer. Here, the inorganic insulating layer may include at least one of silicon oxide ($SiO_x$), silicon nitride ($SiN_x$), silicon oxynitride (SiON), and a metal oxide such as aluminum oxide ($AlO_x$). The organic insulating layer may include an organic insulating material capable of transmitting light. The organic insulating layer may include at least one of an acrylic resin (polyacrylates resin), an epoxy resin, a phenolic resin, a polyamide resin, a polyimides resin, an unsaturated polyesters resin, a polyphenylene ethers resin, a polyphenylene sulfides resin, and a benzocyclobutene resin.

In an embodiment, the protective layer PSV may include a first contact hole CH1 corresponding to the first contact hole CH1 of the second interlayer insulating layer ILD2 and a second contact hole CH2 corresponding to the second contact hole CH2 of the second interlayer insulating layer ILD2. Accordingly, each of a portion of the second terminal DE of the driving transistor Tdr and a portion of the driving voltage line DVL may be exposed to the outside.

The display element part DPL may be disposed on the protective layer PSV.

The display element part DPL may include first and second bank patterns BNK1 and BNK2, an intermediate layer CTL, the light emitting elements LD, and a contact electrode CNE.

The first bank pattern BNK1 may be a support member supporting the intermediate layer CTL to change a surface profile of the intermediate layer CTL so that light emitted from the light emitting elements LD further travels in an image display direction of the display device.

The first bank pattern BNK1 may be provided and/or formed between the protective layer PSV and the intermediate layer CTL in the emission area of each pixel PXL. The first bank pattern BNK1 may include an inorganic insulating layer formed of an inorganic material or an organic insulating layer formed of an organic material. According to an embodiment, the first bank pattern BNK1 may include a single-layered organic insulating layer and/or a single-layered inorganic insulating layer, but the disclosure is not limited thereto. According to an embodiment, the first bank pattern BNK1 may be provided in a form of a multi-layer in which at least one organic insulating layer and at least one inorganic insulating layer are stacked. However, the material of the first bank pattern BNK1 is not limited to the above-described embodiments, and according to an embodiment, the first bank pattern BNK1 may include a conductive material.

The first bank pattern BNK1 may have a cross section having a trapezoidal shape that becomes narrower upwardly from a surface of the protective layer PSV, but the disclosure is not limited thereto. According to an embodiment, as shown in FIG. 11, the first bank pattern BNK1 may include a curved surface having a cross section of a semi-elliptical shape, a semi-circle shape (or a hemisphere shape), or the like in which a width becomes narrower toward an upper portion from a surface of the protective layer PSV. In a cross-sectional view, a shape of the first bank pattern BNK1 is not limited to the above-described embodiments and may be variously changed within a range capable of improving efficiency of light emitted from each of the light emitting elements LD. The adjacent first bank patterns BNK1 and the protective layer PSV may be disposed on a same plane, and may have a same height (or thickness).

The first bank pattern BNK1 may have a bar shape extending in a direction, for example, the second direction DR2 (vertical direction) in a plan view, but the disclosure is not limited thereto, and the shape of the first bank pattern BNK1 may be changed to various shapes.

The second bank pattern BNK2 may be provided in the peripheral area of the pixel area PXA in which each pixel PXL is disposed.

The second bank pattern BNK2 may surround at least one side of the peripheral area included in the pixel area PXA of each pixel PXL. The second bank pattern BNK2 may be a structure defining (or partitioning) the emission area of each pixel PXL and each of the pixels PXL adjacent thereto, and may be, for example, a pixel defining layer. The second bank pattern BNK2 may be configured to include at least one light blocking material and/or reflective material to prevent a light leakage defect in which light (or rays) leaks between each pixel PXL and the pixels PXL adjacent thereto. According to an embodiment, a reflective layer (or reflective material layer) may be formed on the second bank pattern BNK2 to further improve efficiency of light emitted from each pixel PXL. According to an embodiment, the second bank pattern BNK2 and the first bank pattern BNK1 may be formed on different layers or a same layer.

The intermediate layer CTL may be provided in the pixel area PXA of each pixel PXL and may extend in a direction. For example, the intermediate layer CTL may extend in a direction parallel to an extension direction of each of the first to fourth electrodes EL1 to EL4, for example, the second direction DR2. The intermediate layer CTL may be provided and/or formed on the first bank pattern BNK1 to overlap each of the first to fourth electrodes EL1 to EL4 in a plan view.

In an embodiment, a distance between the intermediate layer CTL (hereinafter referred to as a "first intermediate layer") overlapping the first electrode EL1 and the intermediate layer CTL (hereinafter referred to as a "second intermediate layer") overlapping the second electrode EL2, a distance between the second intermediate layer and the intermediate layer CTL (hereinafter referred to as a "third intermediate layer") overlapping the third electrode EL3, and a distance between the third intermediate layer CTL and the intermediate layer CTL (hereinafter referred to as a "fourth intermediate layer") overlapping the fourth electrode EL4 may be the same. However, the disclosure is not limited thereto, and according to an embodiment, the distance between the first intermediate layer CTL and the second intermediate layer CTL, the distance between the second intermediate layer CTL and the third intermediate layer CTL, and the distance between the third intermediate layer CTL and the fourth intermediate layer CTL may be different. In an embodiment, a distance d2 between two adjacent intermediate layers CTL may be less than the length L of each of the light emitting elements LD and may be greater than the distance d1 between two adjacent electrodes.

The intermediate layer CTL may be provided and/or formed on the first bank pattern BNK1 to have a surface profile corresponding to the shape of the first bank pattern BNK1. For example, the intermediate layer CTL may include a protrusion portion corresponding to the first bank pattern BNK1 and a flat portion corresponding to the protective layer PSV.

In an embodiment, the intermediate layer CTL may be provided in a form of a multi-layer including a double layer. As an example, the intermediate layer CTL may be configured of a multi-layer including first to tenth intermediate layers CTL1 to CTL10 sequentially stacked from a surface of the first bank pattern BNK1, but the disclosure is not limited thereto. According to an embodiment, the intermediate layer CTL may be configured of a multi-layer including six or more inorganic insulating layers sequentially stacked from a surface of the first bank pattern BNK1.

In an embodiment, odd-numbered intermediate layers CTL1, CTL3, CTL5, CTL7, and CTL9 and even-numbered intermediate layers CTL2, CTL4, CTL6, CTL8, and CTL10 may have different refractive indices n (refractive index and/or index of refraction). For example, the odd-numbered intermediate layers CTL1, CTL3, CTL5, CTL7, and CTL9 may have a refractive index less than that of the even-numbered intermediate layers CTL2, CTL4, CTL6, CTL8, and CTL10.

A thickness of each of the first to tenth intermediate layers CTL1 to CTL10 may be determined within a range in which a wavelength of light reflected from each intermediate layer CTL and a refractive index of a material satisfy $\lambda/4n$. Each of the first to tenth intermediate layers CTL1 to CTL1 may have a same thickness or different thicknesses. The thickness of each of the first to tenth intermediate layers CTL1 to CTL10 may be determined within a range (or within a limit) that does not affect the entire thickness of the display device.

In the following embodiment, for convenience of description, the refractive index of the odd-numbered intermediate layers CTL1, CTL3, CTL5, CTL7, and CTL9 is referred to as a first refractive index, and the refractive index of the even-numbered intermediate layers CTL2, CTL4, CTL6, CTL8, and CTL10 is referred to as a second refractive index.

In an embodiment, the odd-numbered intermediate layers CTL1, CTL3, CTL5, CTL7, and CTL9 may be inorganic insulating layers including silicon oxide ($SiO_x$), and the even-numbered intermediate layers CTL2, CTL4, CTL6, CTL8, and CTL10 may be inorganic insulating layers including silicon nitride ($SiN_x$). A refractive index difference between the odd-numbered intermediate layers CTL1, CTL3, CTL5, CTL7, and CTL9 and the even-numbered intermediate layers CTL2, CTL4, CTL6, CTL8, and CTL10 may be less than approximately ½, but the disclosure is not limited thereto. For example, each of the even-numbered intermediate layers CTL2, CTL4, CTL6, CTL8, and CTL10 may have a refractive index of about 1.887954, and each of the odd-numbered intermediate layers CTL1, CTL3, CTL5, CTL7, and CTL9 may have a refractive index of about 1.472646.

The intermediate layer CTL according to an embodiment may be configured of a multi-layer having a structure in which at least three or more double layers in which at least one intermediate layer CTL having the first refractive index and including silicon oxide ($SiO_x$) and at least one intermediate layer CTL having the second refractive index and including silicon nitride ($SiO_x$) are paired are sequentially stacked. However, the disclosure is not limited thereto, and according to an embodiment, the odd-numbered intermediate layers CTL1, CTL3, CTL5, CTL7, and CTL9 may be formed of silicon nitride ($SiN_x$), and the even-numbered intermediate layers CTL2, CTL4, CTL6, CTL8, and CTL10 may be formed of silicon oxide ($SiO_x$).

As described above, in case that the intermediate layer CTL is configured of a multi-layer, the intermediate layer CTL may change a traveling direction of the light emitted from each of the light emitting elements LD by using interference due to the refractive difference between the odd-numbered intermediate layers CTL1, CTL3, CTL5, CTL7, and CTL9 and the even-numbered intermediate layers CTL2, CTL4, CTL6, CTL8, and CTL10. For example, the intermediate layer CTL may reflect the light emitted from each of the light emitting elements LD in the image display direction of the display device.

In an embodiment, since the intermediate layer CTL has the surface profile corresponding to the shape of the first bank pattern BNK1 disposed thereunder, the light emitted from each of the light emitting elements LD may be reflected by the intermediate layer CTL and may further travel in the image display direction of the display device. Finally, efficiency of the light emitted from each of the light emitting elements LD may be further improved.

The first bank pattern BNK1 and the intermediate layer CTL may function as a reflective member for improving light output efficiency of the light emitting elements LD by allowing the light, emitted from the light emitting elements LD to progress in the image display direction of the display device.

The above-described intermediate layer CTL may be formed to be disposed only in the pixel area PXA of each pixel PXL. For example, the intermediate layer CTL provided in a pixel PXL may not be electrically connected to and may be separated from the intermediate layer CTL provided in each of adjacent pixels PXL disposed in the same pixel column as that of the pixel PXL.

In the above-described embodiment, the intermediate layer CTL includes an insulating material (or substance), but the disclosure is not limited thereto. According to an embodiment, the intermediate layer CTL may include a conductive material (or substance).

Additionally, in the above-described embodiment, the intermediate layer CTL is described as the multi-layer having the structure in which at least three or more double insulating layers in which at least one intermediate layer formed of silicon oxide ($SiO_x$) and at least one intermediate layer formed of silicon nitride ($SiN_x$) are paired are sequentially stacked, but the disclosure is not limited thereto. According to an embodiment, the intermediate layer CTL may be configured of a multi-layer including an intermediate layer formed of aluminum oxide ($Al_2O_3$) on an uppermost layer of the multi-layer having the structure in which at least three or more double insulating layers in which at least one intermediate layer formed of silicon oxide ($SiO_x$) and at least one intermediate layer formed of silicon nitride ($SiN_x$) are paired are sequentially stacked each other.

In an embodiment, after the intermediate layer CTL is disposed in the pixel area PXA of each pixel PXL, an alignment signal (or alignment voltage) may be applied to each of the first to fourth electrodes EL1 to EL4. In case that an alignment signal is applied to each of the first to fourth electrodes EL1 to EL4, each of the first to fourth electrodes EL1 to EL4 may function as an alignment electrode (or an alignment line) for alignment of the light emitting elements LD.

The first electrode EL1 may receive a first alignment signal (or a first alignment voltage) to function as a first alignment electrode (or a first alignment line), the second electrode EL2 may receive a second alignment signal (or a second alignment voltage) to function as a second alignment electrode (or a second alignment line), the third electrode EL3 may receive a third alignment signal (or a third alignment voltage) to function as a third alignment electrode (or a third alignment line), and the fourth electrode EL4 may receive a fourth alignment signal (or a fourth alignment voltage) to function as a fourth alignment electrode (or a fourth alignment line).

The first to fourth alignment signals may be signals having a voltage difference and/or a phase difference to the extent that the light emitting elements LD may be aligned between the first intermediate layer CTL, the second intermediate layer CTL, the third intermediate layer CTL, and the fourth intermediate layer CTL. According to an embodiment, the first and third alignment signals among the first to fourth alignment signals may have a same voltage level, and the second and fourth alignment signals may have a same voltage level. At least some of the above-described first to fourth alignment signals may be AC signals, but the disclosure is not limited thereto.

In case that a corresponding alignment signal is applied to each of the first to fourth electrodes EL1 to EL4, an electric field may be formed between the first electrode EL1 and the second electrode EL2, between the second electrode EL2 and the third electrode EL3, between the third electrode EL3 and the fourth electrode EL4. The light emitting elements LD may be aligned and/or provided in the pixel area PXA of each pixel PXL by the electric field formed between two adjacent electrodes. For example, the light emitting elements LD may be aligned and/or provided between two adjacent intermediate layers CTL in a length L direction of each of the light emitting elements LD.

In an embodiment, in aligning the light emitting elements LD in the pixel area PXA of each pixel PX, control may be performed so that the light emitting elements LD supplied to the pixel area PXA may be aligned to be relatively biased, by controlling the alignment signal (or alignment voltage) applied to each of the first to fourth electrodes EL1 to EL4.

Each of the light emitting elements LD may be an ultra-small light emitting element, for example, having a size as small as the nanoscale to the microscale, using a material having an inorganic crystal structure. For example, each of the light emitting elements LD may be an ultra-small light emitting element manufactured by an etching method or an ultra-small light emitting element manufactured by a growth method. However, the type, size, shape, and the like of the light emitting elements LD may be variously changed. At least two to tens of light emitting elements LD may be aligned and/or provided in the emission area of each pixel PXL, but the number of light emitting elements LD is not limited thereto. According to an embodiment, the number of light emitting elements LD aligned and/or provided in the emission area of each pixel PXL may be variously changed.

Each of the light emitting elements LD may be disposed between two intermediate layers CTL adjacent in a first direction DR1 parallel to the length L direction thereof. The light emitting elements LD may include first light emitting elements LD1 disposed between the first intermediate layer CTL and the second intermediate layer CTL, second light emitting elements LD2 disposed between the second intermediate layer CTL and the third intermediate layer CTL, and third light emitting elements LD3 disposed between the third intermediate layer CTL and the fourth intermediate layer CTL. In the following embodiment, in case that one of the first to third light emitting elements LD1 to LD3 is arbitrarily referred to or in case that the first to third light emitting elements LD1 to LD3 are collectively referred to, one of the first to third light emitting elements LD1 to LD3 or the first to third light emitting elements LD1 to LD3 is referred to as a light emitting element LD or light emitting elements LD.

In an embodiment, each of the light emitting elements LD may emit one of color light and/or white light. The light emitting elements LD may be provided in a form of being sprayed into (or dispersed in) a solution and may be injected into the pixel area PXA of each pixel PXL.

In an embodiment, the light emitting elements LD may be injected into the pixel area PXA of each pixel PXL by an inkjet printing method, a slit coating method, or other various methods. For example, the light emitting elements LD may be mixed with a volatile solvent and supplied to the pixel area PXA of each pixel PXL by an inkjet printing method or a slit coating method. In this case, in case that an alignment signal (or an alignment voltage) corresponding to each of the first to fourth electrodes EL1 to EL4 positioned in the pixel area PXA of each pixel PXL is applied, an electric field may be formed between two adjacent electrodes of the first to fourth electrodes EL1 to EL4.

After the light emitting elements LD are aligned, the solvent may be evaporated or removed by other methods, and thus the light emitting elements LD may be finally aligned and/or provided in the emission area included in the pixel area PXA of each pixel PXL.

An insulating layer INS may be provided and/or formed on each of the light emitting elements LD. The insulating layer INS may be provided and/or formed on each of the light emitting elements LD to cover a portion of an upper surface of each of the light emitting elements LD and expose both ends of each of the light emitting elements LD to the outside. The insulating layer INS may be formed as an independent insulating pattern, but the disclosure is not limited thereto.

The insulating layer INS may be configured of a single layer or a multi-layer, and may include an inorganic insulating layer including at least one inorganic material or an organic insulating layer including at least one organic material. The insulating layer INS may further fix each of the light emitting elements LD. In an embodiment, the insulating layer INS may include an inorganic insulating layer that is advantageous for protecting the active layer 12 of each of the light emitting elements LD from external oxygen, moisture, and the like. However, the disclosure is not limited thereto. The insulating layer INS may include an organic insulating layer including an organic material according to a design condition or the like of the display device to which the light emitting elements LD are applied.

In an embodiment, the light emitting elements LD may be prevented from being separated from the aligned position by forming the insulating layer INS on the light emitting elements LD after the alignment of the light emitting elements LD is completed in the emission area of the pixel area PXA of each pixel PXL. In case that a gap (or a space) exists between the protective layer PSV and the light emitting elements LD before formation of the insulating layer INS, the gap may be filled with the insulating layer INS in a process of forming the insulating layer INS. Accordingly, the light emitting elements LD may be configured of an organic insulating layer advantageous for filling the gap between the protective layer PSV and the light emitting elements LD.

In an embodiment, the insulating layer INS may be formed on the light emitting elements LD to prevent the active layer 12 of each of the light emitting elements LD from contacting an external conductive material. The insulating layer INS may cover only a portion of a surface of each of the light emitting elements LD to expose both the ends of each of the light emitting elements LD to the outside.

The contact electrode CNE may be disposed on the insulating layer INS.

The contact electrode CNE may be formed of various transparent conductive materials. For example, the contact electrode CNE may include at least one of various transparent conductive materials including ITO, IZO, and ITZO, and may be implemented to be substantially transparent or translucent to satisfy a light transmittance. However, the material of the contact electrode CNE is not limited to the above-described embodiments, and according to an embodiment, the contact electrode CNE may be formed of various opaque conductive materials.

The contact electrode CNE may include a first contact electrode CNE1 disposed on the first intermediate layer CTL, a second contact electrode CNE2 disposed on a second intermediate layer CTL, a third contact electrode CNE3 disposed on the third intermediate layer CTL, and a fourth contact electrode CNE4 disposed on the fourth intermediate layer CTL.

The first contact electrode CNE1 may be directly disposed on the first intermediate layer CTL, and may be disposed on a first end EP1 of each of the first light emitting elements LD1. The first contact electrode CNE1 may be electrically connected to a part of the pixel circuit part PCL. For example, the first contact electrode CNE1 may be electrically connected to the second terminal DE of the driving transistor Tdr through the first contact hole CH1 sequentially passing through the protective layer PSV and the second interlayer insulating layer ILD2. In an embodiment, as the first contact electrode CNE1 is electrically connected to the driving transistor Tdr, a signal (or voltage) applied to the driving transistor Tdr may be transmitted to the first contact electrode CNE1. The signal transmitted to the first contact electrode CNE1 may be applied to the first end EP1 each of the first light emitting elements LD1.

The second contact electrode CNE2 may be directly disposed on the second intermediate layer CTL, and may be disposed on a second end EP2 of each of the first light emitting elements LD1. In addition, the second contact electrode CNE2 may be electrically connected to one of first and second ends EP1 and EP2 of each of the second light emitting elements LD2. In a plan view, the second contact electrode CNE2 may overlap the second end EP2 of each of the first light emitting elements LD1 and one of the first and second ends EP1 and EP2 of each of the second light emitting elements LD2.

The first contact electrode CNE1 and the second contact electrode CNE2 may be disposed to be spaced apart from each other. For example, the first contact electrode CNE1 and the second contact electrode CNE2 may be disposed on the insulating layer INS to be spaced apart from each other with a distance therebetween.

The first contact electrode CNE1 and the second contact electrode CNE2 may be disposed on a same layer, but the disclosure is not limited thereto. According to an embodiment, the first contact electrode CNE1 and the second contact electrode CNE2 may be disposed on different layers. For example, as shown in FIG. 12, the first contact electrode CNE1 may be disposed on the insulating layer INS and may be covered by an auxiliary insulating layer AUINS. In addition, the second contact electrode CNE2 may be disposed on the auxiliary insulating layer AUINS and may be covered by an encapsulation layer ENC. In this case, the auxiliary insulating layer AUINS may be an inorganic insulating layer including an inorganic material or an organic insulating layer including an organic material.

The third contact electrode CNE3 may be directly disposed on the third intermediate layer CTL and may be disposed on the other of the first and second ends EP1 and EP2 of each of the second light emitting elements LD2. In addition, the third contact electrode CNE3 may be electrically connected to one of first and second ends of each of the third light emitting elements LD3. In a plan view, the third contact electrode CNE3 may overlap (e.g., in a plan view) the other of the first and second ends EP1 and EP2 of each of the second light emitting elements LD2 and one of the first and second ends EP1 and EP2 of each of the third light emitting elements LD3.

The second contact electrode CNE2 and the third contact electrode CNE3 may be disposed to be spaced apart from each other. For example, the second contact electrode CNE2 and the third contact electrode CNE3 may be disposed on the insulating layer INS to be spaced apart from each other with a distance therebetween.

The fourth contact electrode CNE4 may be directly disposed on the fourth intermediate layer CTL, and may be electrically connected to the other of the first and second ends EP1 and EP2 of each of the third light emitting elements LD3. In addition, the fourth contact electrode CNE4 may be electrically connected to a part of the pixel circuit part PCL. For example, the fourth contact electrode CNE4 may be electrically connected to the driving voltage line DVL through the second contact hole CH2 sequentially passing through the protective layer PSV and the second interlayer insulating layer ILD2. As the fourth contact electrode CNE4 is directly electrically connected to the driving voltage line DVL, the second driving power VSS applied to the driving voltage line DVL may be transmitted to the fourth contact electrode CNE4. The second driving power VSS transmitted to the fourth contact electrode CNE4 may be applied to the other of the first and second ends EP1 and EP2 of each of the third light emitting elements LD3.

In an embodiment, after the light emitting elements LD are aligned in the emission area included in the pixel area PXA of each pixel PXL, the first to fourth contact electrodes CNE1 to CNE4 may function as a driving electrode for driving the light emitting elements LD.

In case that the driving current flows from the first power line PL1 (see FIGS. 6A to 6E) to the driving voltage line DVL by the driving transistor Tdr of the pixel circuit part PCL included in each pixel PXL, the driving current may flow into the emission unit EMU of each pixel PXL through the first contact hole CH1. For example, the driving current is supplied to the first contact electrode CNE1 through the first contact hole CH1, and the driving current flows to the second contact electrode CNE2 via the first light emitting elements LD1. Accordingly, the first light emitting elements LD1 may emit light with a luminance corresponding to a current distributed to each of the first light emitting elements LD1.

The driving current flowing through the second contact electrode CNE2 flows to the third contact electrode CNE3 via the second light emitting elements LD2. Accordingly, the second light emitting elements LD2 may emit light with a luminance corresponding to a current distributed to each of the second light emitting elements LD2.

The driving current flowing through the third contact electrode CNE3 flows to the fourth contact electrode CNE4 via the third light emitting elements LD3. Accordingly, the third light emitting elements LD3 may emit light with a luminance corresponding to a current distributed to each of the third light emitting elements LD3.

In the method described above, the driving current of each pixel PXL may flow while sequentially passing through the first light emitting elements LD1, the second light emitting elements LD2, and the third light emitting elements LD3. Accordingly, each pixel PXL may emit light with a luminance corresponding to the data signal supplied thereto during each frame period.

The encapsulation layer ENC may be provided and/or formed on the first to fourth contact electrodes CNE1 to CNE4. The encapsulation layer ENC may be an inorganic insulating layer including an inorganic material or an organic insulating layer including an organic material. For example, the encapsulation layer ENC may have a structure in which at least one inorganic insulating layer or at least one organic insulating layer is alternately stacked. The encapsulation layer ENC may entirely cover the display element part DPL to prevent water, moisture, or the like from flowing into the display element part DPL including the light emitting elements LD from the outside.

According to the above-described embodiment, the alignment signal (or alignment voltage) for aligning the light emitting elements LD may be transmitted to each of the first to fourth electrodes EL1 to EL4, and thus the light emitting elements LD may be aligned in the pixel area PXA of each pixel PXL. In an embodiment, since the first to fourth electrodes EL1 to EL4 are disposed on the second interlayer insulating layer ILD2, the first to fourth electrodes EL1 to EL4 may have a surface profile corresponding to the second interlayer insulating layer ILD2. Since the second interlayer insulating layer ILD2 has a flat surface, the first to fourth electrodes EL1 to EL4 may also have a flat surface. In this case, as described above, in case that the alignment signal (or alignment voltage) corresponding to each of the first to fourth electrodes EL1 to EL4 is applied, an electric field having a level of intensity may be formed only between two adjacent electrodes thereof. Accordingly, the light emitting elements LD may be intensively aligned between the two adjacent electrodes, and thus the alignment degree of the light emitting elements LD may be improved.

Generally, the light emitting elements LD are aligned in the pixel area PXA of each pixel PXL by forming a reflective electrode (not shown), formed of a conductive material, on the first bank pattern BNK1 and applying an alignment signal to the reflective electrode. In this case, the reflective electrode may have a surface profile corresponding to the shape of the first bank pattern BNK1, and thus the reflective electrode may have an inclined portion having an inclination and a flat portion that does not have an inclination. In this case, in case that the alignment signal is applied to the reflective electrode, electric field intensity may be relatively increased at the inclined portion of the reflective electrode, and thus the light emitting elements LD may be aligned in an unwanted area by the corresponding electric field. For example, misalignment of the light emitting elements LD may increase.

The reflective electrode may be formed by a photolithography process using a mask, control of a critical dimension (CD) between the reflective electrode including the inclined portion and another reflective electrode adjacent to the reflective electrode may be difficult due to reflow of a photoresist layer used in the photolithography process, and thus a short defect may occur.

Accordingly, in the disclosure, by aligning the light emitting elements LD by using the first to fourth electrodes EL1 to EL4 disposed on the second interlayer insulating layer ILD2, the misalignment of the light emitting elements LD may be prevented while improving the alignment degree of the light emitting elements LD by intensively aligning the light emitting elements LD in a desired area in the pixel area PXA of each pixel PXL. In addition, in the disclosure, by forming the first to fourth electrodes EL1 to EL4 on the second interlayer insulating layer ILD2 having the flat surface, a critical dimension between two adjacent electrodes may be readily controlled, and thus a short may be prevented.

In addition, according to the above-described embodiment, by aligning the light emitting elements LD in each pixel PXL by using the first to fourth electrodes EL1 to EL4, a process or the like of removing a portion of the alignment electrode (or the alignment line) to independently (or individually) drive each of the pixels PXL after aligning the light emitting elements LD, may be omitted. Finally, the manufacturing process of the display device according to the above-described embodiment may be simplified.

FIGS. 13A to 13H are schematic cross-sectional views sequentially illustrating a method of manufacturing a pixel shown in FIG. 8.

Referring to FIGS. 1A to 5 and 7 to 13A, the transistors T, the driving voltage lines DVL, and at least one insulating layer are formed on the substrate SUB. Here, the at least one insulating layer may include the buffer layer BFL, the gate insulating layer GI, the first interlayer insulating layer ILD1, and the second interlayer insulating layer ILD2 sequentially formed on the substrate SUB.

Subsequently, the first to fourth electrodes EL1 to EL4 spaced apart from each other are formed on the second interlayer insulating layer ILD2.

The first to fourth electrodes EL1 to EL4 may be commonly provided to the pixels PXL positioned in a same pixel column in the display area DA. For example, the pixels PXL positioned in the same pixel column may be commonly electrically connected to the first to fourth electrodes EL1 to EL4.

After the protective layer PSV is formed on the first to fourth electrodes EL1 to EL4, the first contact hole CH1 exposing a portion of the driving transistor Tdr and the second contact hole CH2 exposing a portion of the driving voltage line DVL are formed by simultaneously patterning the protective layer PSV and the second interlayer insulating layer ILD2 disposed thereunder.

Referring to FIGS. 1A to 5 and 7 to 13B, the first bank pattern BNK1 is formed on the protective layer PSV. On the protective layer PSV, the first bank pattern BNK1 may be spaced apart from an adjacent first bank pattern BNK1 by a distance. In a plan view, the first bank pattern BNK1 may have a bar shape extending in a direction, for example, the second direction DR2, but the disclosure is not limited thereto. The first bank pattern BNK1 may include an inorganic insulating layer formed of an inorganic material or an organic insulating layer formed of an organic material.

Referring to FIGS. 1A to 5 and 7 to 13C, the intermediate layer CTL is formed on the protective layer PSV including the first bank pattern BNK1. The intermediate layer CTL may be formed of at least 10 or more inorganic insulating layers sequentially stacked and may have a high reflectance. The intermediate layer CTL may be formed on the corresponding first bank pattern BNK1 in the emission area included in the pixel area PXA of each of the pixels PXL and may be spaced apart from each other.

Referring to FIGS. 1A to 5 and 7 to 13D, the second bank pattern BNK2 is formed in the peripheral area included in the pixel area PXA of each pixel PXL. The second bank pattern BNK2 may be a pixel defining layer defining (or partitioning) each pixel PXL and the emission area between pixels PXL adjacent to each pixel PXL.

Referring to FIGS. 1A to 5 and 7 to 13E, an electric field is formed between two adjacent electrodes by applying the alignment signal (or alignment voltage) corresponding to each of the first to fourth electrodes EL1 to EL4.

In a state in which the electric field is formed between two adjacent electrodes, a mixed solution including the light emitting elements LD is injected into the pixel area PXA of each of the pixels PXL using an inkjet printing method or the like. For example, an inkjet nozzle may be disposed on the protective layer PSV, and a solvent in which the light emitting elements LD are mixed may be injected into the pixel area PXA of each of the pixels PXL through the inkjet nozzle. Here, the solvent may be one or more of acetone, water, alcohol, and toluene, but the disclosure is not limited thereto. For example, the solvent may be in a form of an ink or paste. A method of injecting the light emitting elements LD into the pixel area PXA of each of the pixels PXL is not limited to the above-described embodiment, and the method of injecting the light emitting elements LD may be variously changed.

After the light emitting elements LD are injected into the pixel area PXA of each of the pixels PXL, the solvent may be removed.

In case that the light emitting elements LD are injected into the pixel area PXA of each of the pixels PXL, self-alignment of the light emitting elements LD may be induced due to the electric fields respectively formed between the first electrode EL1 and the second electrode EL2, between the second electrode EL2 and the third electrode EL3, and between the third electrode EL3 and the fourth electrode EL4. Accordingly, the first light emitting elements LD1 may be aligned between the first electrode EL1 and the second electrode EL2, the second light emitting elements LD2 may be aligned between the second electrode EL2 and the third electrode EL3, and the third light emitting elements LD3 may be aligned between the third electrode EL3 and the fourth electrode EL4. Each of the first to third light emitting elements LD1 to LD3 may be aligned on the protective layer PSV between two adjacent intermediate layers CTL in the pixel area PXA of each of the pixels PXL. For example, each of the first light emitting elements LD1 may be aligned on the protective layer PSV between the intermediate layer CTL on the first electrode EL1 and the intermediate layer CTL on the second electrode EL2. Each of the second light emitting elements LD2 may be aligned on the protective layer PSV between the intermediate layer CTL on the second electrode EL2 and the intermediate layer CTL on the third electrode EL3. Each of the third light emitting elements LD3 may be aligned on the protective layer PSV between the intermediate layer CTL on the third electrode EL3 and the intermediate layer CTL on the fourth electrode EL4.

Referring to FIGS. 1A to 5 and 7 to 13F, the insulating layer INS is formed on each of the first to third light emitting elements LD1 to LD3. The insulating layer INS may cover at least a portion of an upper surface of each of the first to third light emitting elements LD1 to LD3 to expose both ends of each of the light emitting elements LD to the outside.

Referring to FIGS. 1A to 5 and 7 to 13G, the first to fourth contact electrodes CNE1 to CNE4 are formed on the insulating layer INS.

The first contact electrode CNE1 may overlap the intermediate layer CTL on the first electrode EL1 and the first end EP1 of each of the first light emitting elements LD1. The first contact electrode CNE1 may be electrically connected to the driving transistor Tdr through the first contact hole CH1 sequentially passing through the protective layer PSV and the second interlayer insulating layer ILD2.

The second contact electrode CNE2 may overlap the intermediate layer CTL on the second electrode EL2, the second end EP2 of each of the first light emitting elements LD1, and one of both ends of each of the second light emitting element LD2.

The third contact electrode CNE3 may overlap the intermediate layer CTL on the third electrode EL3, the other of both ends of each of the second light emitting elements LD2, and one of both ends of each of the third light emitting elements LD3.

The fourth contact electrode CNE4 may overlap the intermediate layer CTL on the fourth electrode EL4, and the other of both the ends of each of the third light emitting elements LD3. The fourth contact electrode CNE4 may be electrically connected to the driving voltage line DVL through the second contact hole CH2 sequentially passing through the protective layer PSV and the second interlayer insulating layer ILD2.

Referring to FIGS. 1 to 5 and 7 to 13H, the encapsulation layer ENC covering the first to fourth contact electrodes CNE1 to CNE4 is formed. The encapsulation layer ENC may have a structure in which at least one inorganic layer and at least one organic layer are alternately stacked.

Figure 14:
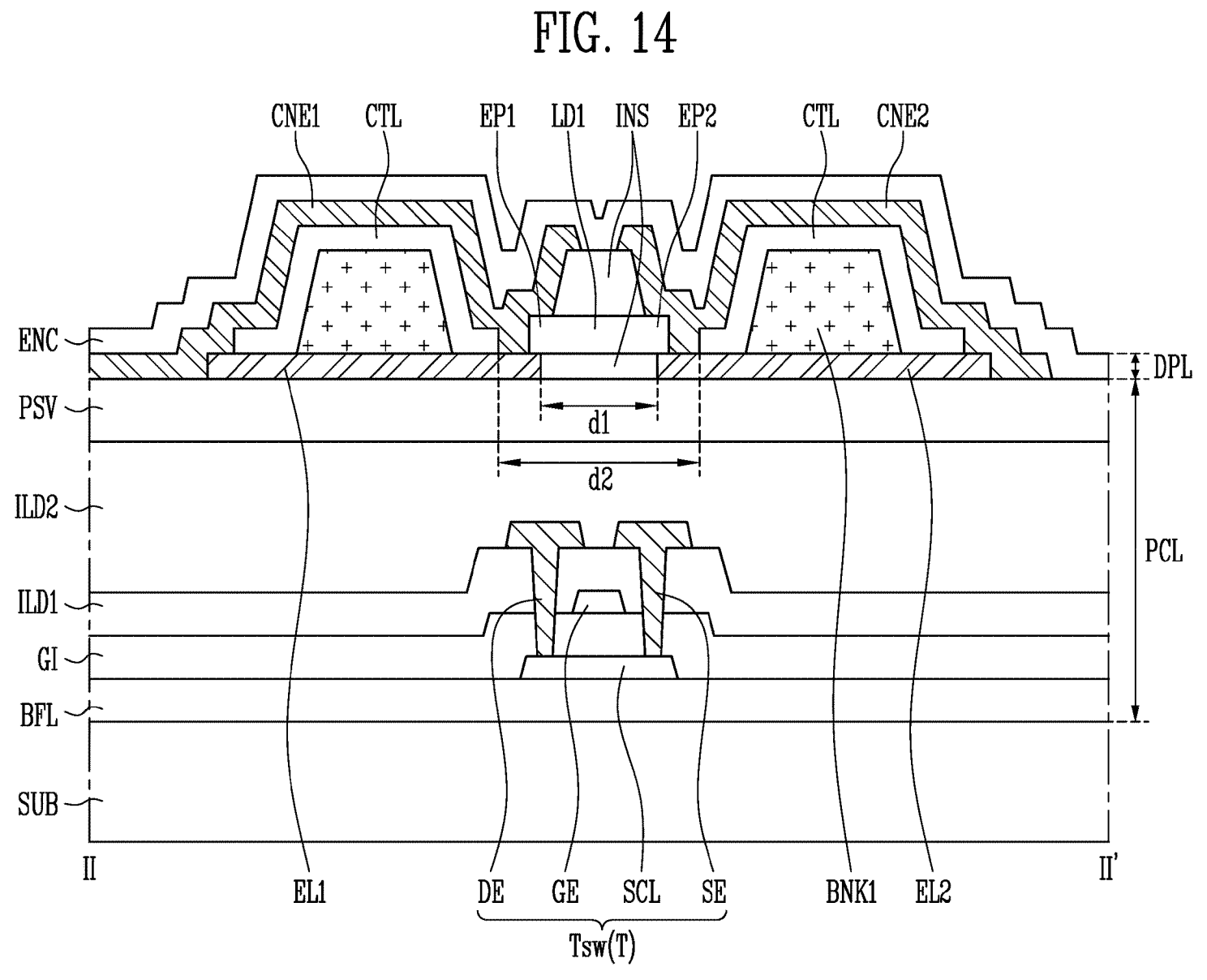
Figure 15:
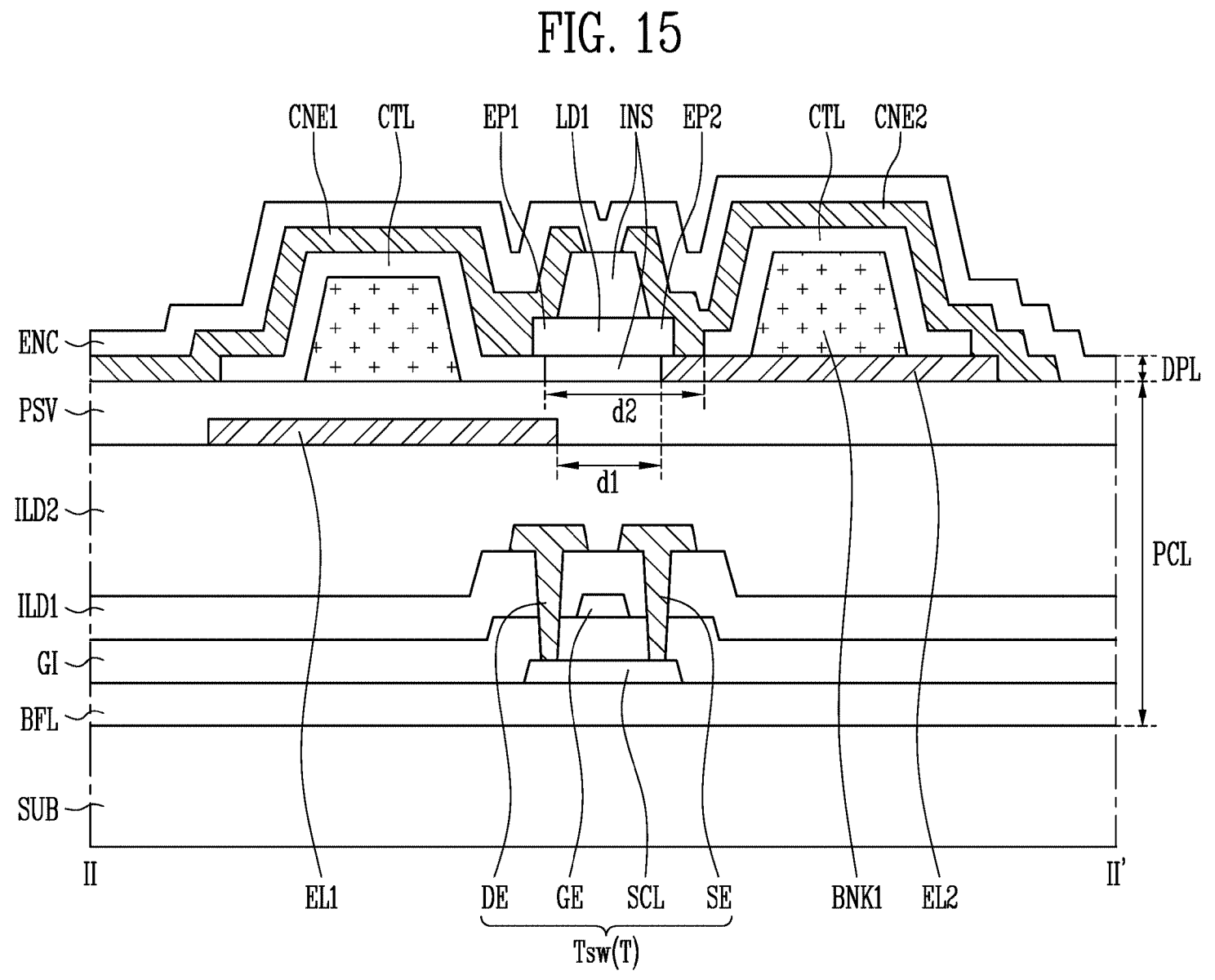

FIGS. 14 and 15 schematically illustrate a display device according to an embodiment, and are schematic cross-sectional views corresponding to line II-II' of FIG. 7.

FIGS. 14 and 15 illustrate only a first light emitting element LD1 aligned between the first electrode EL1 and the second electrode EL2, but the first light emitting element LD1 may replace each of the light emitting elements LD shown in FIG. 7.

As illustrated in FIGS. 14 and 15, in order to avoid repetitive description, differences from the above-described embodiment are mainly described. A part which is not specifically described in the disclosure follows the above-described embodiment, and the same reference numeral indicates the same component and a similar reference numeral indicates a similar component.

Referring to FIGS. 1A to 5, 7, 14, and 15, in the pixel area PXA in which a pixel PXL is provided (or arranged), the display element part DPL including at least one insulating layer disposed on the substrate SUB, at least one transistor T, the driving voltage line DVL, and the light emitting element LD may be provided. Here, the at least one insulating layer may include the buffer layer BFL, the gate insulating layer GI, the first and second interlayer insulating layers ILD1 and ILD2, and the protective layer PSV sequentially provided and/or formed on the substrate SUB.

The display element part DPL may include the intermediate layer CTL, the light emitting elements LD, the insulating layer INS, the contact electrode CNE, and the encapsulation layer ENC.

In an embodiment, the display element part DPL may be disposed on the protective layer PSV having a flat surface and may include the first and second electrodes EL1 and EL2 spaced apart from each other. The first electrode EL1 and the second electrode EL2 may be disposed on a same layer and may include a same material.

The distance d1 between the first electrode EL1 and the second electrode EL2 may be less than the length L of each of the light emitting elements LD. An alignment signal (or alignment voltage) may be applied to each of the first electrode EL1 and the second electrode EL2.

The first bank pattern BNK1 may be provided and/or formed on the first and second electrodes EL1 and EL2. Accordingly, each of the first and second electrodes EL1 and EL2 may overlap the corresponding first bank pattern BNK1.

The intermediate layer CTL may be provided and/or formed on the first bank pattern BNK1. For example, the intermediate layer CTL (hereinafter referred to as a "first layer") may be provided and/or formed on the first bank pattern BNK1 on the first electrode EL1, and the intermediate layer CTL (hereinafter referred to as a "second layer") may be provided and/or formed on the first bank pattern BNK1 on the second electrode EL2.

In an embodiment, the first intermediate layer CTL and the second intermediate layer CTL may be spaced apart from each other by a distance. The distance d2 between the first intermediate layer CTL and the second intermediate layer CTL may be greater than the distance d1 between the first electrode EL1 and the second electrode EL2 and may be greater than the length L of each of the light emitting elements LD. However, the disclosure is not limited thereto. The intermediate layer CTL may directly contact a remaining portion except for a portion of each of the first and second electrodes EL1 and EL2. For example, as shown in FIG. 14, the intermediate layer CTL may directly contact a remaining area excluding an area of each of the first and second electrodes EL1 and EL2 covered by the first bank pattern BNK1.

In an embodiment, both ends of each of the first and second electrodes EL1 and EL2 may not be covered by the intermediate layer CTL and may be exposed to the outside. In this case, in case that the alignment signal (or alignment voltage) corresponding to each of the first and second electrodes EL1 and EL2 is applied, an electric field having relatively strong intensity may be formed in a portion exposed to the outside in each of the first and second electrodes EL1 and EL2. Accordingly, the light emitting elements LD may be more intensively aligned in the portion exposed to the outside in each of the first and second electrodes EL1 and EL2, and thus the alignment degree of the light emitting elements LD may be improved.

In the above-described embodiment, the first electrode EL1 and the second electrode EL2 are disposed on a same layer, for example, the protective layer PSV, but the disclosure is not limited thereto. According to an embodiment, the first electrode EL1 and the second electrode EL2 may be disposed on different layers as shown in FIG. 15. For example, the first electrode EL1 may be disposed on the second interlayer insulating layer ILD2, and the second electrode EL2 may be disposed on the protective layer PSV. Although the first electrode EL1 and the second electrode EL2 are positioned (or provided) on different layers, each of the first and second electrodes EL1 and EL2 may have a profile corresponding to the second interlayer insulating layer ILD2 and the protective layer PSV having the flat surface. In this case, in case that the alignment signal (or alignment voltage) corresponding to each of the first and second electrodes EL1 and EL2 is applied, an electric field having a constant intensity may be formed between the first and second electrodes EL1 and EL2. Accordingly, the light emitting elements LD may be intensively aligned between the first and second electrodes EL1 and EL2, and thus the alignment degree of the light emitting elements LD in each pixel PXL may be improved.

Figure 16:
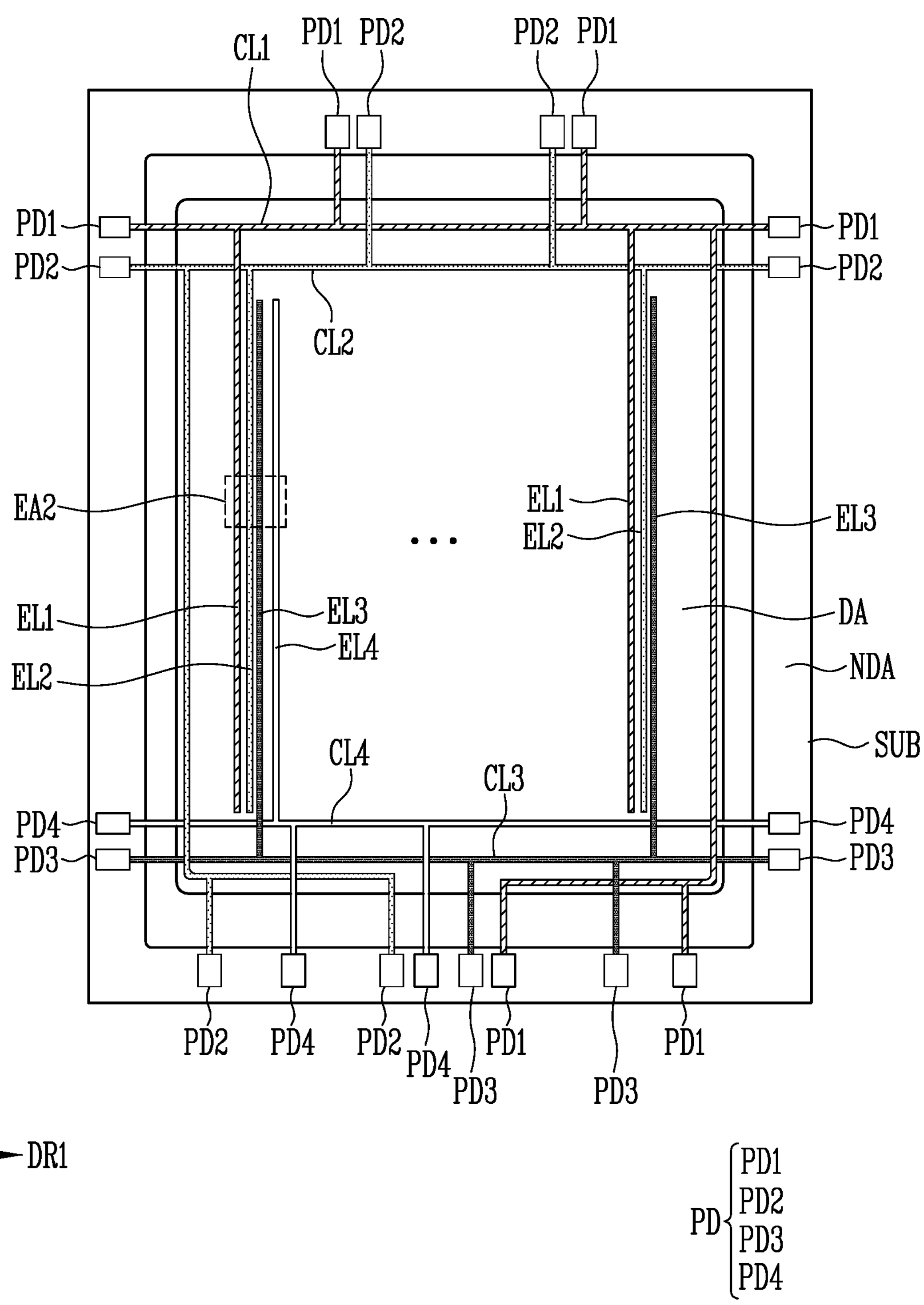
FIG. 16 is a plan view schematically illustrating only some signal lines transmitting a signal to each of the pixels in the display device shown in FIG. 5 and pads connected to the some signal lines.

FIG. 16 is a plan view schematically illustrating only some signal lines transmitting a signal to each of the pixels in the display device shown in FIG. 5 and pads electrically connected to some signal lines. For convenience of illustration, only signal lines for aligning the light emitting elements LD in each of the pixels PXL are shown in FIG. 16.

Referring to FIGS. 1A to 5 and 16, the display device may include the substrate SUB including the display area DA and the non-display area NDA. Here, since the substrate SUB may correspond to substantially the same configuration as the substrate SUB described with reference to FIG. 5, detailed description thereof is omitted.

In the display area DA, the first to fourth electrodes EL1 to EL4 for applying the alignment signal (or alignment voltage) to each pixel PXL, and first to fourth connection lines CL1 to CL4 may be provided.

Each of the first to fourth electrodes EL1 to EL4 may have a bar shape extending in a direction, for example, the second direction DR2 in the display area DA. However, the disclosure is not limited thereto, and according to an embodiment, each of the first to fourth electrodes EL1 to EL4 may have a shape extending in various directions in a range (or a limit) maintaining a state electrically insulated from an adjacent electrode.

The first to fourth connection lines CL1 to CL4 may have a bar shape extending in the first direction DR1 crossing the second direction DR2 in the display area DA, but an extension direction of the first to fourth connection lines CL1 to CL4 is not limited to the above-described embodiment.

In an embodiment, one electrode among the first to fourth electrodes EL1 to EL4 and one connection line among the first to fourth connection lines CL1 to CL4 may be integrally provided. For example, the first electrode EL1 may be integral with the first connection line CL1, the second electrode EL2 may be integral with the second connection line CL2, the third electrode EL3 may be integral with the third connection line CL3, and the fourth electrode EL4 may be integral with the fourth connection line CL4.

The first electrode EL1 and the first connection line CL1 extending in different directions and integral with each other may have a mesh shape in the display area DA. The second electrode EL2 and the second connection line CL2 extending in different directions and integral with each other may have a mesh shape in the display area DA. In addition, the third electrode EL3 and the third connection line CL3 extending in different directions and integral with each other may have a mesh shape in the display area DA. Additionally, the fourth electrode EL4 and the fourth connection line CL4 extending in different directions and integral with each other may have a mesh shape in the display area DA.

A pad part PD electrically connected to the first to fourth electrodes EL1 to EL4 and the first to fourth connection lines CL1 to CL4 may be disposed in the non-display area NDA. The pad part PD may include first to fourth pad parts PD1 to PD4.

The first pad part PD1 may be electrically connected to the first connection line CL1 and the first electrode EL1 to apply a signal (or voltage), for example, the first alignment signal (or the first alignment voltage) to the first connection line CL1 and the first electrode EL1. The second pad part PD2 may be electrically connected to the second connection line CL2 and the second electrode EL2 to apply a signal (or voltage), for example, the second alignment signal (or the second alignment voltage) to the second connection line CL2 and the second electrode EL2. The third pad part PD3 may be electrically connected to the third connection line CL3 and the third electrode EL3 to apply a signal (or voltage), for example, the third alignment signal (or the third alignment voltage) to the third connection line CL3 and the third electrode EL3. The fourth pad part PD4 may be electrically connected to the fourth connection line CL4 and the fourth electrode EL4 to apply a signal (or voltage), for example, the fourth alignment signal (or the fourth alignment voltage) to the fourth connection line CL4 and the fourth electrode EL4.

The above-described first to fourth alignment signals (or alignment voltages) may have different voltage levels, but the disclosure is not limited thereto. Some alignment signals among the first to fourth alignment signals may have a same voltage level, and the remaining alignment signals (or alignment voltages) may have different voltage levels. In addition, among the first to fourth alignment signals, the first and third alignment signals may have a same voltage level, and the second and fourth alignment signals may have a same voltage level.

As a corresponding alignment signal is applied to each of the first to fourth electrodes EL1 to EL4 from each of the first to fourth pad parts PD1 to PD4, the electric field may be formed between the first to fourth electrodes EL1 to EL4, and thus the light emitting elements LD may be aligned in the pixel area PXA of each of the pixels PXL.

After the alignment of the light emitting elements LD, the first to fourth pad parts PD1 to PD4 may apply corresponding driving power to each of the first to fourth electrodes EL1 to EL4 to drive the light emitting elements LD aligned in the pixel area PXA. For example, the first pad part PD1 may apply the first driving power VDD (see FIGS. 6A to 6E), set as a high-potential level, to the first electrode EL1, the second pad part PD2 may apply the second driving power VSS (see FIGS. 6A to 6E), set as a low-potential level, to the second electrode EL2, the third pad part PD3 may apply the first driving power VDD to the third electrode EL3, and the fourth pad part PD4 may apply the second driving power VSS to the fourth electrode EL4.

Figure 17:
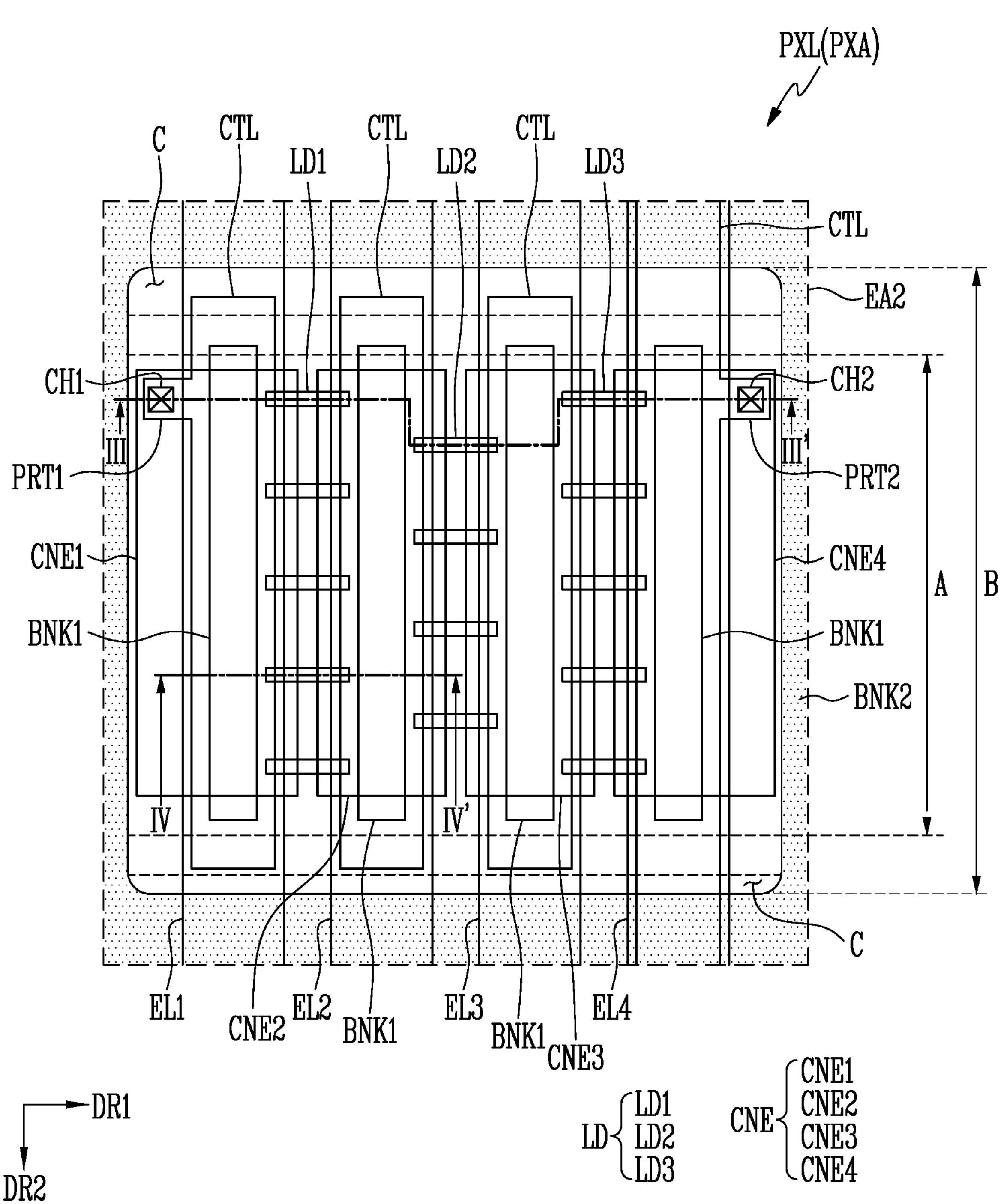
FIG. 17 is a schematic enlarged plan view of a portion EA2 of FIG. 16.
Figure 18A:
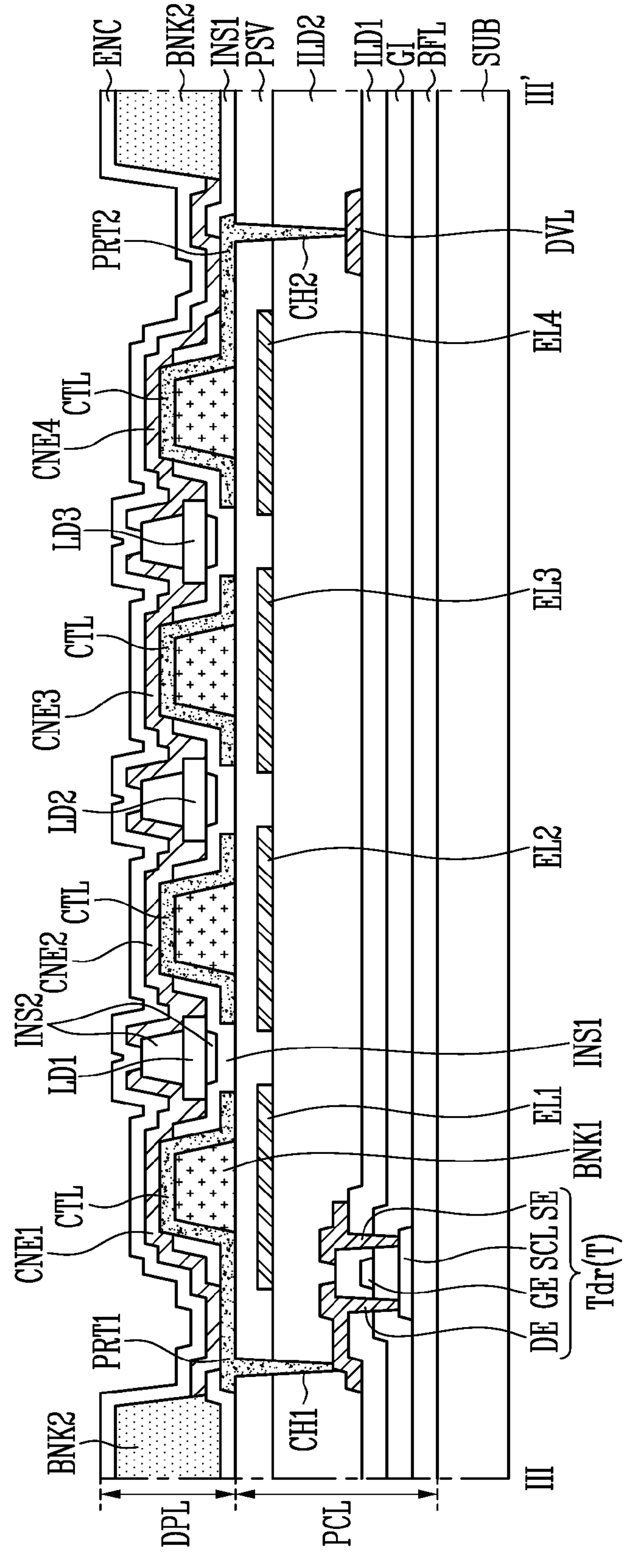
FIGS. 18A to 18C are schematic cross-sectional views taken along line III-III' of FIG. 17.
Figure 18B:
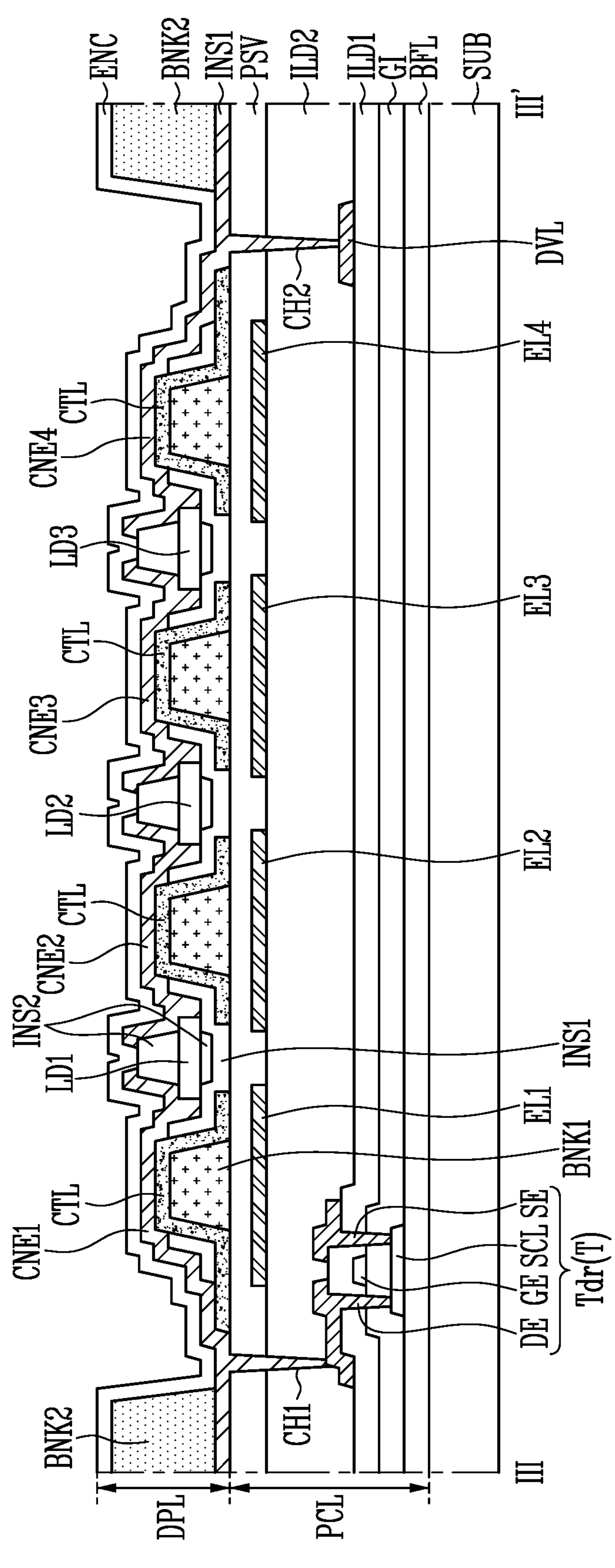
Figure 18C:
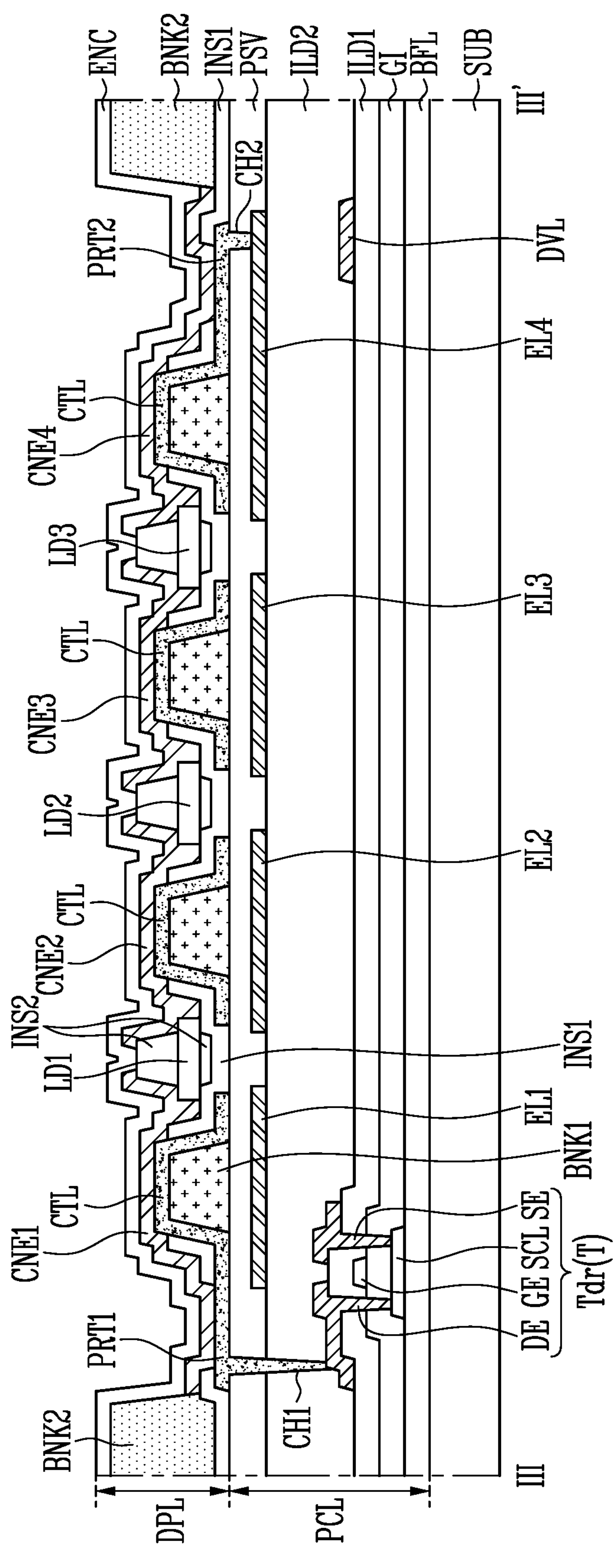
Figure 19:
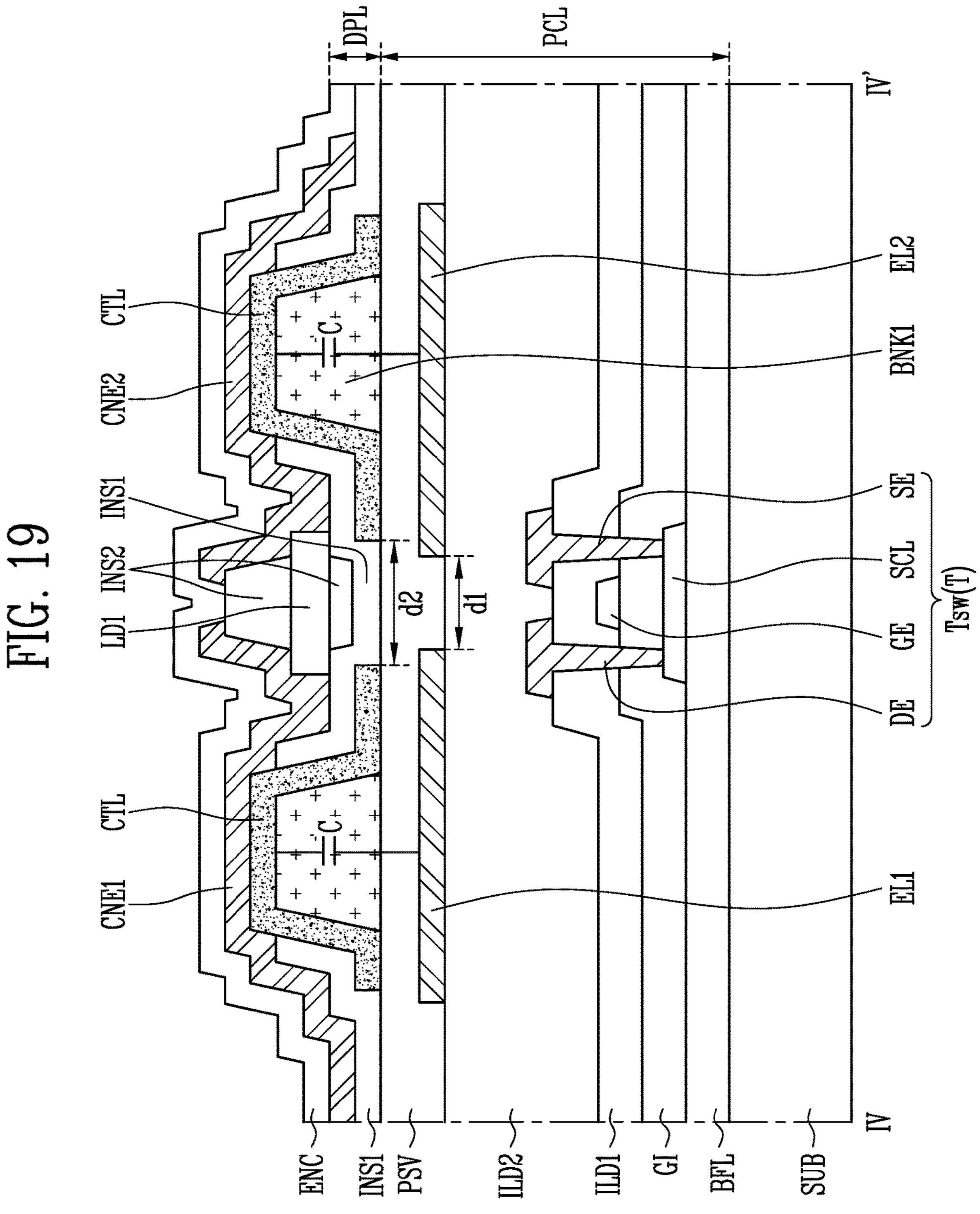
FIG. 19 is a schematic cross-sectional view taken along line IV-IV' of FIG. 17.
Figure 20:
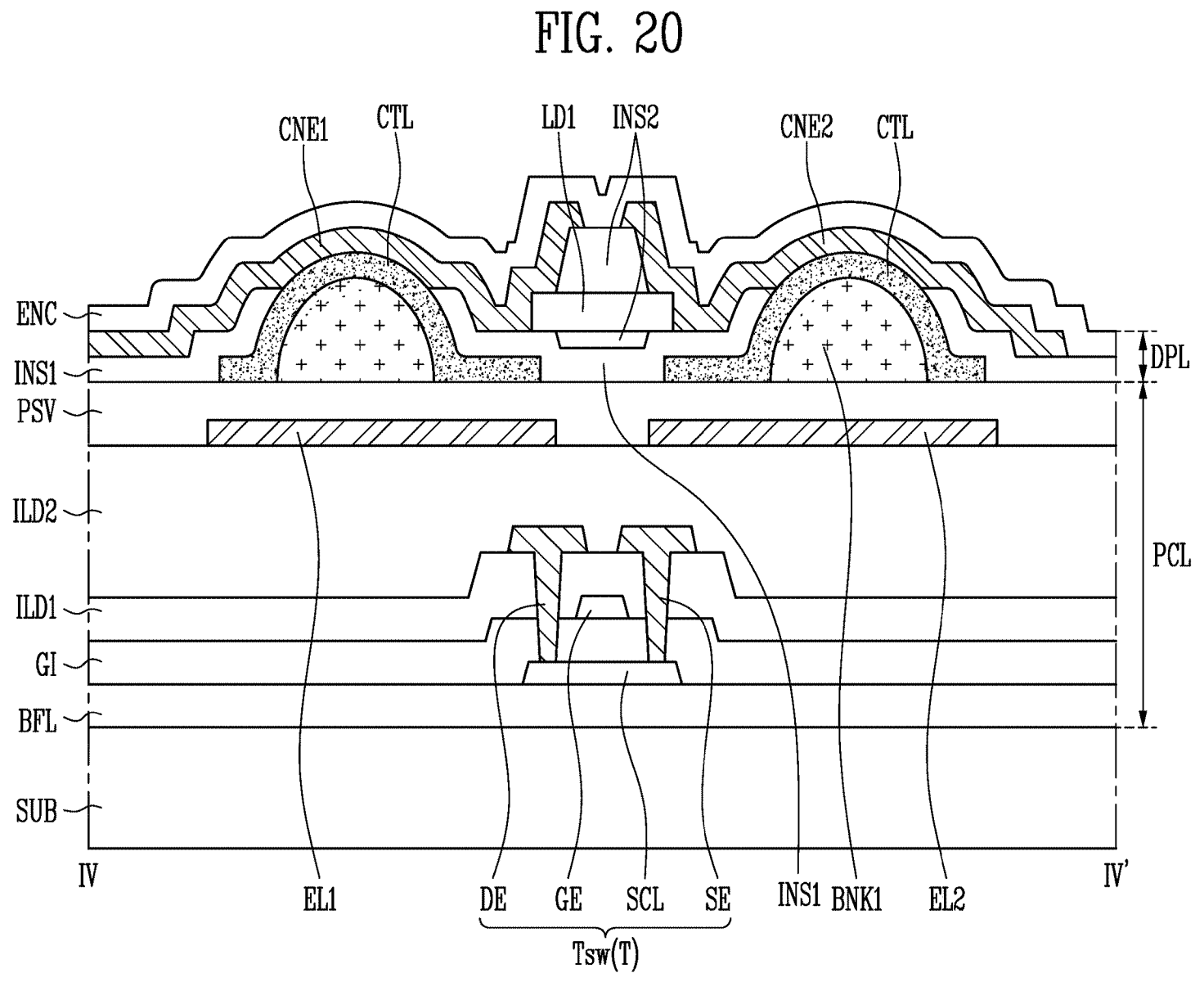
Figure 21:
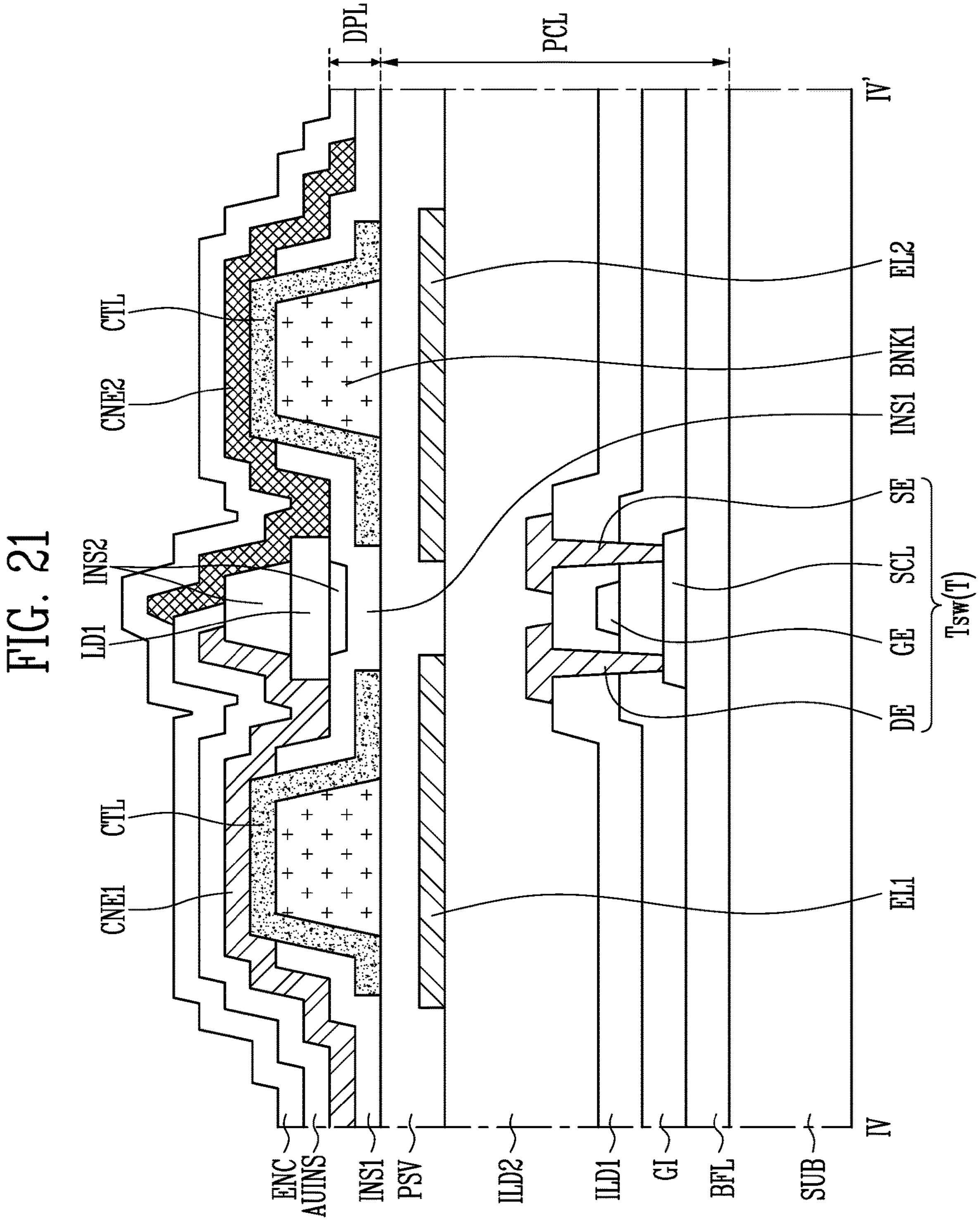
FIG. 21 is a schematic cross-sectional view corresponding to the line IV-IV' of FIG. 17 as an implementation of a display element part shown in FIG. 20 according to another embodiment.
Figure 22A:
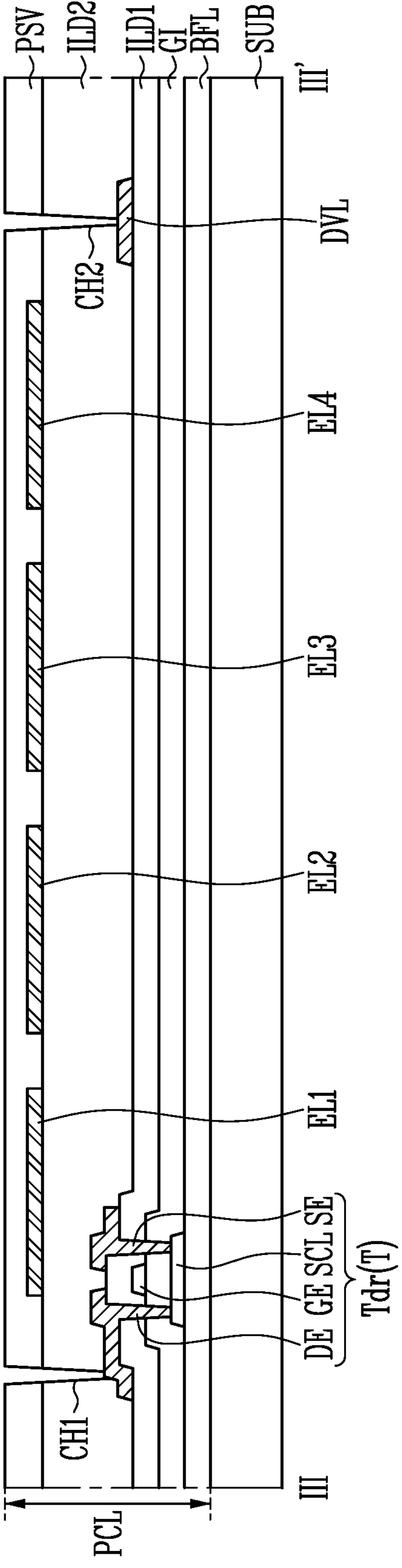
Figure 22B:
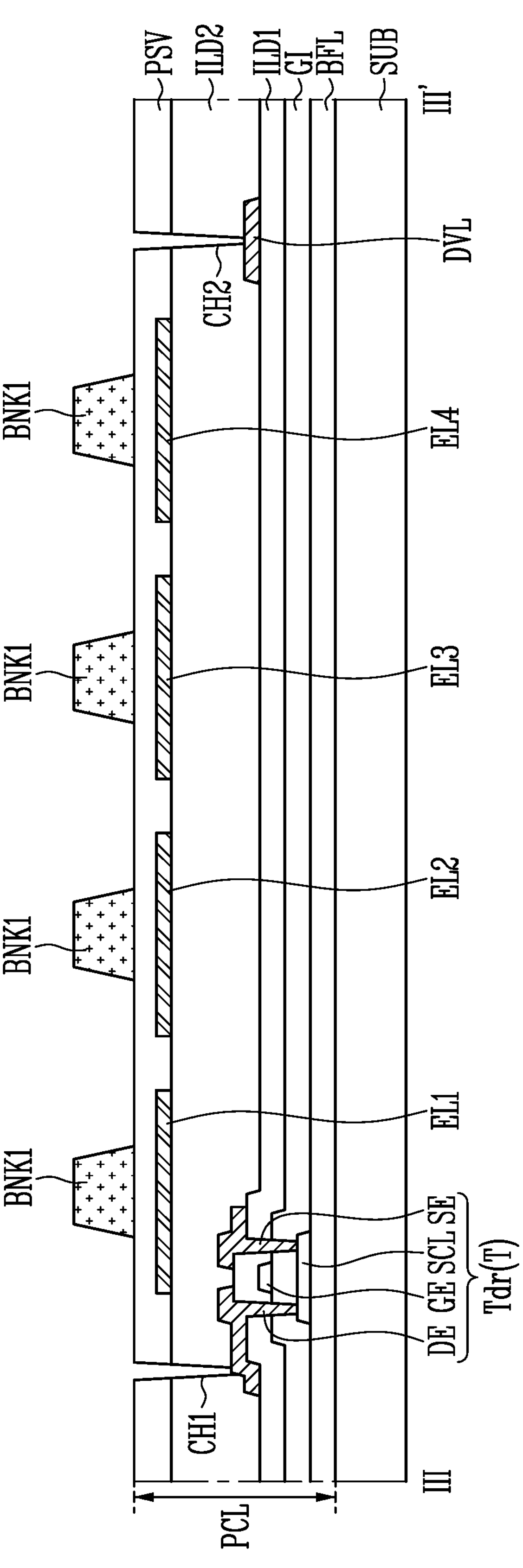
Figure 22C:
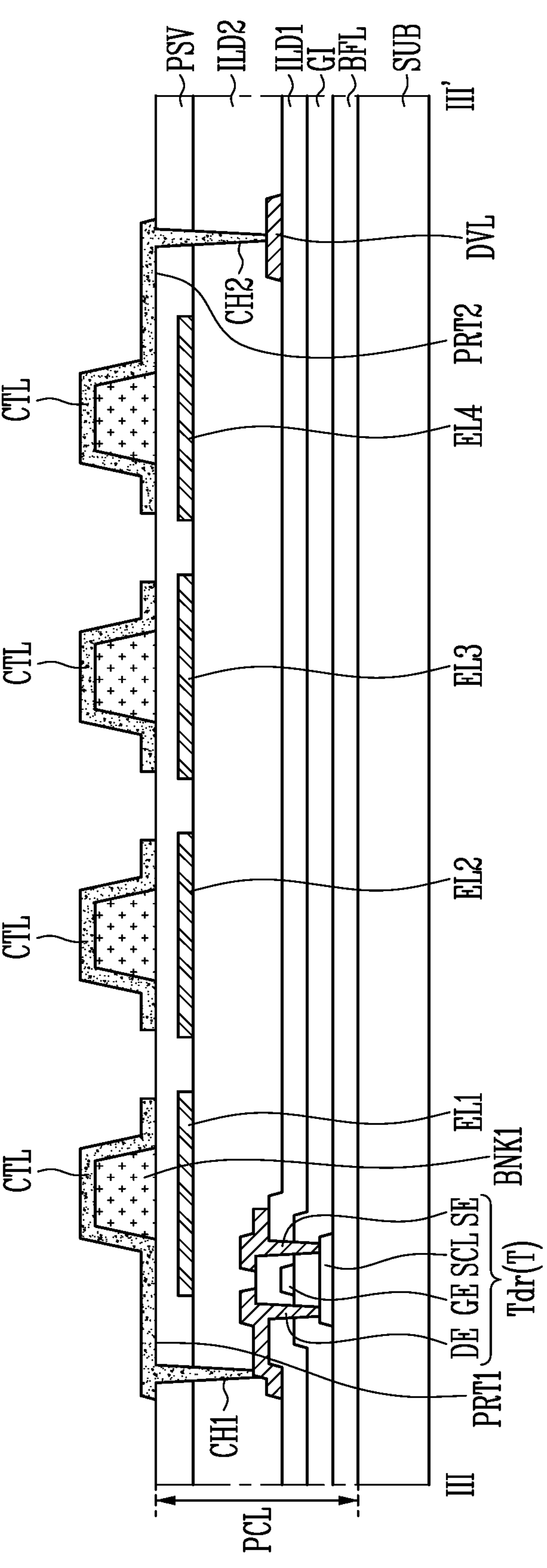
Figure 22E:
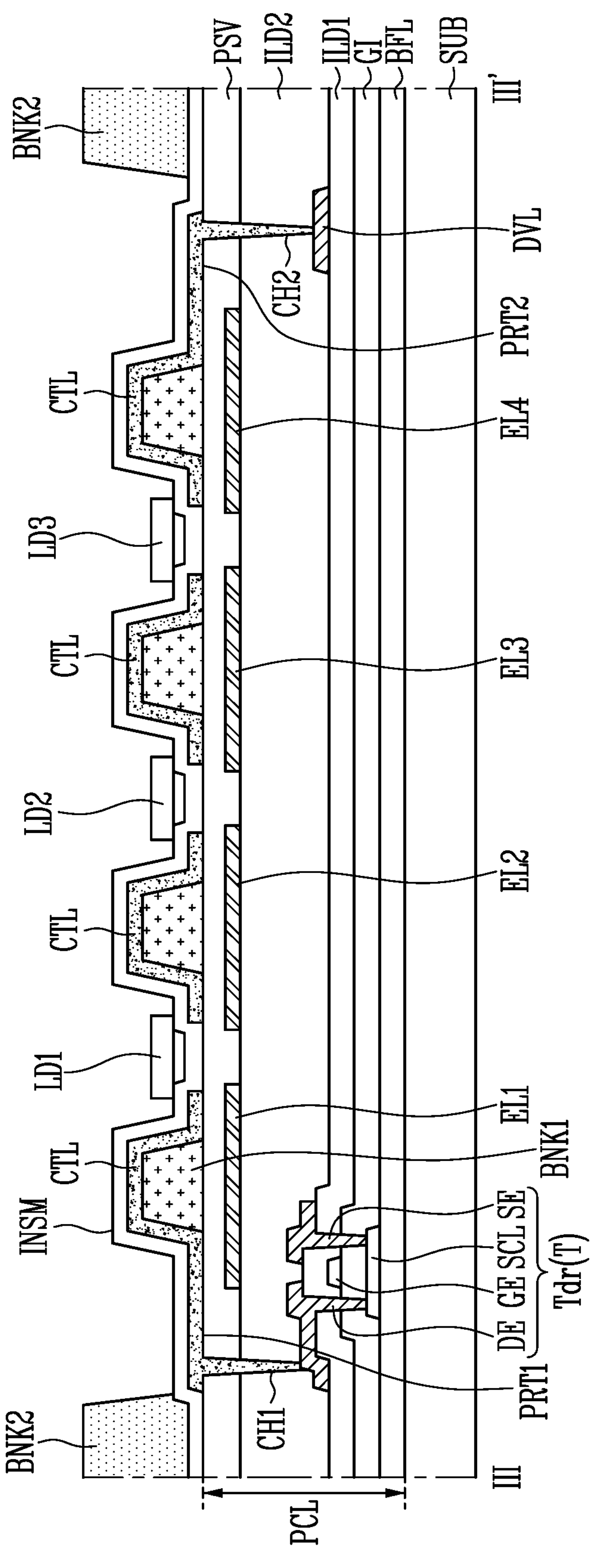
Figure 22F:
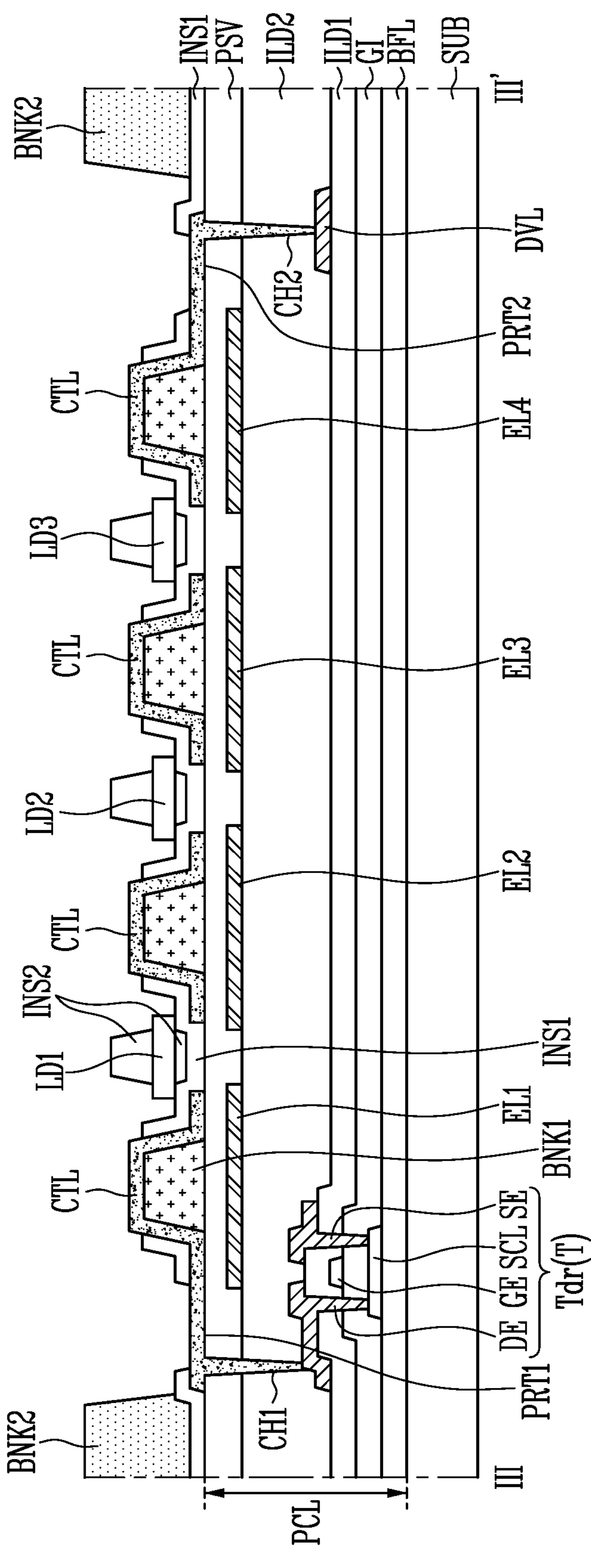
Figure 22G:
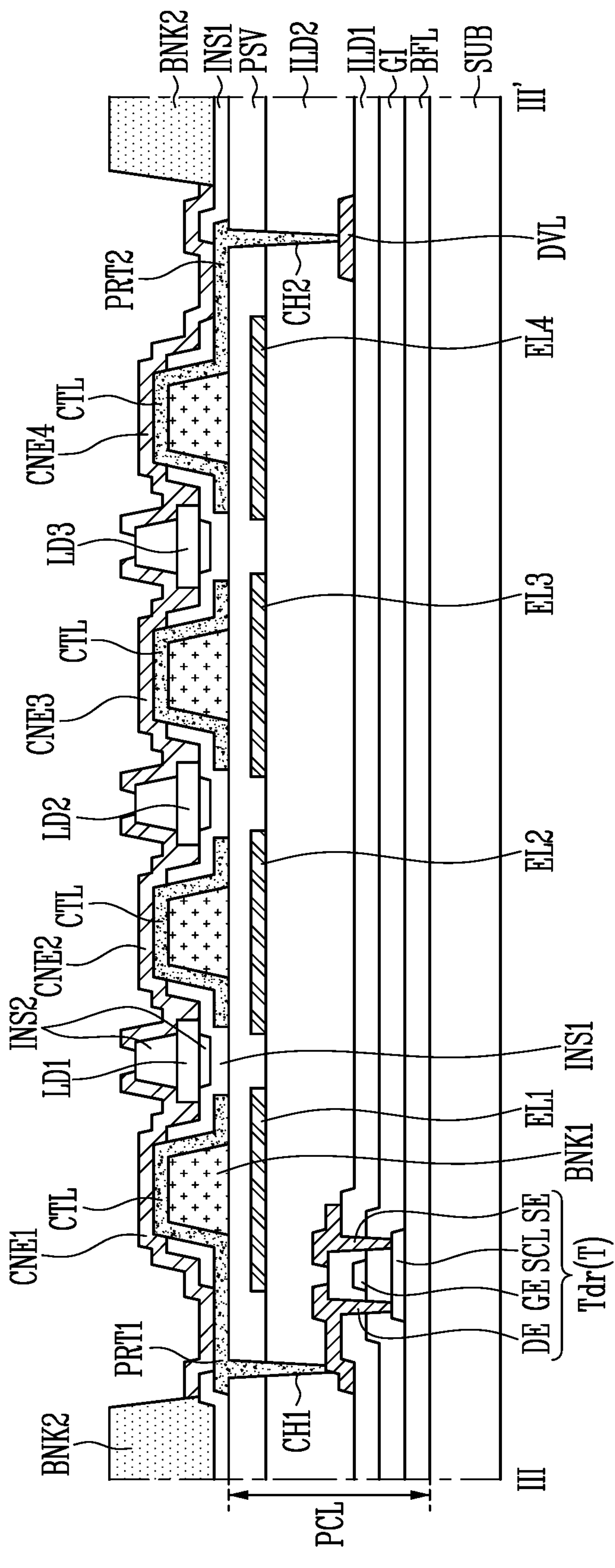
Figure 22H:
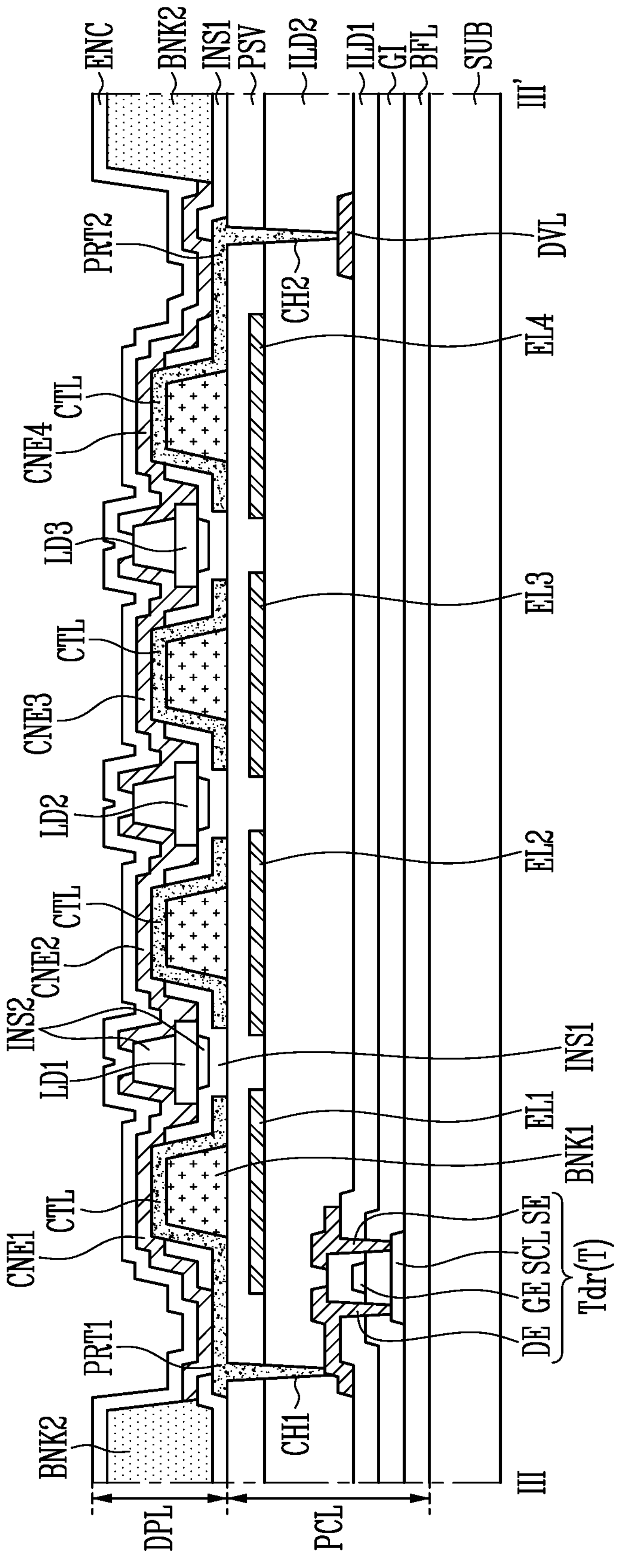

FIG. 17 is schematic enlarged plan view of portion EA2 of FIG. 16, FIGS. 18A to 18C are schematic cross-sectional views taken along line III-III' of FIG. 17, FIG. 19 is a schematic cross-sectional view taken along line IV-IV' of FIG. 17, FIG. 20 is a schematic cross-sectional view corresponding to line IV-IV' of FIG. 17 as an implementation of the first bank pattern shown in FIG. 19 according to another embodiment, and FIG. 21 is a schematic cross-sectional view corresponding to line IV-IV' of FIG. 17 as an implementation of the display element part shown in FIG. 20 according to another embodiment.

As illustrated in FIGS. 17 to 21, in order to avoid repetitive descriptions, a feature different from that of the above-described embodiment is mainly described. A feature which is not specifically described in the disclosure follows the above-described embodiment, and the same reference numeral indicates the same component and a similar reference numeral indicates a similar component.

Referring to FIGS. 1A to 6E and 17 to 21, a display device according to an embodiment may include the substrate SUB, the line part, and the pixels PXL.

Each pixel PXL may be disposed on the substrate SUB and may include the pixel circuit part PCL including the pixel circuit 144 and the display element part DPL including the light emitting elements LD.

The pixel circuit part PCL may include the buffer layer BFL, the pixel circuit 144, and the protective layer PSV.

The buffer layer BFL, the pixel circuit 144, and the protective layer PSV may be the same configuration as the buffer layer BFL, the pixel circuit 144, and the protective layer PSV described with reference to FIGS. 7 to 12, respectively.

The pixel circuit part PCL may include the first to fourth electrodes EL1 to EL4 provided and/or formed between the second interlayer insulating layer ILD2 and the protective layer PSV and spaced apart from each other. The distance d1 between two adjacent electrodes among the first to fourth electrodes EL1 to EL4 may be less than the length L of each of the light emitting elements LD. The first to fourth electrodes EL1 to EL4 may be the same configuration as the first to fourth electrodes EL1 to EL4 described with reference to FIGS. 7 to 12.

Each of the first to fourth electrodes EL1 to EL4 may function as the alignment electrode (or alignment line) for aligning the light emitting elements LD in the pixel area PXA of each of the pixels PXL. According to an embodiment, the first to fourth electrodes EL1 to EL4 may be disposed on the second interlayer insulating layer ILD2 to block an electric field induced from the transistors T included in the pixel circuit part PCL and the signal lines electrically connected to the transistors T to prevent the electric field from affecting the alignment and/or driving of the light emitting elements LD included in the display element part DPL. In addition, according to an embodiment, a vertical cap coupling (for example, a parasitic capacitor) may be formed between each of the first to fourth electrodes EL1 to EL4 and the intermediate layer CTL among configurations included in the display element part DPL to align the light emitting elements LD in a desired area.

The display element part DPL may include the first and second bank patterns BNK1 and BNK2, the intermediate layer CTL, the light emitting elements LD, and the contact electrode CNE.

The intermediate layer CTL may be provided in the pixel area PXA of each pixel PXL, and may extend in the extension direction of each of the first to fourth electrodes EL1 to EL4. The intermediate layer CTL may be provided and/or formed on the first bank pattern BNK1 to overlap each of the first to fourth electrodes EL1 to EL4 in a plan view.

In an embodiment, the intermediate layer CTL may be formed of a material (or substance) having a constant reflectance in order to allow the light emitted from each of the light emitting elements LD to progress in the image display direction of the display device. For example, the intermediate layer CTL may be formed of a conductive material (or substance) having a constant reflectance. The conductive material (or substance) may include an opaque metal advantageous for reflecting the light emitted from the light emitting elements LD in the image display direction of the display device. The opaque metal may include, for example, a metal such as Ag, Mg, Al, Pt, Pd, Au, Ni, Nd, Ir, Cr, Ti, or an alloy thereof. According to an embodiment, the intermediate layer CTL may include a transparent conductive material (or substance). The transparent conductive material may include a conductive oxide such as indium tin oxide (ITO), indium zinc oxide (IZO), zinc oxide (ZnO), and indium tin zinc oxide (ITZO), a conductive polymer such as poly(3,4-ethylenedioxythiophene) (PEDOT), and the like. In case that the intermediate layer CTL includes the transparent conductive material (or substance), a separate conductive layer formed of an opaque metal for reflecting the light emitted from the light emitting elements LD in the image display direction of the display device may be additionally included. However, the material of the intermediate layer CTL is not limited to the above-described materials.

In addition, each of the intermediate layers CTL may be provided and/or formed as a single layer, but the disclosure is not limited thereto. According to an embodiment, the intermediate layer CTL may be provided and/or formed as a multi-layer in which at least two or more materials among metals, alloys, conductive oxides, and conductive polymers are stacked. The intermediate layer CTL may be formed as multiple layers of at least two or more layers in order to minimize distortion due to signal delay in case that a signal (or voltage) is transmitted to both ends of each of the light emitting elements LD. For example, the intermediate layer CTL may be formed as a multi-layer sequentially stacked in an order of ITO/Ag/ITO.

The intermediate layer CTL (hereinafter referred to as a "first intermediate layer") overlapping the first electrode EL1 may be disposed to correspond to the first electrode EL1, the intermediate layer CTL (hereinafter referred to as a "second intermediate layer") overlapping the second electrode EL2 may be disposed to correspond to the second electrode EL2, the intermediate layer CTL (hereinafter referred to as a "third intermediate layer") overlapping the third electrode EL3 may be disposed to correspond to the third electrode EL3, and the intermediate layer CTL (hereinafter referred to as a "fourth intermediate layer") overlapping the fourth electrode EL4 may be disposed to correspond to the fourth electrode EL4. In a plan view, the first intermediate layer CTL, the first bank pattern BNK, and the first electrode EL1 may overlap each other. In a plan view, the second intermediate layer CTL, the first bank pattern BNK1, and the second electrode EL2 may overlap each other. In a plan view, the third intermediate layer CTL, the first bank pattern BNK1, and the third electrode EL3 may overlap each other. In a plan view, the fourth intermediate layer CTL, the first bank pattern BNK1, and the fourth electrode EL4 may overlap each other.

In an embodiment, after the intermediate layer CTL is disposed in the pixel area PXA of each pixel PXL, an alignment signal (or alignment voltage) may be applied to each of the first to fourth electrodes EL1 to EL4. In case that the alignment signal is applied to each of the first to fourth electrodes EL1 to EL4, each of the first to fourth electrodes EL1 to EL4 may function as the alignment electrode (or alignment line).

In an embodiment, the first intermediate layer CTL may include a first protrusion portion PRT1. The first protrusion portion PRT1 may be integral with the first intermediate layer CTL and may be branched from the first intermediate layer CTL in the first direction DR1. The first protrusion portion PRT1 may be a region of the first intermediate layer CTL. The fourth intermediate layer CTL may include a second protrusion portion PRT2. The second protrusion portion PRT2 may be integral with the fourth intermediate layer CTL, and may be branched from the fourth intermediate layer CTL in the first direction DR1. The second protrusion portion PRT2 may be a region of the fourth intermediate layer CTL.

The first protrusion portion PRT1 may be electrically connected to a component of the pixel circuit part PCL, for example, the driving transistor Tdr, through the first contact hole CH1 passing through the protective layer PSV and the second interlayer insulating layer ILD2. Accordingly, a signal (or voltage) applied to the driving transistor Tdr may be transmitted to the first intermediate layer CTL. The second protrusion portion PRT2 may be electrically connected to a part of the pixel circuit part PCL, for example, the driving voltage line DVL, through the second contact hole CH2 passing through the protective layer PSV and the second interlayer insulating layer ILD2. Accordingly, a signal (or voltage) applied to the driving voltage line DVL may be transmitted to the fourth intermediate layer CTL.

In the above-described embodiment, the fourth intermediate layer CTL is electrically connected to the driving voltage line DVL through the second contact hole CH2 passing through the protective layer PSV and the second interlayer insulating layer ILD2 and the signal (or voltage) applied to the driving voltage line DVL is transmitted to the fourth intermediate layer CTL, but the disclosure is not limited thereto. According to an embodiment, the fourth intermediate layer CTL may be electrically connected to the fourth electrode EL4 through the second contact hole CH2 passing through only the protective layer PSV as shown in FIG. 18C. In this case, a signal (or voltage), for example, the second driving power VSS may be applied to the fourth electrode EL4. In case that the fourth intermediate layer CTL is directly electrically connected to the fourth electrode EL4, a signal (or voltage) applied to the fourth electrode EL4 may be directly transmitted to the fourth intermediate layer CTL. In case that the fourth intermediate layer CTL is electrically connected to the fourth electrode EL4 through the second contact hole CH2, a signal (or voltage) different from the second driving power VSS may be applied to the driving voltage line DVL.

The light emitting elements LD may include the first light emitting elements LD1 disposed between the first intermediate layer CTL and the second intermediate layer CTL, the second light emitting elements LD2 disposed between the second intermediate layer CTL and the third intermediate layer CTL, and the third light emitting elements LD3 disposed between the third intermediate layer CTL and the fourth intermediate layer CTL.

The light emitting elements LD may be provided and/or formed on the first insulating layer INS1 in the pixel area PXA of each pixel PXL.

The first insulating layer INS1 may be formed and/or provided under each of the light emitting elements LD aligned and/or provided between two intermediate layers CTL in the pixel area PXA of each pixel PXL. The first insulating layer INS1 may fill a space between each of the light emitting elements LD and the protective layer PSV to stably support the light emitting elements LD, and may prevent separation of the light emitting elements LD from the protective layer PSV.

In addition, the first insulating layer INS1 may expose a region of the intermediate layer CTL and cover the remaining region excluding the region. For example, the first insulating layer INS1 may expose each of a region of the first intermediate layer CTL, a region of the second intermediate layer CTL, a region of the third intermediate layer CTL, and a region of the fourth intermediate layer CTL, and may cover each of the remaining region of the first intermediate layer CTL, the remaining area of the second intermediate layer CTL, the remaining region of the third intermediate layer CTL, and the remaining region of the fourth intermediate layer CTL.

The first insulating layer INS1 may include an inorganic insulating layer formed of an inorganic material or an organic insulating layer formed of an organic material. In an embodiment, the first insulating layer INS1 may be formed of an inorganic insulating layer advantageous for protecting the light emitting elements LD from the pixel circuit part PCL of each pixel PXL, but the disclosure is not limited thereto. According to an embodiment, the first insulating layer INS1 may be formed as an organic insulating layer advantageous for planarizing a support surface of the light emitting elements LD.

The second insulating layer INS2 may be provided and/or formed on each of the light emitting elements LD. The second insulating layer INS2 may be provided and/or formed on each of the light emitting elements LD to cover a portion of an upper surface of each of the light emitting elements LD and expose both ends of each of the light emitting elements LD to the outside. The second insulating layer INS2 may be formed as an independent insulating pattern in the pixel area PXA of each pixel PXL, but the disclosure is not limited thereto. The second insulating layer INS2 may be the same configuration as the insulating layer INS described with reference to FIGS. 7 to 12.

The contact electrode CNE may be provided and/or formed on the second insulating layer INS2. The contact electrode CNE may include the first contact electrode CNE1 disposed on the first intermediate layer CTL, the second contact electrode CNE2 disposed on the second intermediate layer CTL, the third contact electrode CNE3 disposed on the third intermediate layer CTL, and the fourth contact electrode CNE4 disposed on the fourth intermediate layer CTL.

The first contact electrode CNE1 may be directly disposed on an exposed region of the first intermediate layer CTL to be electrically connected to the first intermediate layer CTL. In addition, the first contact electrode CNE1 may be disposed on a first end of each of the first light emitting elements LD1 to be electrically connected to the first end. Accordingly, a signal (or voltage) applied to the first intermediate layer CTL may be transmitted to the first end of each of the first light emitting elements LD1 through the first contact electrode CNE1. In a plan view, the first contact electrode CNE1 may overlap the first intermediate layer CTL and the first end of each of the first light emitting elements LD1.

In the above-described embodiment, the first contact electrode CNE1 is indirectly electrically connected to the driving transistor Tdr of the pixel circuit part PCL through the first intermediate layer CTL, but the disclosure is not limited thereto. According to an embodiment, the first contact electrode CNE1 may be directly electrically connected to the driving transistor Tdr through the first contact hole CH1 sequentially passing through the protective layer PSV and the second interlayer insulating layer ILD2, as shown in FIG. 18B. In this case, a signal (or voltage) applied to the driving transistor Tdr may be transmitted to the first end of each of the first light emitting elements LD1 through the first contact electrode CNE1.

The second contact electrode CNE2 may be directly disposed on an exposed region of the second intermediate layer CTL to be electrically connected to the second intermediate layer CTL. In addition, the second contact electrode CNE2 may be disposed on the second end of each of the first light emitting elements LD1 to be electrically connected to the second end. Additionally, the second contact electrode CNE2 may be disposed on the second end of each of the second light emitting elements LD2 to be electrically connected to the second end. In a plan view, the second contact electrode CNE2 may overlap the second end of each of the first light emitting elements LD1 and the first end of each of the second light emitting elements LD2.

The first contact electrode CNE1 and the second contact electrode CNE2 may be disposed on the second insulating layer INS2 to be spaced apart from each other with a distance therebetween.

The first contact electrode CNE1 and the second contact electrode CNE2 may be disposed on a same layer, but the disclosure is not limited thereto. According to an embodiment, the first contact electrode CNE1 and the second contact electrode CNE2 may be disposed on different layers. For example, as shown in FIG. 21, the first contact electrode CNE1 may be disposed on the second insulating layer INS2 and may be covered by the auxiliary insulating layer AUINS. In addition, the second contact electrode CNE2 may be disposed on the auxiliary insulating layer AUINS and may be covered by the encapsulation layer ENC. The auxiliary insulating layer AUINS may be an inorganic insulating layer including an inorganic material or an organic insulating layer including an organic material.

The third contact electrode CNE3 may be directly disposed on an exposed region of the third intermediate layer CTL to be electrically connected to the third intermediate layer CTL. In addition, the third contact electrode CNE3 may be disposed on the second end of each of the second light emitting elements LD2 to be electrically connected to the second end. Additionally, the third contact electrode CNE3 may be disposed on the first end of each of the third light emitting elements LD3 to be electrically connected to the first end. In a plan view, the third contact electrode CNE3 may overlap the second end of each of the second light emitting elements LD2 and the first end of each of the third light emitting elements LD3.

The fourth contact electrode CNE4 may be directly disposed on an exposed region of the fourth intermediate layer CTL and may be electrically connected to the fourth intermediate layer CTL. In addition, the fourth contact electrode CNE4 may be disposed on the second end of each of the third light emitting elements LD3 to be electrically connected to the second end. Accordingly, the second driving power VSS applied to the fourth intermediate layer CTL may be transmitted to the second end of each of the third light emitting elements LD3 through the fourth contact electrode CNE4. In a plan view, the fourth contact electrode CNE4 may overlap the fourth intermediate layer CTL and the second end of each of the third light emitting elements LD3.

In the above-described embodiment, the fourth contact electrode CNE4 is indirectly electrically connected to the driving voltage line DVL of the pixel circuit part PCL through the fourth intermediate layer CTL, but the disclosure is not limited thereto. According to an embodiment, the fourth contact electrode CNE4 may be directly electrically connected to the driving voltage line DVL through the second contact hole CH2 sequentially passing through the protective layer PSV and the second interlayer insulating layer ILD2 as shown in FIG. 18B. In this case, a signal (or voltage) applied to the driving voltage line DVL may be transmitted to the second end of each of the third light emitting elements LD3 through the fourth contact electrode CNE4.

In an embodiment, after the light emitting elements LD are aligned in the pixel area PXA of each pixel PXL, the first to fourth contact electrodes CNE1 to CNE4 and the intermediate layer CTL corresponding thereto may function as a driving electrode for driving the light emitting elements LD.

In case that the driving current flows from the first power line PL1 to the driving voltage line DVL by the driving transistor Tdr of the pixel circuit part PCL included in each pixel PXL, the driving current may flow into the emission unit EMU of each pixel PXL through the first contact hole CH1. For example, the driving current is supplied to the first contact electrode CNE1 through the first contact hole CH1 and the first intermediate layer CTL, and the driving current flows to the second contact electrode CNE2 via the first light emitting elements LD1. Accordingly, the first light emitting elements LD1 may emit light with a luminance corresponding to a current distributed to each of the first light emitting elements LD1.

The driving current flowing through the second contact electrode CNE2 flows to the third contact electrode CNE3 via the second light emitting elements LD2. Accordingly, the second light emitting elements LD2 may emit light with a luminance corresponding to a current distributed to each of the second light emitting elements LD2.

The driving current flowing through the third contact electrode CNE3 flows to the fourth contact electrode CNE4 via the third light emitting elements LD3. Accordingly, the third light emitting elements LD3 may emit light with a luminance corresponding to a current distributed to each of the third light emitting elements LD3.

In the method described above, the driving current of each pixel PXL may flow while sequentially passing through the first light emitting elements LD1, the second light emitting elements LD2, and the third light emitting elements LD3. Accordingly, each pixel PXL may emit light with a luminance corresponding to the data signal supplied during each frame period.

The encapsulation layer ENC may be provided and/or formed on the first to fourth contact electrodes CNE1 to CNE4. The encapsulation layer ENC may be the same configuration as the encapsulation layer ENC described with reference to FIGS. 7 to 12.

In the existing display device in which a component included in the display element part DPL functions as an alignment electrode (or an alignment line) for aligning the light emitting elements LD and a driving electrode for driving the light emitting elements LD, a process of removing a portion of the alignment electrode (or the alignment line) may be performed to independently (or individually) drive each of the pixels PXL after the light emitting elements LD are aligned. In this case, in the pixel area PXA of each pixel PXL, the second bank pattern BNK2 surrounding an area in which the light emitting elements LD are disposed (or positioned in the peripheral area of the pixel area PXA) may include a groove portion exposing region C in which a portion of the alignment electrode (or the alignment line) is removed. In this case, the light emitting elements LD may be aligned in a first area A of the pixel area PXA of each pixel PXL.

According to an embodiment, since the intermediate layer CTL, which is a driving electrode for driving the light emitting elements LD, is formed only in the pixel area PXA of each pixel PXL, the second bank pattern BNK2 may not include the above-described groove. In this case, the area occupied by the second bank pattern BNK2 in the pixel area PXA of each pixel PXL may be reduced, and the light emitting elements LD may be aligned in a second area B of the pixel area PXA. Accordingly, in an embodiment, the alignment area of the light emitting elements LD in the pixel area PXA of each pixel PXL may be further secured compared to the existing display device.

According to the above-described embodiment, as the light emitting elements LD are aligned in each pixel PXL using the first to fourth electrodes EL1 to EL4, a process or the like removing a portion of the alignment electrode (or the alignment line) in order to independently (or individually) drive each of the pixels PXL after aligning the light emitting elements LD may be omitted. Finally, the manufacturing process of the display device according to the above-described embodiment may be simplified.

In addition, according to the above-described embodiment, the alignment signal (or the alignment voltage) for the alignment of the light emitting elements LD may be transmitted to each of the first to fourth electrodes EL1 to EL4, and thus the light emitting elements LD may be aligned in the pixel area PXA. In case that a corresponding alignment signal (or alignment voltage) is applied to each of the first to fourth electrodes EL1 to EL4, an electric field may be formed between two adjacent electrodes among the first to fourth electrodes EL1 to EL4. In this case, a cap coupling, for example, a vertical cap coupling (a parasitic capacitor c), may be formed between each of the first to fourth electrodes EL1 to EL4 and the intermediate layer CTL disposed thereon to correspond thereto. For example, the vertical cap coupling may be formed between the first electrode EL1 and the first intermediate layer CTL, the vertical cap coupling may be formed between the second electrode EL2 and the second intermediate layer CTL, the vertical cap coupling may be formed between the third electrode EL3 and the third intermediate layer CTL, and the vertical cap coupling may be formed between the fourth electrode EL4 and the fourth intermediate layer CTL.

A capacitance may increase by the vertical cap coupling formed between each of the first to fourth electrodes EL1 to EL4 and the intermediate layer CTL disposed thereon to correspond thereto, and the capacitance may affect the electric field formed between the two adjacent electrodes. For example, the electric field may be concentrated between the two adjacent electrodes by the vertical cap coupling formed between each of the first to fourth electrodes EL1 to EL4 and the intermediate layer CTL disposed thereon to correspond thereto. Accordingly, the light emitting elements LD may be intensively aligned between the two adjacent electrodes, and thus the alignment degree of the light emitting elements LD in each pixel PXL may be improved.

FIGS. 22A to 22H are schematic cross-sectional views sequentially illustrating a method of manufacturing a pixel shown in FIG. 18A.

Referring to FIGS. 1A to 5 and 16 to 22A, the transistors T, the driving voltage lines DVL, and at least one insulating layer are formed on the substrate SUB.

The first to fourth electrodes EL1 to EL4 spaced apart from each other are formed on the second interlayer insulating layer ILD2 among at least one insulating layer.

After forming the protective layer PSV on the first to fourth electrodes EL1 to EL4, the first contact hole CH1 exposing a portion of the driving transistor Tdr and the second contact hole CH2 exposing a portion of the driving voltage line DVL are formed.

Referring to FIGS. 1A to 5 and 16 to 22B, the first bank pattern BNK1 is formed on the protective layer PSV.

Referring to FIGS. 1A to 5 and 16 to 22C, the intermediate layer CTL including a conductive material (or substance) having high reflectance is formed on the protective layer PSV including the first bank pattern BNK1.

The intermediate layer CTL may be formed on the first bank pattern BNK1 on the first to fourth electrodes EL1 to EL4.

The intermediate layer CTL formed on the first bank pattern BNK1 on the first electrode EL1 may be electrically connected to the driving transistor Tdr through the first contact hole CH1. The intermediate layer CTL formed on the first bank pattern BNK1 on the fourth electrode EL4 may be electrically connected to the driving voltage line DVL through the second contact hole CH2.

The intermediate layer CTL on the first to fourth electrodes EL1 to EL4 may be formed to be disposed only in the pixel area PXA of each of the pixels PXL. For example, the intermediate layer CTL on the first electrode EL1, the intermediate layer CTL on the second electrode EL2, and the intermediate layer CTL on the third electrode EL3 provided in a pixel PXL may not be electrically connected to and may be separated from the intermediate layer CTL on the first electrode EL1, the intermediate layer CTL on the second electrode EL2, and the intermediate layer CTL on the third electrode EL3 provided to each of adjacent pixels PXL disposed in the same column as the pixel PXL.

The intermediate layer CTL on the fourth electrode EL4 electrically connected to the driving voltage line DVL may be commonly provided to the pixels PXL positioned in the same pixel column. For example, the intermediate layer CTL on the fourth electrode EL4 provided in a pixel PXL may be commonly provided to adjacent pixels PXL disposed in the same pixel column as the pixel PXL. For example, the pixels PXL disposed in the same pixel column may be electrically connected to the intermediate layer CTL on the fourth electrode EL. However, the disclosure is not limited thereto, and according to an embodiment, the intermediate layer CTL on the fourth electrode EL4 may be formed to be disposed only in the pixel area PXA of each pixel PXL.

Referring to FIGS. 1A to 5 and 16 to 22D, an insulating material layer INSM is formed on the protective layer PSV including the intermediate layer CTL. The insulating material layer INSM may include an inorganic insulating layer formed of an inorganic material or an organic insulating layer formed of an organic material.

Subsequently, the second bank pattern BNK2 is formed in the pixel area of each pixel PXL. The second bank pattern BNK2 may be formed on the insulating material layer INSM.

Referring to FIGS. 1A to 5 and 16 to 22E, in a state in which an electric field is formed between two adjacent electrodes by applying the alignment signal (or the alignment voltage) corresponding to each of the first to fourth electrodes EL1 to EL4, a mixed solution (or solvent) including the light emitting elements LD is injected into the pixel area PXA of each of the pixels PXL using an inkjet printing method or the like. After the light emitting elements LD are injected, the solvent may be removed.

The light emitting elements LD may be aligned between the two adjacent electrodes. The light emitting elements LD may be aligned on the insulating material layer INSM between the two adjacent intermediate layers CTL in the pixel area PXA of each of the pixels PXL. For example, each of the first light emitting elements LD1 among the light emitting elements LD may be aligned on the insulating material layer INSM between the intermediate layer CTL on the first electrode EL1 and the intermediate layer CTL on the second electrode EL2. Each of the second light emitting elements LD2 among the light emitting elements LD may be aligned on the insulating material layer INSM between the intermediate layer CTL on the second electrode EL2 and the intermediate layer CTL on the third electrode EL3. Each of the third light emitting elements LD3 among the light emitting elements LD may be aligned on the insulating material layer INSM between the intermediate layer CTL on the third electrode EL3 and the intermediate layer CTL on the fourth electrode EL4.

Referring to FIGS. 1A to 5 and 16 to 22F, after aligning the light emitting elements LD in the pixel area PXA of each pixel PXL, the second insulating layer INS2 is formed on each of the light emitting elements LD. The second insulating layer INS2 may cover at least a portion of the upper surface of each of the light emitting elements LD to expose both ends thereof except for the active layer 12 of each of the light emitting elements LD to the outside.

The first insulating layer INS1 may be formed by etching the insulating material layer INSM to expose a portion of the intermediate layer CTL by a process of forming the second insulating layer INS2 or an etching process performed before and after the process.

Referring to FIGS. 1A to 5 and 16 to 22G, the first to fourth contact electrodes CNE1 to CNE4 are formed on the second insulating layer INS2.

Referring to FIGS. 1A to 5 and 16 to 22H, the encapsulation layer ENC covering the first to fourth contact electrodes CNE1 to CNE4 is formed.

Figure 23:
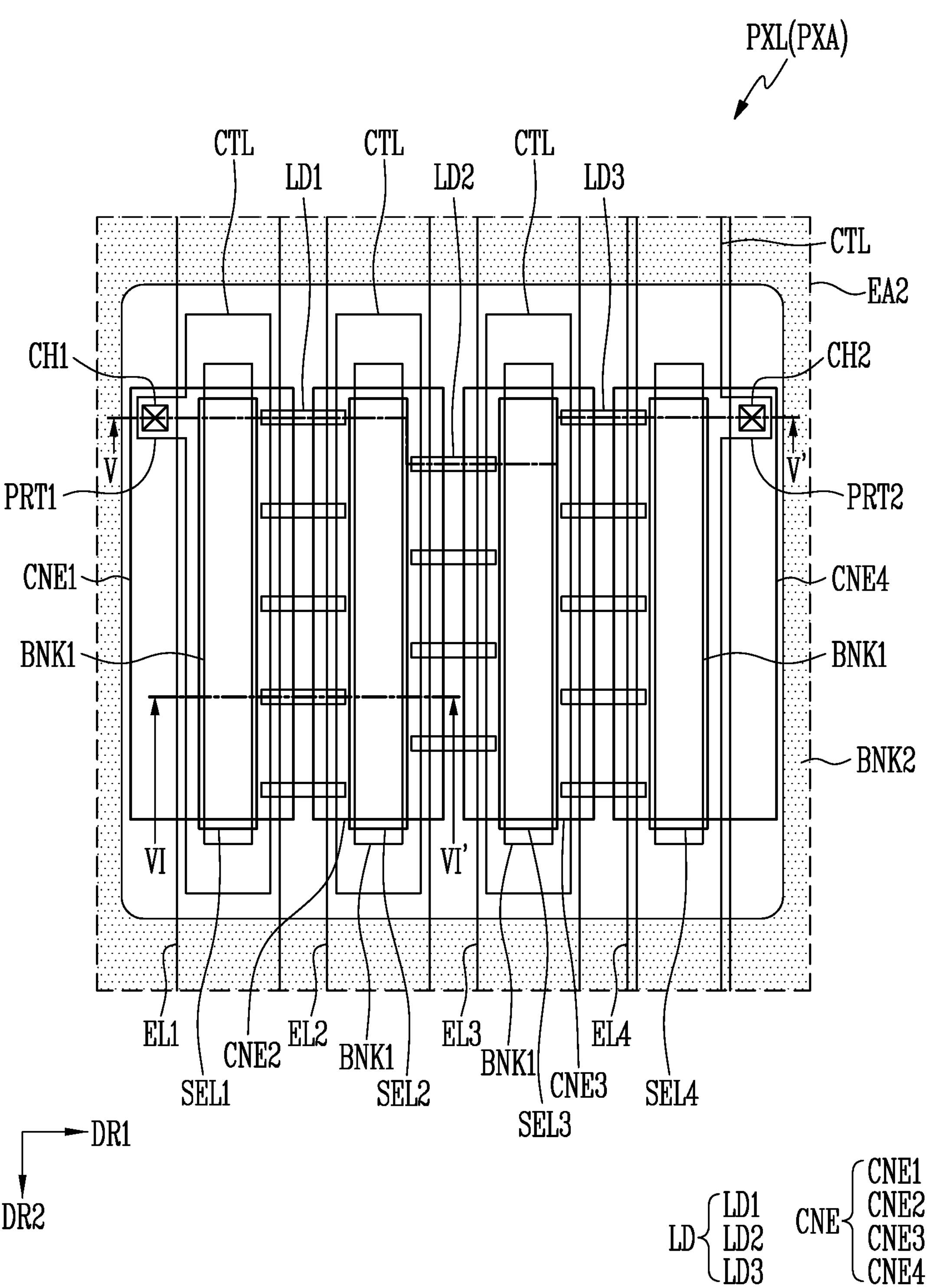
FIG. 23 schematically illustrates a display device according to an embodiment of the disclosure, and is a plan view corresponding to the portion EA2 of FIG. 16.
Figure 24:
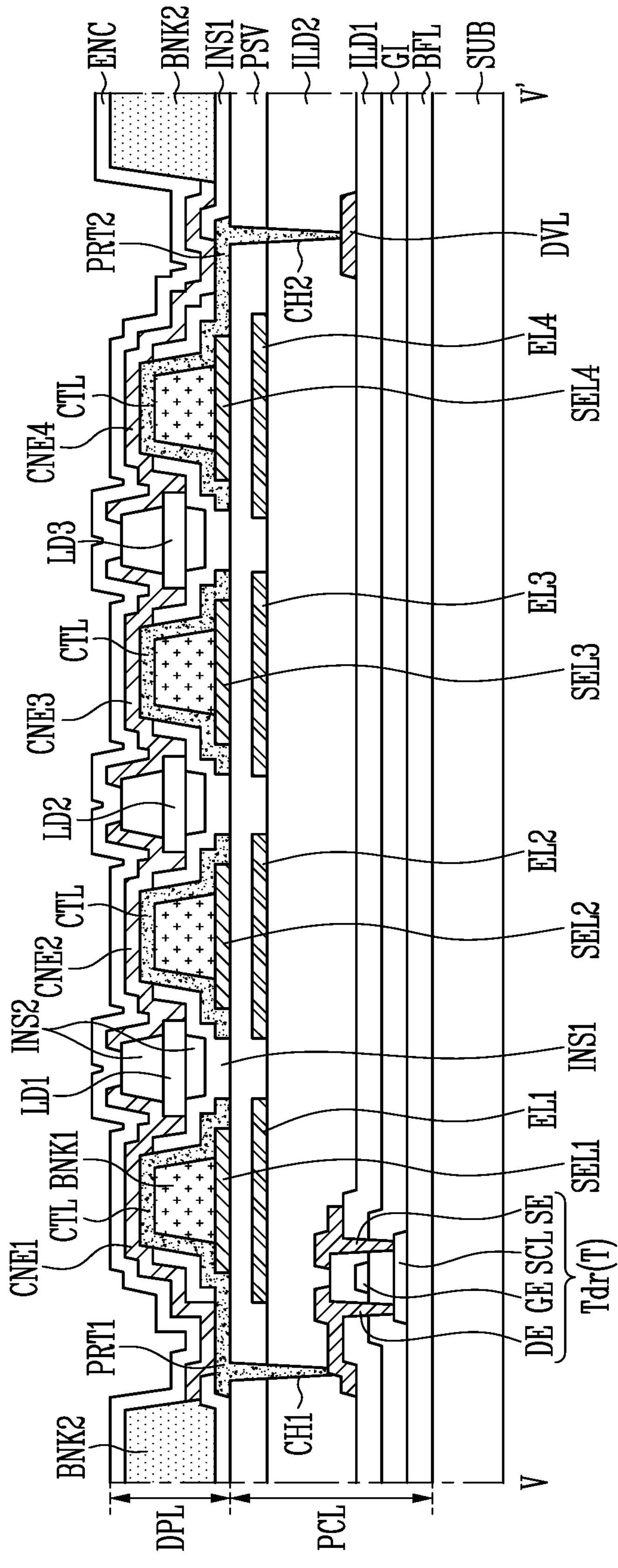
FIG. 24 is a schematic cross-sectional view corresponding to line V-V' of FIG. 23.
Figure 25:
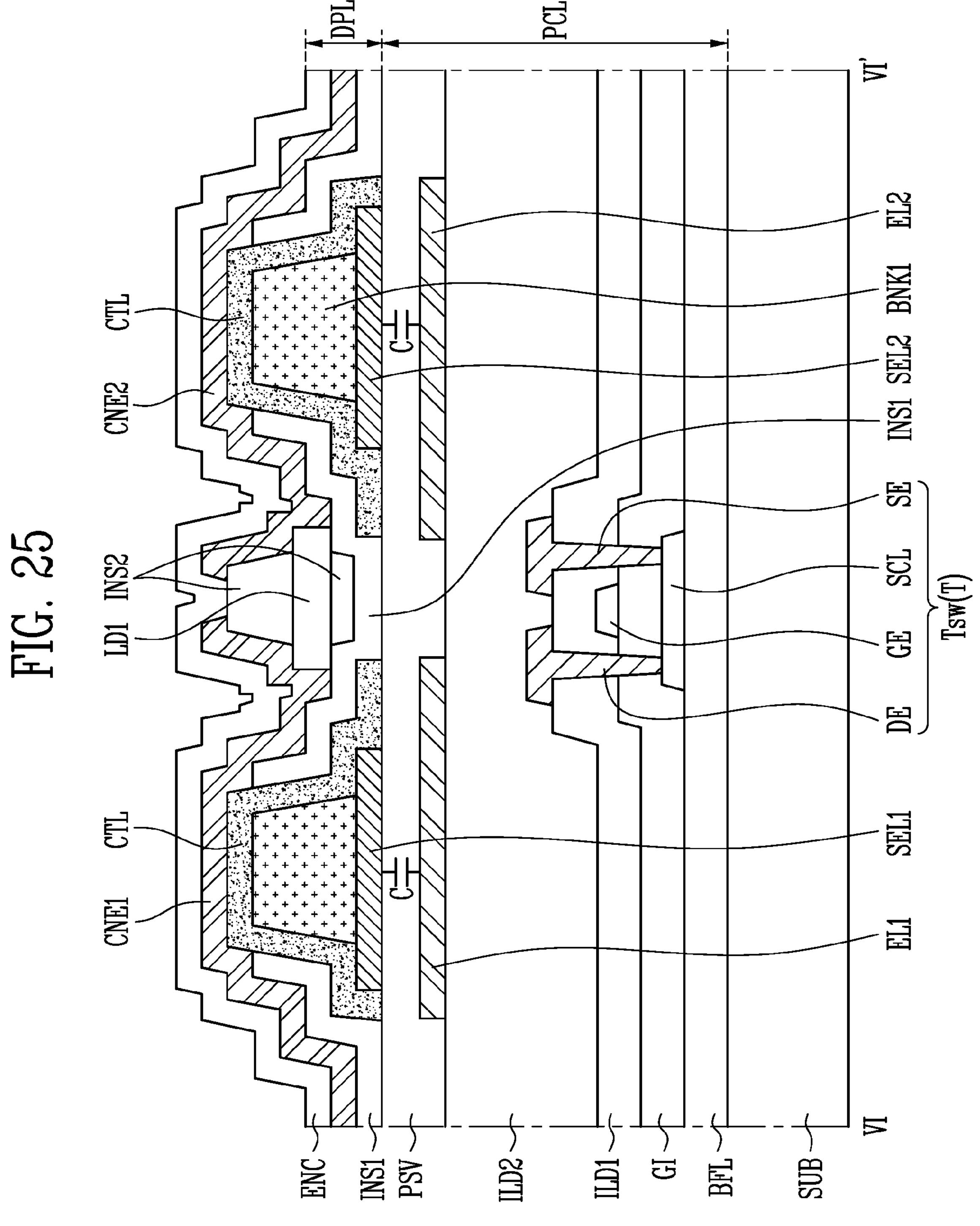
FIG. 25 is a schematic cross-sectional view corresponding to line VI-VI' of FIG. 23.

FIG. 23 schematically illustrates a display device according to an embodiment, and is a schematic plan view corresponding to portion EA2 of FIG. 16, FIG. 24 is a schematic cross-sectional view corresponding to line V-V' of FIG. 23, and FIG. 25 is a schematic cross-sectional view corresponding to line VI-VI' of FIG. 23.

As illustrated in FIGS. 23 to 25, in order to avoid repetitive descriptions, differences from that of the above-described embodiment are mainly described. A part which is not specifically described in the disclosure the above-described embodiment, and the same reference numeral indicates the same component and a similar reference numeral indicates a similar component.

Referring to FIGS. 1A to 5, 16, and 23 to 25, each pixel PXL may include the pixel circuit part PCL disposed on the substrate SUB and the display element part DPL disposed on the pixel circuit part PCL.

Since the pixel circuit part PCL corresponds to the same configuration as the pixel circuit part PCL described with reference to FIGS. 17 to 22H, detailed description thereof is omitted.

The display element part DPL may include first to fourth sub-electrodes SEL1 to SEL4, the first bank pattern BNK1, the intermediate layer CTL, the light emitting elements LD, the first and second insulating layers INS1 and INS2, the contact electrode CNE, and the encapsulation layer ENC.

Each of the first to fourth sub-electrodes SEL1 to SEL4 may be provided and/or formed between the protective layer PSV and the first bank pattern BNK1.

The first sub-electrode SEL1 may be provided and/or formed on the protective layer PSV to correspond to the first electrode EL1, the second sub-electrode SEL2 may be provided and/or formed on the protective layer PSV to correspond to the second electrode EL2, the third sub-electrode SEL3 may be provided and/or formed on the protective layer PSV to correspond to the third electrode EL3, and the fourth sub-electrode SEL4 may be provided and/or formed on the protective layer PSV to correspond to the fourth electrode EL4.

In a plan view, the first electrode EL1 and the first sub-electrode SEL1 may overlap each other, the second electrode EL2 and the second sub-electrode SEL2 may overlap each other, the third electrode EL3 and the third sub-electrode SEL3 may overlap each other, and the fourth electrode EL4 and the fourth sub-electrode SEL4 may overlap each other.

The first bank pattern BNK1 may be provided and/or formed on the first to fourth sub-electrodes SEL1 to SLE4.

The intermediate layer CTL may be provided and/or formed on the first bank pattern BNK1.

The intermediate layer CTL (hereinafter referred to as a "first intermediate layer") disposed on the first bank pattern BNK1 on the first sub-electrode SEL1 may cover the first sub-electrode SEL1 and the first bank pattern BNK1. The first intermediate layer CTL may contact both side portions of the first sub-electrode SEL1 that are not covered by the first bank pattern BNK1 and are exposed to the outside.

Accordingly, the first intermediate layer CTL may be electrically connected to the first sub-electrode SEL1.

The intermediate layer CTL (hereinafter referred to as a "second intermediate layer") disposed on the first bank pattern BNK1 on the second sub-electrode SEL2 may cover the second sub-electrode SEL2 and the first bank pattern BNK1. The second intermediate layer CTL may contact both side portions of the second sub-electrode SEL2 that are not covered by the first bank pattern BNK1 and are exposed to the outside. Accordingly, the second intermediate layer CTL may be electrically connected to the second sub-electrode SEL2.

The intermediate layer CTL (hereinafter referred to as a "third intermediate layer") disposed on the first bank pattern BNK1 on the third sub-electrode SEL3 may cover the third sub-electrode SEL3 and the first bank pattern BNK1. The third intermediate layer CTL may contact both side portions of the third sub-electrode SEL3 that are not covered by the first bank pattern BNK1 and are exposed to the outside. Accordingly, the third intermediate layer CTL may be electrically connected to the third sub-electrode SEL3.

An intermediate layer CTL (hereinafter referred to as a "fourth intermediate layer") disposed on the first bank pattern BNK1 on the fourth sub-electrode SEL4 may cover the fourth sub-electrode SEL4 and the first bank pattern BNK1. The fourth intermediate layer CTL may contact both side portions of the fourth sub-electrode SEL4 that are not covered by the first bank pattern BNK1 and are exposed to the outside. Accordingly, the fourth intermediate layer CTL may be electrically connected to the fourth sub-electrode SEL4.

In an embodiment, as each of the first to fourth sub-electrodes SEL1 to SEL4 is disposed on a corresponding electrode with the protective layer PSV interposed therebetween, a vertical cap coupling (for example, a parasitic capacitor c) may be formed between each of the first to fourth sub-electrodes SEL1 to SEL4 and the corresponding electrode. For example, as the first sub-electrode SEL1 is disposed on the first electrode EL1 with the protective layer PSV interposed therebetween, the vertical cap coupling may be formed between the first sub-electrode SEL1 and the first electrode EL1. As the second sub-electrode SEL2 is disposed on the second electrode EL2 with the protective layer PSV interposed therebetween, the vertical cap coupling may be formed between the second sub-electrode SEL2 and the second electrode EL2. As the third sub-electrode SEL3 is disposed on the third electrode EL3 with the protective layer PSV interposed therebetween, the vertical cap coupling may be formed between the third sub-electrode SEL3 and the third electrode EL3. As the fourth sub-electrode SEL4 is disposed on the fourth electrode EL4 with the protective layer PSV interposed therebetween, the vertical cap coupling may be formed between the fourth sub-electrode SEL4 and the fourth electrode EL4.

As described above, a capacitance may increase due to the vertical cap coupling formed between a sub-electrode and an electrode corresponding thereto. In addition, as a sub-electrode and an electrode corresponding thereto are spaced apart with only the protective layer PSV therebetween, a capacitance generated between the sub-electrode and the electrode may further increase. In this case, in case that the alignment signal (or the alignment voltage) corresponding to each of the first to fourth electrodes EL1 to EL4 is applied, a stronger electric field may be formed between adjacent two electrodes among the first to fourth electrodes EL1 to EL4. Accordingly, the light emitting elements LD may be intensively aligned between the first to fourth electrodes EL1 to EL4, and thus the alignment degree of the light emitting elements LD in each pixel PXL may be improved.

Although the above has been described with reference to the embodiment of the disclosure, those skilled in the art or those having ordinary knowledge of the corresponding technical field will understand that the disclosure may be variously changed and modified without departing from the technical scope of the disclosure.

Therefore, the technical scope of the claimed invention should not be limited to the contents described in the detailed description of the specification, but should be defined by the claims.

What is claimed is:

1. A display device comprising:

a substrate including a display area including a plurality of pixel areas and a non-display area surrounding the display area; and a pixel disposed in each of the pixel areas, wherein the pixel comprises:

at least one transistor and a driving voltage line disposed on the substrate;

a first electrode and a second electrode extending in a direction on the transistor and the driving voltage line and spaced apart from each other;

a bank pattern disposed on the first and second electrodes, respectively, the bank pattern having a plurality of elongated bar portions with a length extending along the direction;

intermediate layers disposed on the bank pattern;

light emitting elements disposed between two adjacent intermediate layers of the intermediate layers in another direction intersecting the direction;

a first contact electrode disposed on one of the two adjacent intermediate layers and electrically connected to an end of each of the light emitting elements; and a second contact electrode disposed on another one of the two adjacent intermediate layers and electrically connected to another end of each of the light emitting elements.

2. The display device according to claim 1, wherein each of the intermediate layers includes an insulating material.

3. The display device according to claim 2, wherein each of the intermediate layers is a multi-layer including at least three or more double layers formed by stacking a first inorganic insulating layer and a second inorganic insulating layer, and the at least three or more double layers are sequentially stacked.

4. The display device according to claim 3, wherein a refractive index of the first inorganic insulating layer and a refractive index of the second inorganic insulating layer are different from each other.

5. The display device according to claim 1, wherein one of the first and second contact electrodes is electrically connected to the transistor, and another one of the first and second contact electrodes is electrically connected to the driving voltage line.

6. The display device according to claim 5, wherein the first electrode and the second electrode are disposed on a same layer.

7. The display device according to claim 5, wherein the first electrode and the second electrode are disposed on different layers.

8. The display device according to claim 1, wherein each of the first and second electrodes extends in the direction and is commonly provided to adjacent pixels positioned in a same pixel column as the pixel.

9. The display device according to claim 1, wherein each of the intermediate layers includes a conductive material.

10. The display device according to claim 9, wherein the one of the intermediate layers is disposed in the pixel, and the another one of the intermediate layers is commonly provided to the pixel and adjacent pixels in a same column as the pixel.

11. The display device according to claim 9, wherein the pixel further includes an insulating layer disposed between the first and second electrodes and the bank pattern.

12. The display device according to claim 11, wherein the one of the intermediate layers and one of the first and second electrodes form a capacitor with the insulating layer and a bank pattern corresponding to the one of the first and second electrodes disposed between the one of the intermediate layers and the one of the first and second electrodes, and the another one of the intermediate layers and another one of the first and second electrodes form a capacitor with the insulating layer and a bank pattern corresponding to the remaining electrode disposed between the another one of the intermediate layers and the another one of the first and second electrodes.

13. The display device according to claim 11, wherein the pixel further includes a first sub-electrode and a second sub-electrode disposed on the insulating layer, extending in the direction, and spaced apart from each other, wherein the first sub-electrode overlaps the first electrode in a plan view, and wherein the second sub-electrode overlaps the second electrode in a plan view.

14. The display device according to claim 13, wherein the first electrode and the first sub-electrode form a capacitor with the insulating layer disposed between the first electrode and the first sub-electrode, and the second electrode and the second sub-electrode form a capacitor with the insulating layer disposed between the second electrode and the second sub-electrode.

15. The display device according to claim 14, wherein the one of the intermediate layers covers the first sub-electrode and is electrically connected to the first sub-electrode, and the another one of the intermediate layers covers the second sub-electrode and is electrically connected to the second sub-electrode.

16. The display device according to claim 1, wherein the intermediate layers overlap the first and second electrodes in a plan view.

17. A method of manufacturing a display device, the method comprising:

providing a pixel disposed in each pixel area;

the providing of the pixel comprises:

forming at least one transistor and a driving voltage line on a substrate;

forming an interlayer insulating layer on the at least one transistor and the driving voltage line;

forming a first electrode and a second electrode extending in a direction and spaced apart from each other on the interlayer insulating layer;

forming a bank pattern on the first and second electrodes, the bank pattern having a plurality of elongated bar portions with a length extending along the direction;

forming intermediate layers on the bank pattern;

inputting light emitting elements, and aligning the light emitting elements between two adjacent intermediate layers of the intermediate layers adjacent in another direction intersecting the direction, by applying an alignment signal corresponding to each of the first electrode and the second electrode;

forming an insulating layer on an upper surface of each of the light emitting elements; and forming a first contact electrode and a second contact electrode on the insulating layer.

18. The method according to claim 17, wherein each of the intermediate layers includes a conductive material.

19. The method according to claim 17, wherein each of the intermediate layers includes an insulating material.

20. The method according to claim 19, wherein each of the intermediate layers includes a multi-layer including at least three or more double layers formed by stacking a first inorganic insulating layer and a second inorganic insulating layer, the at least three or more double layers are sequentially stacked, and a refractive index of the first inorganic insulating layer and a refractive index of the second inorganic insulating layer are different from each other.

* * * * *